(12) United States Patent
Watanabe et al.

(10) Patent No.: US 9,780,121 B2
(45) Date of Patent: Oct. 3, 2017

(54) TOUCH SENSOR, TOUCH PANEL, AND MANUFACTURING METHOD OF TOUCH PANEL

(71) Applicant: Semiconductor Energy Laboratory Co., Ltd., Kanagawa-ken (JP)

(72) Inventors: Kazunori Watanabe, Kanagawa (JP); Hiroyuki Miyake, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/639,336

(22) Filed: Mar. 5, 2015

(65) Prior Publication Data

US 2015/0255518 A1     Sep. 10, 2015

(30) Foreign Application Priority Data

Mar. 7, 2014  (JP) .................................. 2014-045110
Mar. 13, 2014  (JP) .................................. 2014-050732

(51) Int. Cl.
*H01L 27/12*      (2006.01)

(52) U.S. Cl.
CPC ........ *H01L 27/124* (2013.01); *H01L 27/1225* (2013.01); *H01L 27/1255* (2013.01)

(58) Field of Classification Search
CPC .............. H01L 27/323; H01L 27/1255; H01L 27/3258; H01L 27/3272; H01L 27/3262;
(Continued)

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

CN      101794038 A      8/2010
CN      103178057 A      6/2013
(Continued)

OTHER PUBLICATIONS

International Search Report re Application No. PCT/IB2015/051344, dated Jun. 16, 2015.
(Continued)

*Primary Examiner* — John P Dulka
(74) *Attorney, Agent, or Firm* — Husch Blackwell LLP

(57) ABSTRACT

To provide a touch sensor including a transistor and a capacitor in which the transistor and the capacitor are electrically connected to each other, the capacitor includes a pair of electrodes and a dielectric layer, the dielectric layer is located between the pair of electrodes, and one of the pair of electrodes includes an oxide conductor layer. To provide a touch panel including the touch sensor, a light-blocking layer, and a display element in which the touch sensor is located more on the display surface side of the touch panel than on the display element side, the light-blocking layer is located more on the display surface side than on the touch sensor side, the display element includes a portion overlapping with the capacitor, and the light-blocking layer includes a portion overlapping with the transistor.

34 Claims, 47 Drawing Sheets

(58) Field of Classification Search
CPC ............ H01L 27/1218; H01L 27/1225; H01L 27/124; H01L 27/3265
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,243,027 B2 | 8/2012 | Hotelling et al. |
| 8,259,078 B2 | 9/2012 | Hotelling et al. |
| 8,367,440 B2 | 2/2013 | Takayama et al. |
| 8,384,076 B2 | 2/2013 | Park et al. |
| 8,415,208 B2 | 4/2013 | Takayama et al. |
| 8,432,371 B2 | 4/2013 | Hotelling et al. |
| 8,451,244 B2 | 5/2013 | Hotelling et al. |
| 8,476,625 B2 | 7/2013 | Kimura |
| 8,552,989 B2 | 10/2013 | Hotelling et al. |
| 8,654,083 B2 | 2/2014 | Hotelling et al. |
| 8,999,750 B2 | 4/2015 | Kimura |
| 9,201,280 B2 | 12/2015 | Kimura |
| 9,202,827 B2 | 12/2015 | Koyama et al. |
| 9,207,504 B2 | 12/2015 | Kimura |
| 9,213,206 B2 | 12/2015 | Kimura |
| 9,246,047 B2 | 1/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0167526 A1 | 7/2008 | Crank et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163865 A1* | 7/2010 | Arai ............... H01L 27/124 257/43 |
| 2010/0163874 A1 | 7/2010 | Koyama et al. |
| 2010/0188354 A1* | 7/2010 | Tamura ............... G02F 1/13338 345/173 |
| 2013/0153893 A1* | 6/2013 | Morosawa ......... H01L 27/1225 257/43 |
| 2013/0214324 A1 | 8/2013 | Takayama et al. |
| 2013/0257798 A1 | 10/2013 | Tamura et al. |
| 2013/0277672 A1 | 10/2013 | Sano et al. |
| 2014/0034954 A1 | 2/2014 | Yamazaki et al. |
| 2014/0042432 A1 | 2/2014 | Yamazaki |
| 2014/0063368 A1 | 3/2014 | Yamazaki et al. |
| 2014/0070209 A1 | 3/2014 | Yamazaki et al. |
| 2014/0139457 A1 | 5/2014 | Hotelling et al. |
| 2014/0152619 A1 | 6/2014 | Hotelling et al. |
| 2014/0357019 A1 | 12/2014 | Koyama et al. |
| 2015/0144920 A1 | 5/2015 | Yamazaki et al. |
| 2015/0162452 A1 | 6/2015 | Koezuka et al. |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |

(56) References Cited

FOREIGN PATENT DOCUMENTS

| | | |
|---|---|---|
| JP | 11-194360 A | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2003-195356 A | 7/2003 |
| JP | 2003-196023 A | 7/2003 |
| JP | 2004-103957 A | 4/2004 |
| JP | 2004-273614 A | 9/2004 |
| JP | 2004-273732 A | 9/2004 |
| JP | 2006-003920 A | 1/2006 |
| JP | 2006-165529 A | 6/2006 |
| JP | 2009-003916 A | 1/2009 |
| JP | 2009-278115 A | 11/2009 |
| JP | 2009-282545 A | 12/2009 |
| JP | 2009282545 A * | 12/2009 |
| JP | 2010-198608 A | 9/2010 |
| JP | 2013-130615 A | 7/2013 |
| JP | 2013-229010 A | 11/2013 |
| JP | 2014-010762 A | 1/2014 |
| JP | 5541935 B2 | 7/2014 |
| JP | 2014-160505 A | 9/2014 |
| JP | 2014010762 A * | 1/2015 |
| KR | 2014-0141696 A | 12/2014 |
| TW | 201033960 | 9/2010 |
| TW | 201332119 | 8/2013 |
| TW | 201351251 | 12/2013 |
| WO | WO 2004/114391 A1 | 12/2004 |
| WO | WO 2013/146333 A1 | 10/2013 |
| WO | WO 2013146333 A1 * | 10/2013 ........... G06F 3/0418 |

OTHER PUBLICATIONS

Written Opinion re Application No. PCT/IB2015/051344, dated Jun. 16, 2015.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.
Chern, H. et al., "An Analytical Model for the Above-Threshold Characteristics of Polysilicon Thin-Film Transistors," IEEE Transactions on Electron Devices, July 1, 1995, vol. 42, No. 7, pp. 1240-1246.
Cho, D. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Clark, S. et al., "First Principles Methods Using CASTEP," Zeitschrift fur Kristallographie, 2005, vol. 220, pp. 567-570.
Coates, D. et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Costello, M. et al., "Electron Microscopy of a Cholesteric Liquid Crystal and its Blue Phase," Physical Review. A, May 1, 1984, vol. 29, No. 5, pp. 2957-2959.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E. et al., "Wide-Bandgap High-Mobility ZnO Thin-Film Transistors Produced at Room Temperature," Applied Physics Letters, Sep. 27, 2004, vol. 85, No. 13, pp. 2541-2543.
Fung, T. et al., "2-D Numerical Simulation of High Performance Amorphous In—Ga—Zn—O TFTs for Flat Panel Displays," AM-FPD '08 Digest of Technical Papers, July 2, 2008, pp. 251-252, The Japan Society of Applied Physics.
Godo, H. et al., "P-9: Numerical Analysis on Temperature Dependence of Charateristics of Amorphous In—Ga—Zn—Oxide TFT," SID Digest '09: SID International Symposium Digest of Technical Papers, May 31, 2009, pp. 1110-1112.
Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R. et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.
Hsieh, H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Janotti, A. et al., "Native Point Defects in ZnO," Physical Review. B, Oct. 4, 2007, vol. 76, No. 16, pp. 165202-1-165202-22.
Janotti, A. et al., "Oxygen Vacancies in ZnO," Applied Physics Letters, 2005, vol. 87, pp. 122102-1-122102-3.
Jeong, J. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Jin, D. et al., "65.2: Distinguished Paper: World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H. et al., "Polymer-Stabilized Liquid Crystal Blue Phases,"Nature Materials, Sep. 2, 2002, vol. 1, pp. 64-68.
Kim, S. et al., "High-Performance Oxide Thin Film Transistors Passivated by Various Gas Plasmas," 214th ECS Meeting, 2008, No. 2317, ECS.
Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.," Journal of Solid State Chemistry, 1985, vol. 60, pp. 382-384.
Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H. et al., "Observation of Blue Phases in Chiral Networks," Liquid Crystals, 1993, vol. 14, No. 3, pp. 911-916.

(56) References Cited

OTHER PUBLICATIONS

Kurokawa, Y. et al., "UHF RFCPUs on Flexible and Glass Substrates for Secure RFID Systems,"Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 0455011-1-045501-4.

Lee, H. et al., "Current Status of, Challenges to, and Perspective View of AM-OLED," IDW '06: Proceedings of the 13th International Display Workshops, Dec. 7, 2006, pp. 663-666.

Lee, J. et al., "World's Largest (15-Inch) XGA AMLCD Panel Using IGZO Oxide TFT," SID International Symposium Digest of Technical Papers, May 20, 2008, vol. 39, pp. 625-628.

Lee, M. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors,"Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3:4.0 In. QVGA AMOLED Display Using In—Ga—Zn—Oxide TFTS With A Novel Passivation Layer," SID Digest '09: SID International Symposium Digest of Technical Papers, May 31, 2009, pp. 284-287.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Park, J. et al., "Amorphous Indium—Gallium—Zinc Oxide TFTs and Their Application for Large Size AMOLED," AM-FPD '08 Digest of Technical Papers, Jul. 2, 2008, pp. 275-278.

Park, J. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J. et al., "Electronic Transport Properties of Amorphous Indium—Gallium—Zinc Oxide Semiconductor Upon Exposure to Water," Applied Physics Letters. 2008, vol. 92, pp. 072104-1-072104-3.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-362106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga —Zn —Oxide TFTs," IDW '09: Proceedings of the 16th International Display Workshops, 2009, pp. 689-692.

Son, K. et al., "42.4L: Late-News Paper: 4 Inch QVGA AMOLED Driven by the Threshold Voltage Controlled Amorphous GIZO (Ga2O3—In2O3—ZnO) TFT," SID International Symposium Digest of Technical Papers, May 20, 2008, vol. 39, pp. 633-636.

Takahashi, M. et al., "Theoretical Analysis of IGZO Transparent Amorphous Oxide Semicondoctor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C., "Hydrogen as a Cause of Doping in Zinc Oxide," Physical Review Letters, Jul. 31, 2000, vol. 85, No. 5, pp. 1012-1015.

\* cited by examiner

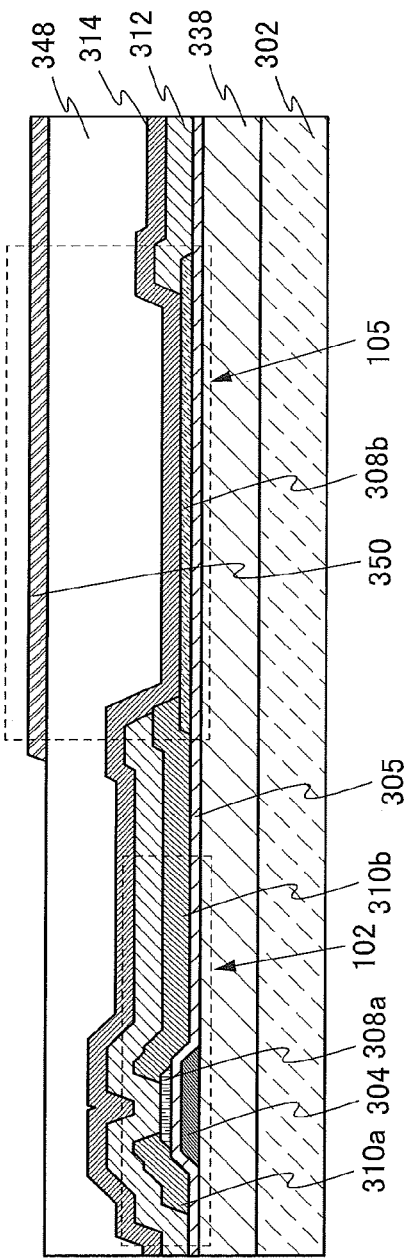
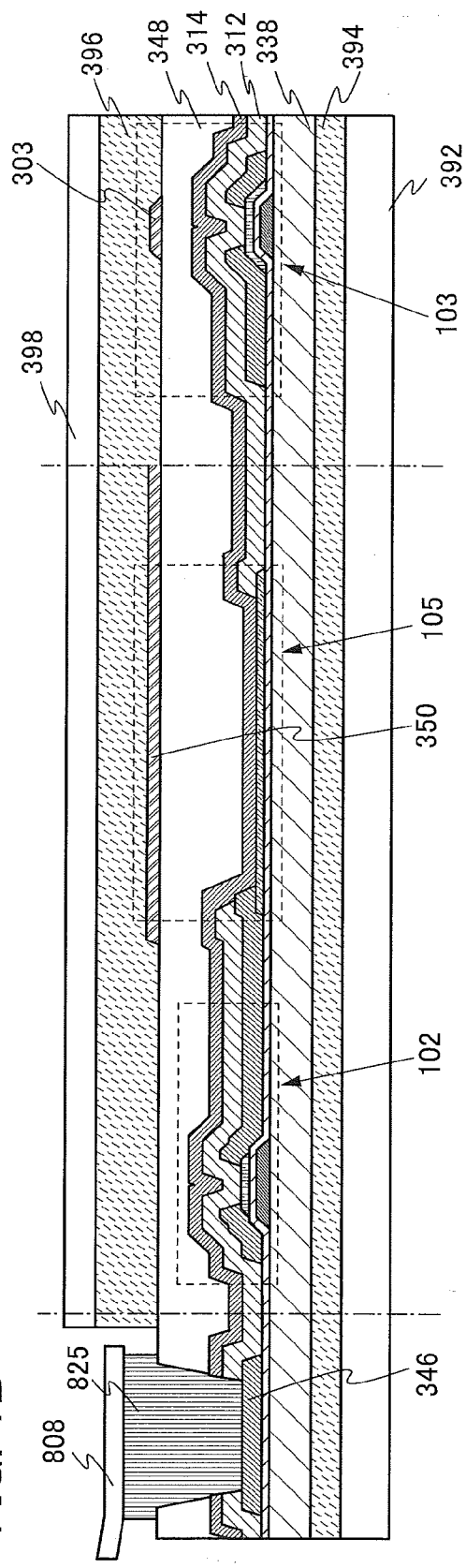
FIG. 1A
FIG. 1B

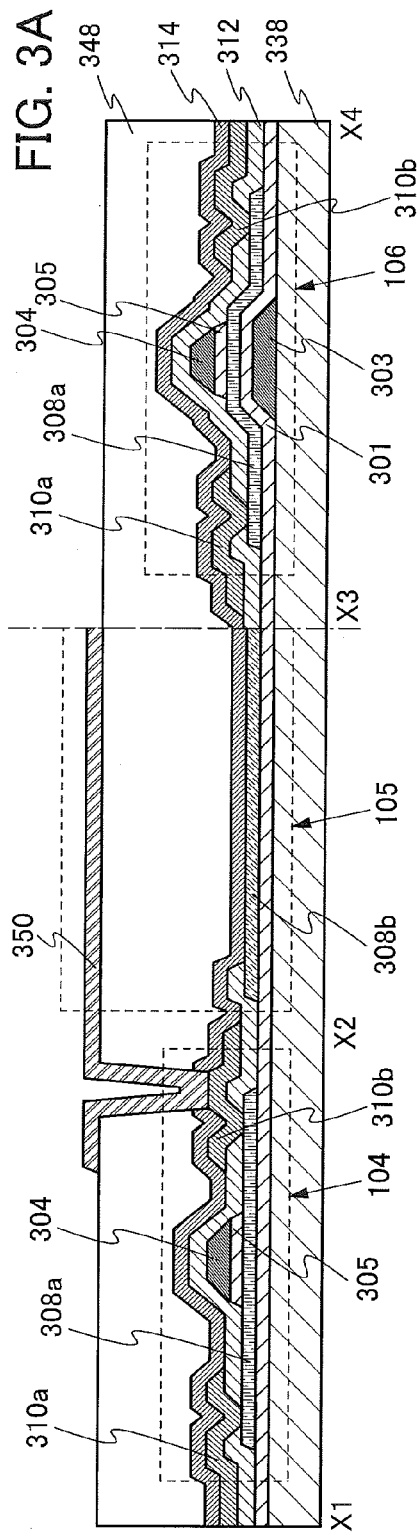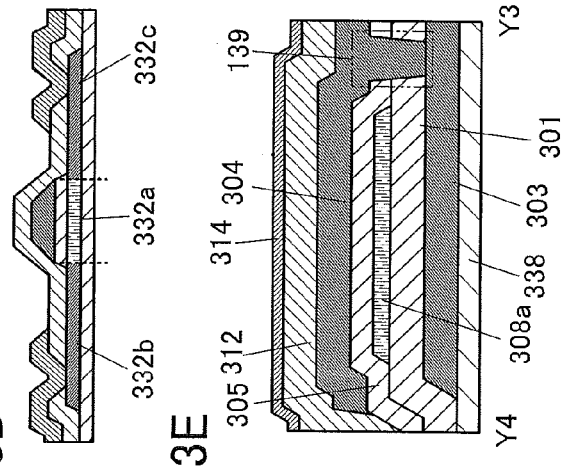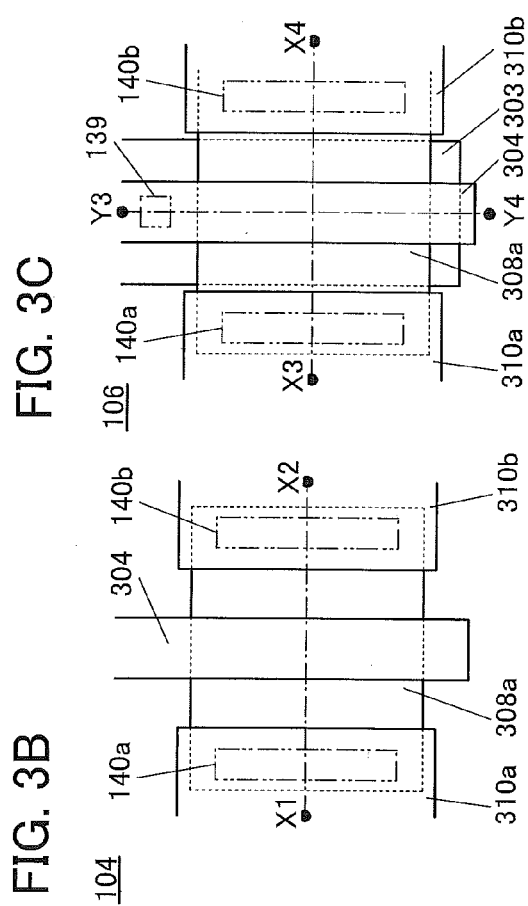

304  308  305  338  302

308a  308c 310a  308a  310b  312  362  308c 314  308b

FIG. 9A
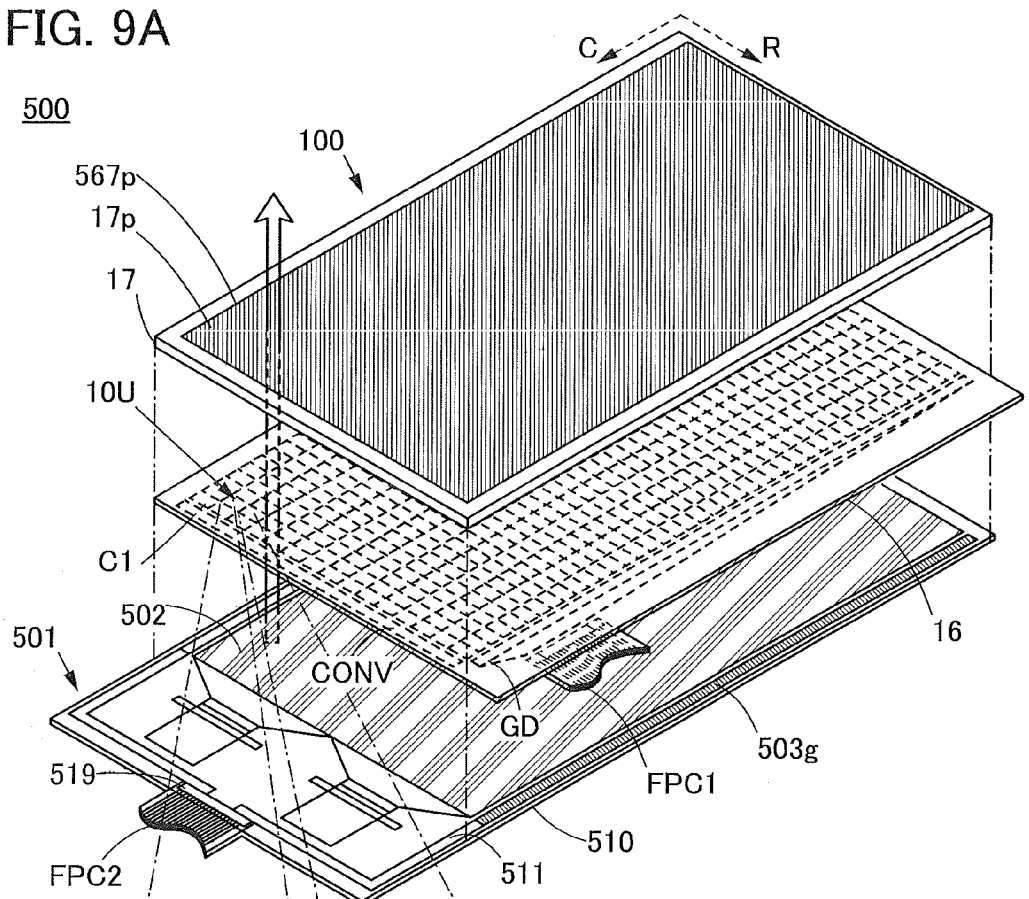
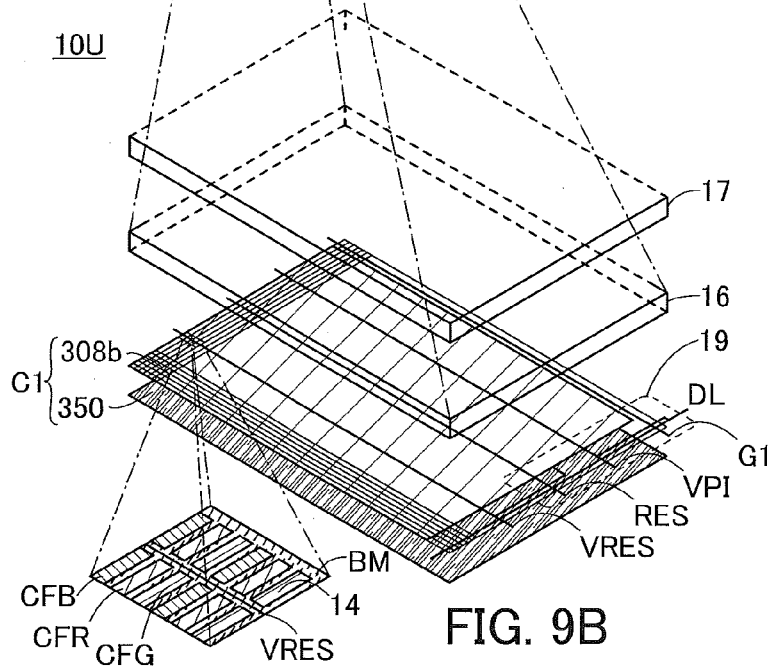
FIG. 9B
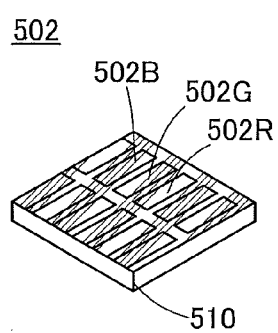
FIG. 9C

FIG. 10A
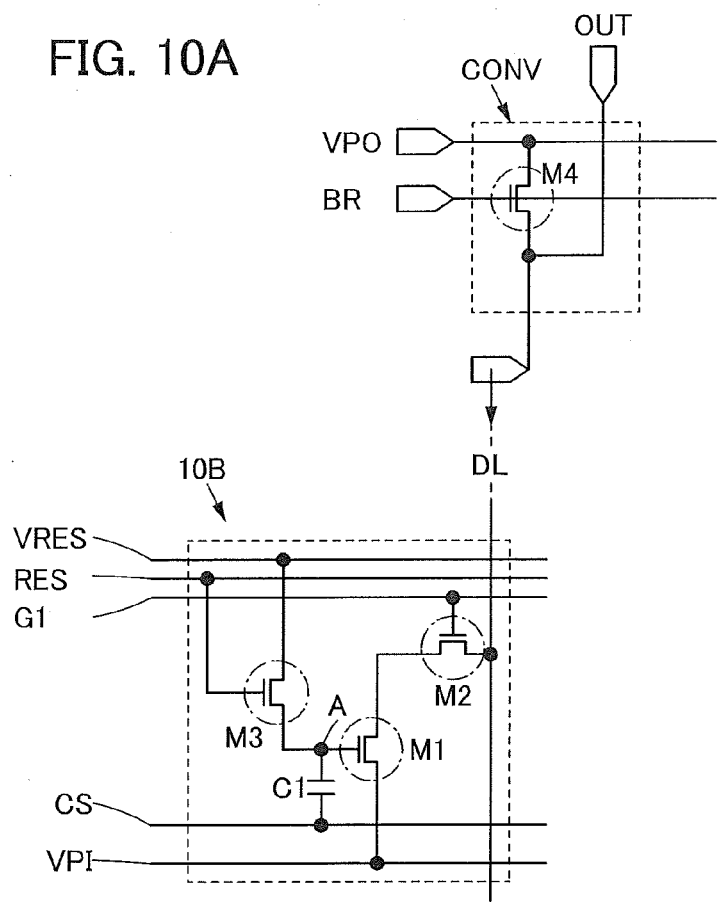
FIG. 10B1
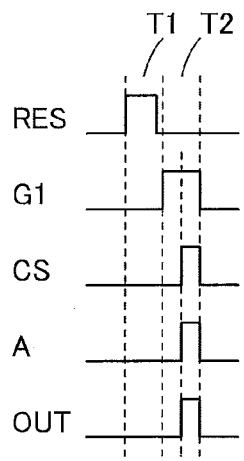
FIG. 10B2
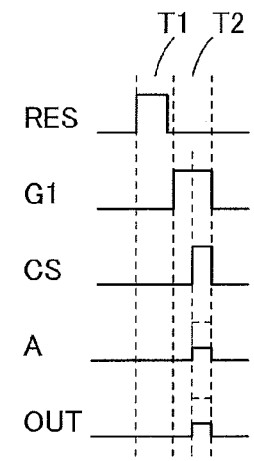
FIG. 10C
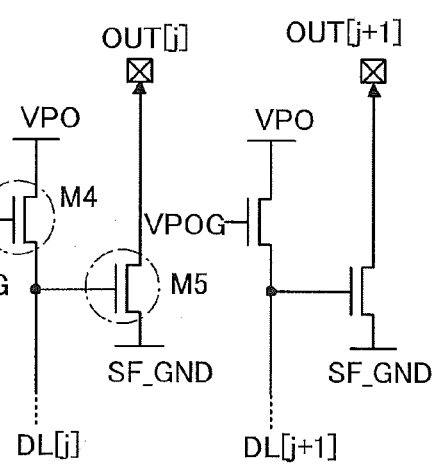

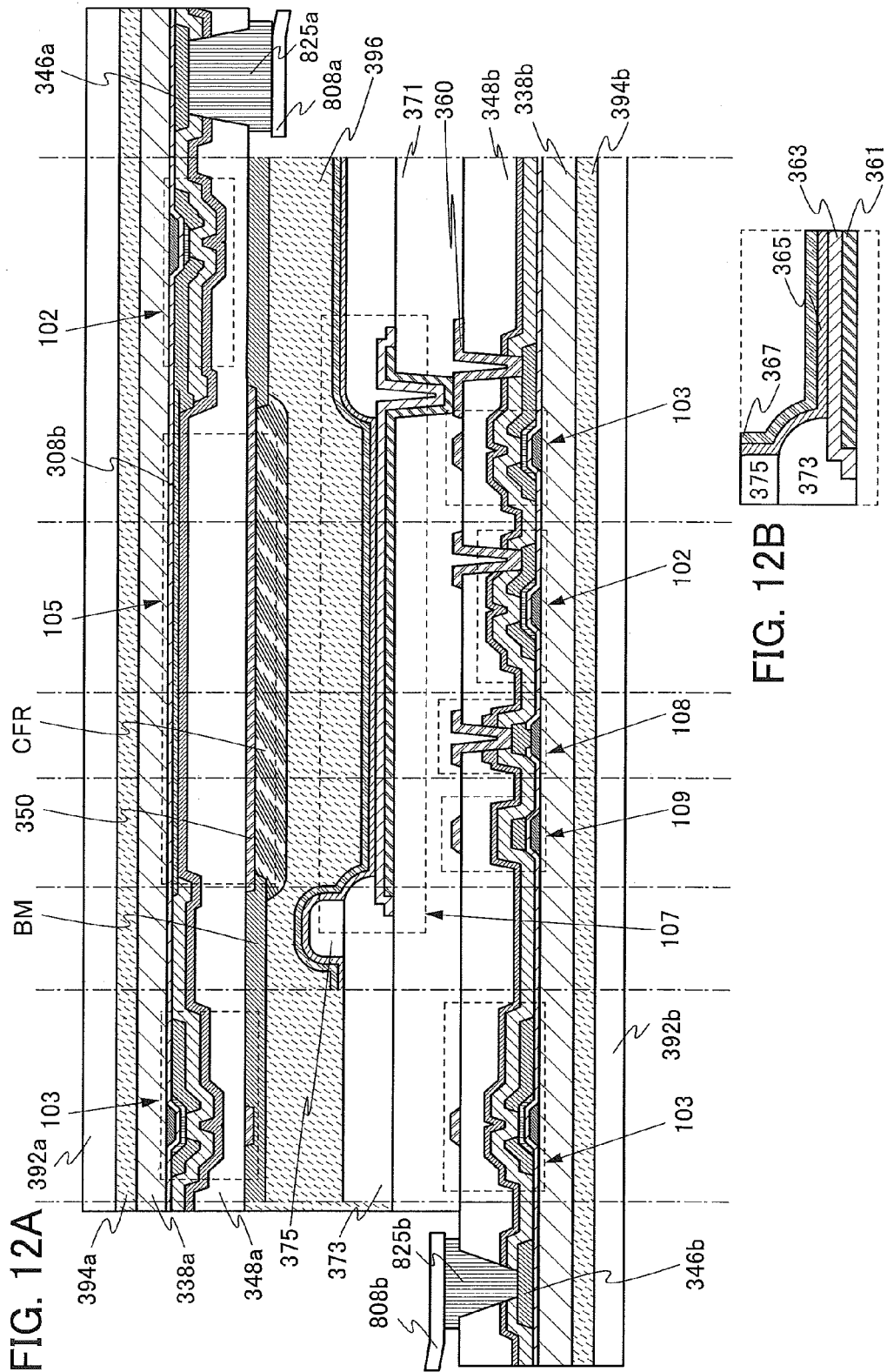

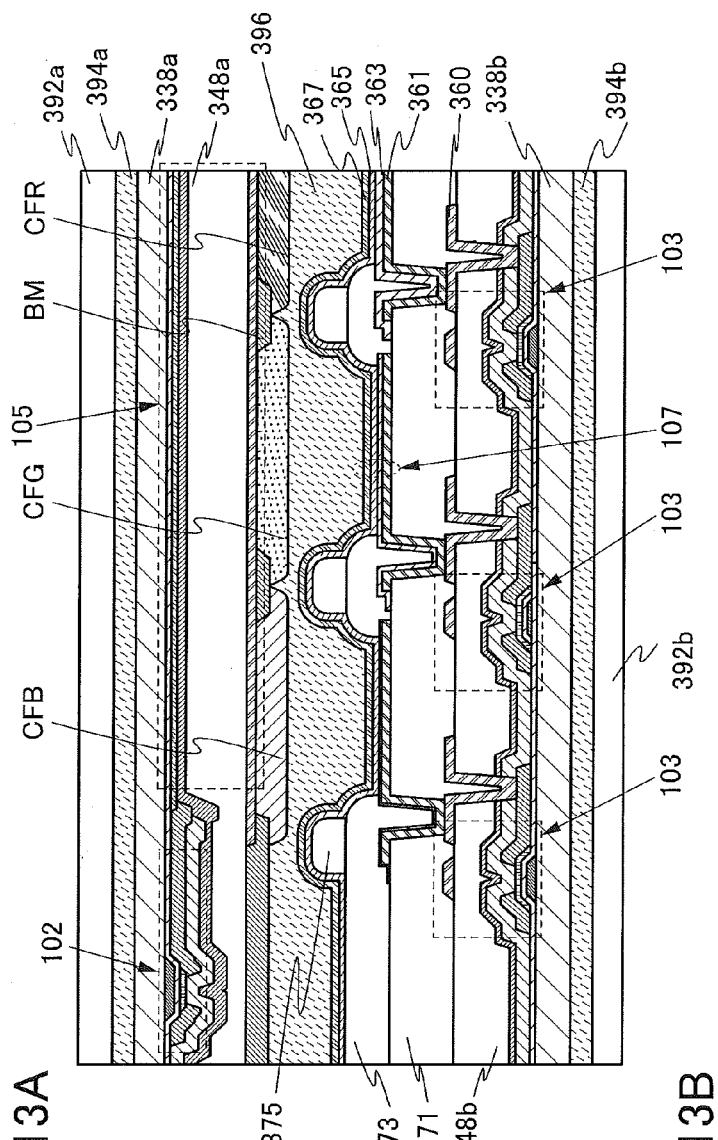
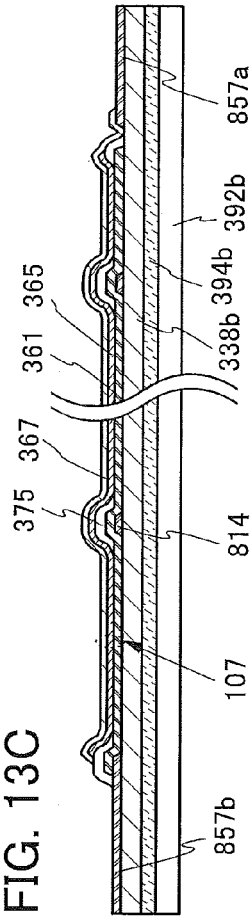
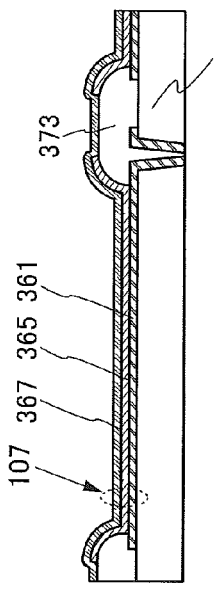

FIG. 28A
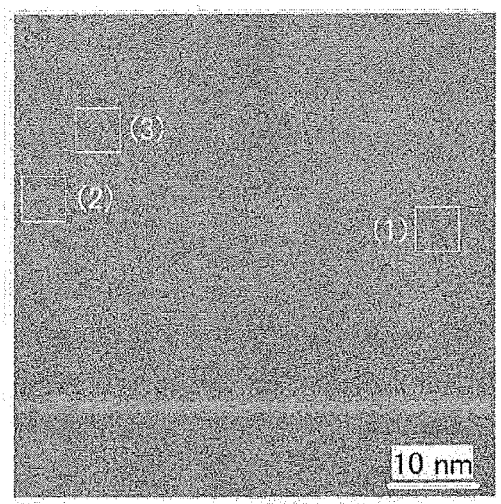
FIG. 28B  FIG. 28C  FIG. 28D
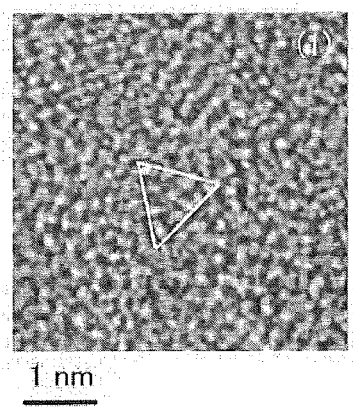 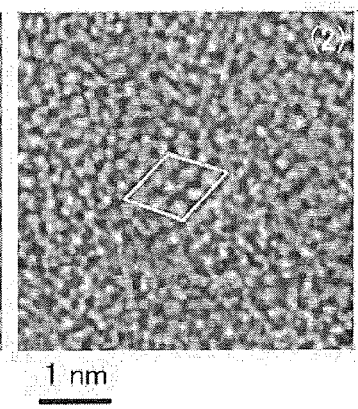 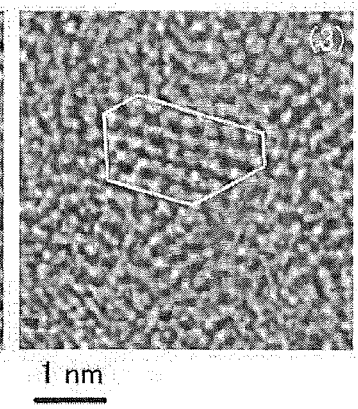

FIG. 29A  out-of-plane method
CAAC-OS
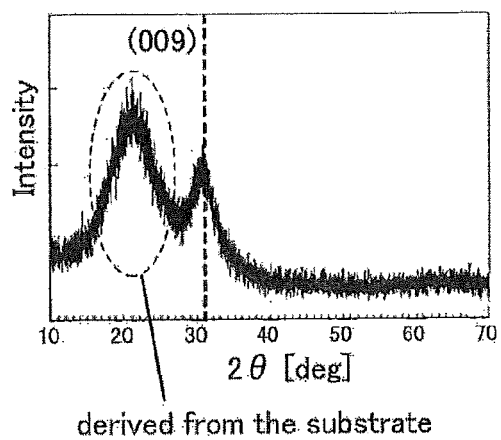
derived from the substrate
FIG. 29B  in-plane method
CAAC-OS
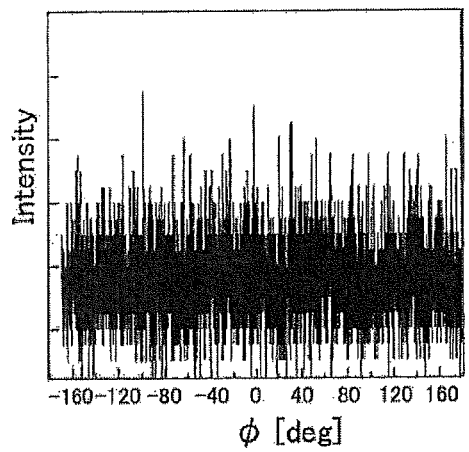
FIG. 29C  in-plane method
single crystal OS
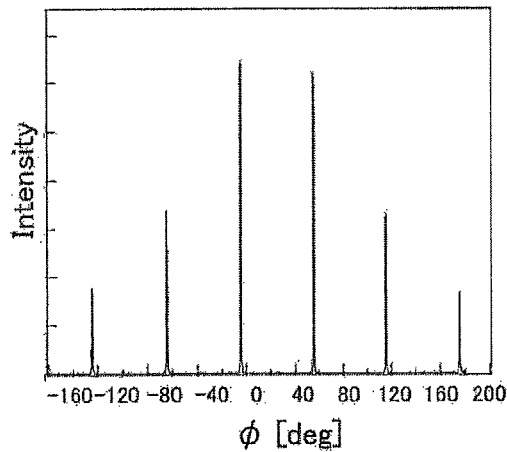

FIG. 30A
FIG. 30B
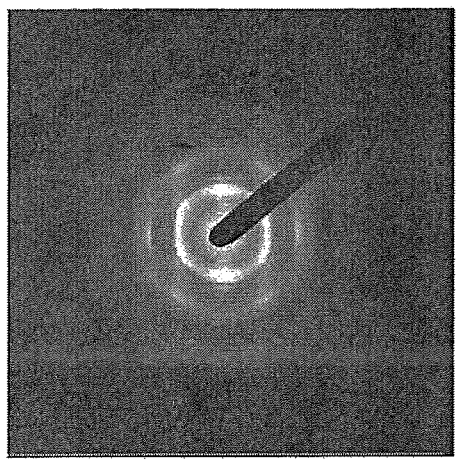
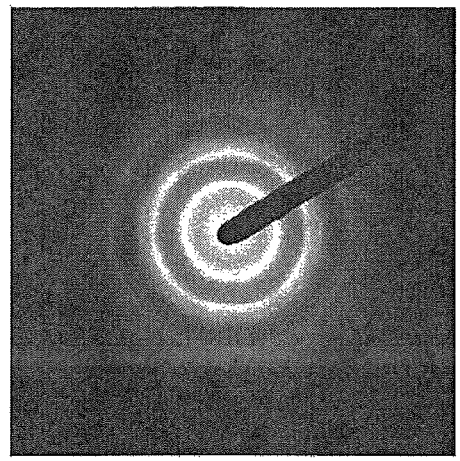

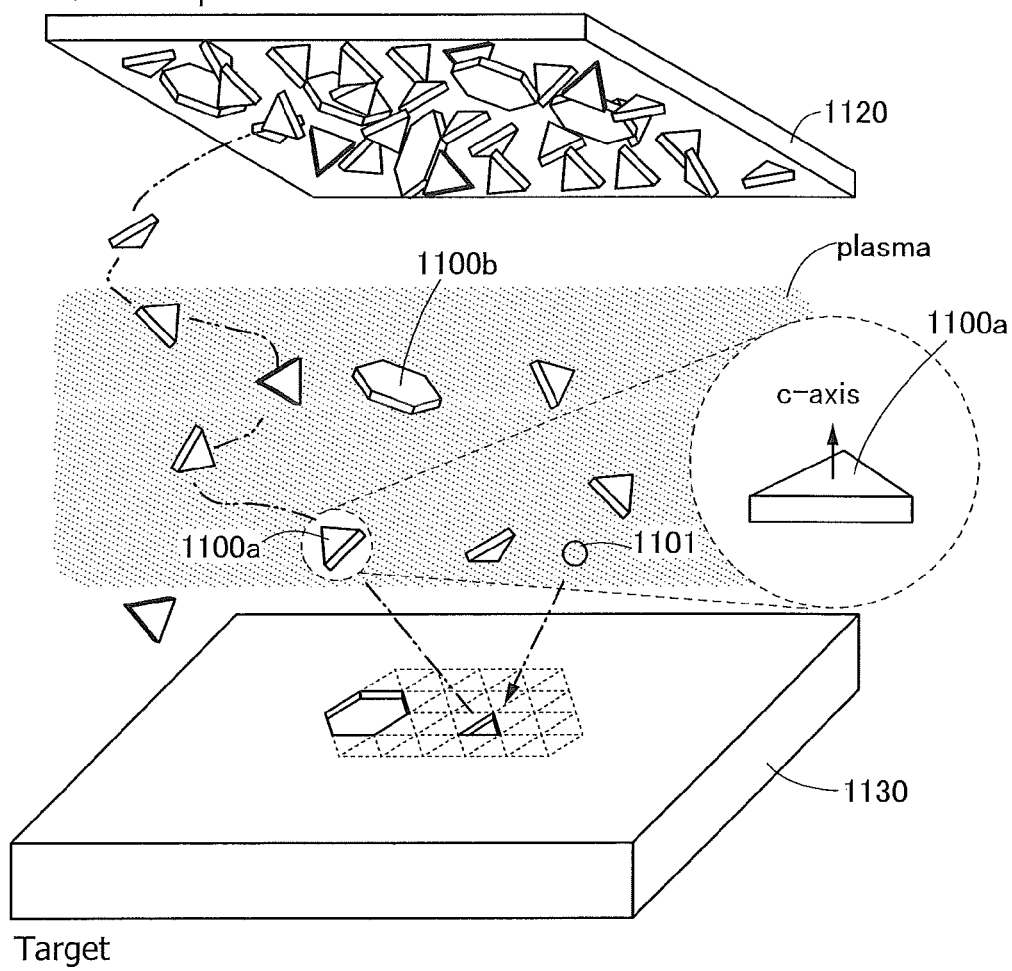

InGaZnO₄

Ar or O
(300eV)

Ga-Zn-O layer
In-O layer
Ga-Zn-O layer
Ga-Zn-O layer
In-O layer
Ga-Zn-O layer
Ga-Zn-O layer
In-O layer
Ga-Zn-O layer Temperature
control layer
(300K)

Fixed
layer

InGaZnO₄

In : ○   Ga : ○   Zn : ○   O : ●

Entrance position

100psec after Ar collision

100psec after O collision

In : ◯   Ga : ◯   Zn : ◯   O : ●

0-0.3psec after Ar entrance 0-0.3psec after O entrance

CAAC-OS film    1 nm

Target    1 nm

TOUCH SENSOR, TOUCH PANEL, AND MANUFACTURING METHOD OF TOUCH PANEL

TECHNICAL FIELD

One embodiment of the present invention relates to a touch sensor, particularly to a touch sensor having flexibility. One embodiment of the present invention relates to a touch panel, particularly to a touch panel having flexibility.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, an electronic device, a lighting device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique in which a transistor is manufactured using an amorphous oxide containing In, Zn, Ga, Sn, and the like as an oxide semiconductor is disclosed in Patent Document 1. Furthermore, a technique in which a transistor using an oxide thin film and a self-aligned top-gate structure is manufactured is disclosed in Patent Document 2.

Furthermore, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

Patent Document 3 discloses a flexible active matrix light-emitting device in which an organic electroluminescence (EL) element and a transistor serving as a switching element are provided over a film substrate.

Display devices are expected to be applied to a variety of uses and become diversified. For example, a smartphone and a tablet terminal with a touch panel are being developed as portable information appliances.

REFERENCES

Patent Documents

[Patent Document 1] Japanese Published Patent Application No. 2006-165529
[Patent Document 2] Japanese Published Patent Application No. 2009-278115
[Patent Document 3] Japanese Published Patent Application No. 2003-174153

DISCLOSURE OF INVENTION

What is desirable is a flexible touch panel in which a display panel having flexibility is provided with a function of inputting data with a finger or the like touching a screen as a user interface.

One object of one embodiment of the present invention is to provide a touch sensor having flexibility or a touch panel having flexibility. Another object of one embodiment of the present invention is to provide a lightweight touch panel. Another object of one embodiment of the present invention is to provide a touch panel having a small thickness. Another object of one embodiment of the present invention is to provide a touch panel with high detection sensitivity. Another object of one embodiment of the present invention is to achieve both thickness reduction and high detection sensitivity of a touch sensor or a touch panel. Another object of one embodiment of the present invention is to provide a touch sensor that can be used in a large-sized touch panel. Another object of one embodiment of the present invention is to provide a large-sized touch panel.

Another object of one embodiment of the present invention is to provide a manufacturing method of a touch sensor or a touch panel that has a small number of steps.

Another object of one embodiment of the present invention is to provide a touch panel in which reduction in display quality is suppressed. Another object of one embodiment of the present invention is to provide a touch panel with high reliability. Another object of one embodiment of the present invention is to provide a touch panel with high resistance to repeated bending. Another object of one embodiment of the present invention is to provide a novel semiconductor device, a novel light-emitting device, a novel display device, a novel touch sensor, a novel touch panel, a novel electronic device, or a novel lighting device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an active matrix touch sensor including a transistor and a capacitor. The transistor and the capacitor are electrically connected to each other.

Specifically, one embodiment of the present invention is a touch sensor including a transistor and a capacitor, the transistor and the capacitor are electrically connected to each other, the capacitor includes a pair of electrodes and a dielectric layer, the dielectric layer is located between the pair of electrodes, and one of the pair of electrodes includes an oxide conductor layer.

In the above structure, it is preferable that the transistor include an oxide semiconductor layer and that the oxide conductor layer and the oxide semiconductor layer be located over the same surface. In the transistor, it is preferable that a channel region be included in the oxide semiconductor layer.

In the above structure, a source or a drain of the transistor and one of the pair of electrodes (i.e., the oxide conductor layer) of the capacitor may be electrically connected to each other. In the above structure, the source or the drain of the transistor and the other of the pair of electrodes of the capacitor may be electrically connected to each other.

It is preferable that the touch sensor having any of the above structures have flexibility.

One embodiment of the present invention is a touch sensor including a first transistor, a second transistor, a third transistor, and a capacitor. A gate of the first transistor is electrically connected to a first wiring, one of a source and a drain of the first transistor is electrically connected to a second wiring, the other of the source and the drain of the first transistor is electrically connected to a gate of the second transistor and one electrode of the capacitor, one of a source and a drain of the second transistor is electrically connected to a third wiring, the other of the source and the drain of the second transistor is electrically connected to one of a source and a drain of the third transistor, a gate of the third transistor is electrically connected to a fourth wiring, the other of the source and the drain of the third transistor is electrically connected to a fifth wiring, the other electrode of the capacitor is electrically connected to a sixth wiring, and the one electrode or the other electrode of the capacitor includes an oxide conductor layer.

In the above structure, it is preferable that any one of the first transistor, the second transistor, and the third transistor include an oxide semiconductor layer located over a surface over which the oxide conductor layer is formed. It is particularly preferable that the first transistor include the oxide semiconductor layer.

In the above structure, the one electrode of the capacitor may include the oxide conductor layer. In the above structure, the other electrode of the capacitor may include the oxide conductor layer.

One embodiment of the present invention is a touch panel including the touch sensor having any of the above structures, a light-blocking layer, and a display element. The light-blocking layer is located between the touch sensor and the display element, the light-blocking layer includes a portion overlapping with the transistor, and the display element includes a portion overlapping with the capacitor. Note that the light-blocking layer includes a portion overlapping with at least one of a plurality of transistors, and preferably includes a portion overlapping with a plurality of transistors (e.g., the first transistor, the second transistor, and the third transistor).

One embodiment of the present invention is a touch panel including the touch sensor having any of the above structures, a light-blocking layer, and a display element. The touch sensor is located more on a display surface side of the touch panel than a display element side, the light-blocking layer is located more on the display surface side than the touch sensor side, the display element includes a portion overlapping with the capacitor, and the light-blocking layer includes a portion overlapping with the transistor.

In the above structure, it is preferable that the transistor include an oxide semiconductor layer. In the above structure, it is preferable that the capacitor include a dielectric layer and a pair of electrodes, that the dielectric layer be located between the pair of electrodes, and that one of the pair of electrodes include an oxide conductor layer.

In any of the above structures, the oxide semiconductor layer and the oxide conductor layer may be located over the same surface. In the transistor, it is preferable that a channel region be included in the oxide semiconductor layer.

In any of the above structures, the source or the drain of the transistor and the oxide conductor layer may be electrically connected to each other.

In the touch panel having any of the above structures, a first electrode, a second electrode, and a layer including a light-emitting organic compound (such a layer is also referred to as an EL layer) may be included in the display element, an insulating film covering an end portion of the first electrode may be included, the layer including a light-emitting organic compound may be located between the first electrode and the second electrode, and the insulating film may include a portion overlapping with the transistor.

It is preferable that the touch panel having any of the above structures have flexibility.

One embodiment of the present invention is a method for manufacturing a touch panel, including a first step of forming a first separation layer, a first insulating layer, and a display element in this order over a first formation substrate, a second step of forming a second separation layer, a second insulating layer, and a touch sensor in this order over a second formation substrate, a third step of forming a third separation layer, a third insulating layer, and a light-blocking layer in this order over a third formation substrate, a fourth step of bonding the display element over the first formation substrate and the touch sensor over the second formation substrate to each other using a first bonding layer, a fifth step of separating the second formation substrate and the second insulating layer using the second separation layer to expose the second insulating layer, a sixth step of bonding the exposed second insulating layer and the light-blocking layer over the third formation substrate using a second bonding layer, a seventh step of separating the third formation substrate and the third insulating layer using the third separation layer to expose the third insulating layer, an eighth step of bonding the exposed third insulating layer and a first flexible substrate to each other using a third bonding layer, a ninth step of separating the first formation substrate and the first insulating layer using the first separation layer to expose the first insulating layer, and a tenth step of bonding the exposed first insulating layer and a second flexible substrate using a fourth bonding layer. In the second step, a transistor and a capacitor are formed as the touch sensor. The transistor and the capacitor are electrically connected to each other, the transistor includes an oxide semiconductor layer, the capacitor includes a dielectric layer and a pair of electrodes, the dielectric layer is located between the pair of electrodes, and one of the pair of electrodes includes an oxide conductor layer. There is no limitation on the order of the first step and the second step. The fourth and subsequent steps are performed after the first step and the second step. The third step is performed before the sixth step. There is no limitation on the order of the seventh step and the ninth step. The seventh step and the eighth step are preferably performed in succession. The ninth step and the tenth step are preferably performed in succession.

In the above manufacturing method, the display element and the touch sensor are preferably bonded to each other in the fourth step so that a portion where the display element and the capacitor overlap with each other is formed.

In any of the above manufacturing methods, the second insulating layer and the light-blocking layer are preferably bonded to each other in the sixth step so that a portion where the light-blocking layer and the transistor overlap with each other is provided.

Note that the light-emitting device in this specification includes, in its category, a display device using a light-emitting element. In some cases, a light-emitting device is included in a module in which a light-emitting element is provided with a connector such as an anisotropic conductive film or a tape carrier package (TCP); a module in which a printed wiring board is provided at the end of a TCP; and a module in which an integrated circuit (IC) is directly mounted on a light-emitting element by a chip on glass (COG) method. A light-emitting device may be included in lighting equipment or the like.

One embodiment of the present invention can provide a touch sensor having flexibility or a touch panel having flexibility. One embodiment of the present invention can provide a lightweight touch sensor or a lightweight touch panel. One embodiment of the present invention can provide a touch sensor or a touch panel having a small thickness. One embodiment of the present invention can provide a touch sensor or a touch panel with high detection sensitivity. One embodiment of the present invention can achieve both thickness reduction and high detection sensitivity of a touch sensor or a touch panel, can provide a touch sensor that can be used in a large-sized touch panel, or can provide a large-sized touch panel.

One embodiment of the present invention can provide a manufacturing method of a touch sensor or a touch panel that has a small number of steps.

One embodiment of the present invention can provide a touch panel in which reduction in display quality is suppressed. One embodiment of the present invention can provide a touch panel with high reliability. One embodiment of the present invention can provide a touch panel with high resistance to repeated bending. One embodiment of the present invention can provide a novel semiconductor device, a novel light-emitting device, a novel display device, a novel touch sensor, a novel touch panel, a novel electronic device, or a novel lighting device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 1A and 1B illustrate an example of a touch sensor.
FIGS. 3A to 3E illustrate an example of a touch sensor.
FIGS. 9A to 9C illustrate an example of a touch panel.
FIGS. 10A, 10B1, 10B2, and 10C illustrate examples of structures of a sensor circuit and a converter and an example of a driving method thereof.
FIGS. 12A and 12B illustrate an example of a touch panel.
FIGS. 13A to 13C illustrate an example of a touch panel.
FIGS. 28A to 28D are Cs-corrected high-resolution TEM images of a plane of a CAAC-OS.
FIGS. 29A to 29C show structural analysis of a CAAC-OS and a single crystal oxide semiconductor by)(RD.
FIGS. 30A and 30B show electron diffraction patterns of a CAAC-OS.
FIG. 33 illustrates a deposition model of an nc-OS schematically and a pellet.

BEST MODE FOR CARRYING OUT THE INVENTION

Figure 2:
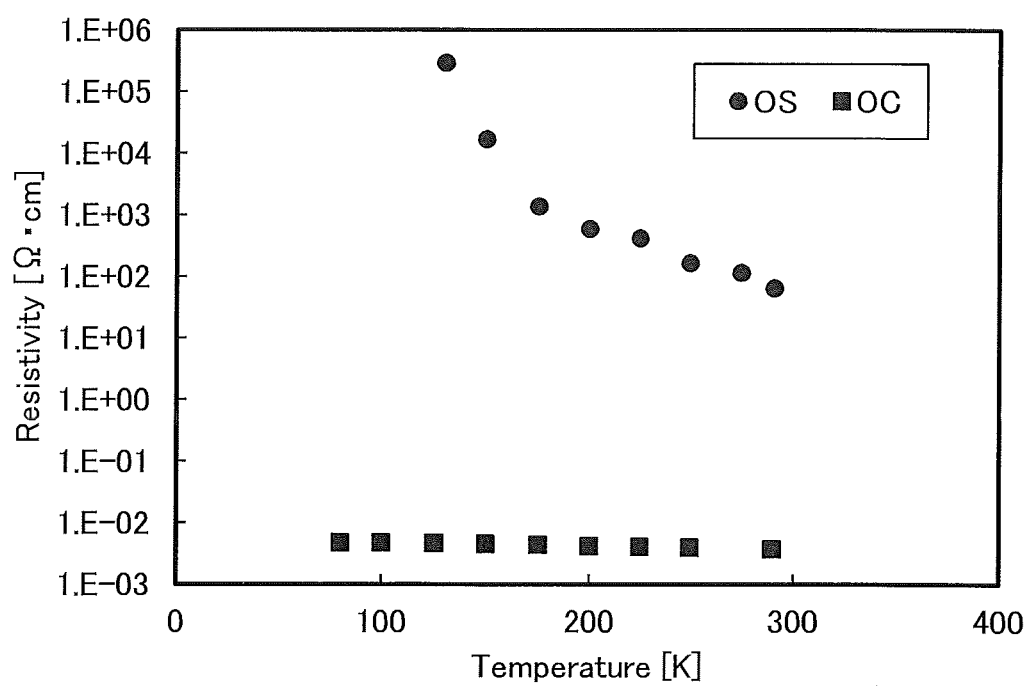
FIG. 2 shows dependence of resistivity on temperature.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

(Embodiment 1)

In this embodiment, a touch sensor of one embodiment of the present invention is described.

One embodiment of the present invention is an active matrix touch sensor including a transistor and a capacitor. The transistor and the capacitor are electrically connected to each other.

Specifically, one embodiment of the present invention is a touch sensor including a transistor and a capacitor. In the touch sensor, the transistor and the capacitor are electrically connected to each other, the capacitor includes a pair of electrodes and a dielectric layer, the dielectric layer is located between the pair of electrodes, and one of the pair of electrodes includes an oxide conductor layer.

Note that in this specification and the like, the oxide conductor layer can also be referred to as an oxide semiconductor layer having a high carrier density and a low resistance, an oxide semiconductor layer having conductivity, an oxide semiconductor layer having high conductivity, or the like.

An oxide semiconductor layer has a high light-transmitting property. By increasing oxygen vacancies and/or impurities such as hydrogen or water in the oxide semiconductor layer, an oxide semiconductor layer having a high carrier density and a low resistance (hereinafter also referred to as an oxide conductor layer) can be obtained. Such an oxide semiconductor layer can be favorably used as an electrode of the capacitor of the touch sensor.

In the above structure, it is preferable that the transistor include an oxide semiconductor layer that is located over a surface over which the oxide conductor layer is formed. Furthermore, it is preferable that the oxide semiconductor layer include a channel region.

It is preferable that the semiconductor layer of the transistor and the electrode of the capacitor be formed in the same step because the touch sensor can be manufactured in a small number of steps.

Note that a layer that is formed in the same step as that of the electrode of the capacitor is not limited to the semiconductor layer of the transistor. For example, a gate electrode, a source electrode, or a drain electrode of the transistor, a wiring, or the like may be formed using a material having a high light-transmitting property in the same step as that of the electrode of the capacitor.

Examples of a structure and a manufacturing method of a touch sensor of one embodiment of the present invention are described below.

<Structure Example 1 of Touch Sensor>

FIG. 1A illustrates a transistor 102 and a capacitor 105 included in a touch sensor of one embodiment of the present invention. The transistor 102 and the capacitor 105 are provided in a sensor portion of the touch sensor, for example. The transistor included in the touch sensor of one embodiment of the present invention has a bottom-gate structure. In FIG. 1A, the transistor 102 and the capacitor 105 are formed over a substrate 302 with an insulating film 338 provided between the substrate 302, and the transistor 102 and the capacitor 105.

The transistor 102 includes a conductive film 304 that functions as the gate electrode, an insulating film 305 that is over the conductive film 304 and functions as a gate insulating film, an oxide semiconductor layer 308a over the insulating film 305, and conductive films 310a and 310b that are over the oxide semiconductor layer 308a and function as a source electrode and a drain electrode. Insulating films 312 and 314 are provided as protective films over the transistor 102, more in details, over the oxide semiconductor layer 308a and the conductive films 310a and 310b. Furthermore, an insulating film 348 is provided over the insulating film 314.

The capacitor 105 includes a dielectric layer between a pair of electrodes. The capacitor 105 includes a conductive film 350 as one of the pair of electrodes and an oxide conductor layer 308b as the other of the pair of electrodes. The insulating films 314 and 348 serve a dielectric layer of the capacitor 105. In other words, the insulating films 314 and 348 are provided for both the transistor 102 and the capacitor 105. Although FIG. 1A illustrates a layered structure of the insulating films 314 and 348 as the dielectric layer, this layered structure is not necessarily employed and a single-layer structure or a layered structure including three or more layers may be employed.

The oxide conductor layer 308b is formed in the same step as the oxide semiconductor layer 308a so as to be over the insulating film 305 that functions as the gate insulating film. The conductive film 310b that functions as the drain electrode of the transistor 102 is electrically connected to the oxide conductor layer 308b. In the example illustrated here, part of the conductive film 310b is in contact with the oxide conductor layer 308b; however, the conductive film 310b may be electrically connected to the oxide conductor layer 308b through another conductive film. The conductive film 310b may be electrically connected to the conductive film 350.

Note that the structure of the transistor included in the touch sensor of one embodiment of the present invention is not particularly limited. For example, a forward staggered transistor or an inverted staggered transistor may be used. A top-gate transistor or a bottom-gate transistor may be used. A semiconductor material used for the transistor is not particularly limited, and for example, an oxide semiconductor, silicon, or germanium can be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The oxide semiconductor layer 308a and the oxide conductor layer 308b are layers processed into island-like shapes through the same film formation step and the same etching step. An oxide semiconductor is a semiconductor material whose resistance can be controlled by oxygen vacancies in the film of the semiconductor material and/or the concentration of impurities such as hydrogen or water in the film of the semiconductor material. Therefore, to control the resistivity of each of the oxide semiconductor layer 308a and the oxide conductor layer 308b formed in the same step, treatment to be performed on the oxide semiconductor layers processed into island-like shapes is selected from the following: treatment for increasing oxygen vacancies and/or impurity concentration and treatment for reducing oxygen vacancies and/or impurity concentration.

Specifically, plasma treatment is performed on the island-like oxide semiconductor layer that is to be the oxide conductor layer 308b functioning as the electrode of the capacitor to increase oxygen vacancies and/or impurities such as hydrogen or water in the oxide semiconductor layer, so that the oxide semiconductor layer can have a high carrier density and a low resistance. Alternatively, an insulating film containing hydrogen is formed in contact with the oxide semiconductor layer to diffuse hydrogen from the insulating film containing hydrogen to the oxide semiconductor layer, so that the oxide semiconductor layer can have a high carrier density and a low resistance.

The insulating film 312 is provided over the transistor 102 to prevent the oxide semiconductor layer 308a from being subjected to the plasma treatment. Since the insulating film 312 is provided, the oxide semiconductor layer 308a is not in contact with the insulating film 314 containing hydrogen. The insulating film 312 can be formed using an insulating film capable of releasing oxygen, in which case oxygen can be supplied to the oxide semiconductor layer 308a. The oxide semiconductor layer 308a to which oxygen is supplied is an oxide semiconductor in which oxygen vacancies in the film or at the interface are reduced and which has a high resistance. Note that as the insulating film capable of releasing oxygen, a silicon oxide film or a silicon oxynitride film can be used, for example.

As the plasma treatment to be performed on the oxide conductor layer 308b, plasma treatment using a gas containing one of a rare gas (He, Ne, Ar, Kr, or Xe), phosphorus, boron, hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide conductor layer 308b. This oxygen vacancy can cause carrier generation. Further, when hydrogen is supplied from an insulating film that is in the vicinity of the oxide conductor layer 308b, specifically, that is in contact with the lower surface or the upper surface of the oxide conductor layer 308b, and hydrogen enters the oxygen vacancy, an electron serving as a carrier might be generated. Accordingly, the oxide conductor layer 308b whose oxygen vacancies are increased by the plasma treatment has a higher carrier density than the oxide semiconductor layer 308a.

The oxide semiconductor layer 308a in which oxygen vacancies are reduced and the hydrogen concentration is reduced can be referred to as a highly purified intrinsic or substantially highly purified intrinsic oxide semiconductor layer. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$. Furthermore, the state in which an impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). The highly purified intrinsic or substantially highly purified intrinsic oxide semiconductor layer 308a has a low density of defect states and accordingly can have a low density of trap states.

Furthermore, the highly purified intrinsic or substantially highly purified intrinsic oxide semiconductor layer 308a has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode in the range from 1 V to 10 V. Thus, the transistor 102 whose channel region is formed in the oxide semiconductor layer 308a has a small change in electrical characteristics and is highly reliable.

The insulating film 312 in FIG. 1A is formed in such a manner that the insulating film that overlaps with the oxide conductor layer 308b functioning as the electrode of the capacitor is selectively removed. The insulating film 314 formed in contact with the oxide conductor layer 308b may be removed from the oxide conductor layer 308b. For example, an insulating film containing hydrogen, that is, an insulating film capable of releasing hydrogen, typically, a silicon nitride film, is used as the insulating film 314, whereby hydrogen can be supplied to the oxide conductor layer 308b. The insulating film capable of releasing hydrogen preferably has a hydrogen concentration of $1 \times 10^{22}$ atoms/cm$^3$ or higher. Such an insulating film is formed in contact with the oxide conductor layer 308b, whereby hydrogen can be effectively contained in the oxide conductor layer 308b. In this manner, the above-described plasma treatment is performed and the structure of the insulating film in contact with the oxide semiconductor layer (or the oxide conductor layer) is changed, whereby the resistance of the oxide semiconductor layer (or the oxide conductor layer) can be appropriately adjusted.

Hydrogen contained in the oxide conductor layer 308b reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, the oxide conductor layer 308b containing hydrogen has a higher carrier density than the oxide semiconductor layer 308a.

Hydrogen in the oxide semiconductor layer 308a of the transistor 102 in which a channel region is formed is preferably reduced as much as possible. Specifically, in the oxide semiconductor layer 308a, the hydrogen concentration measured by secondary ion mass spectrometry (SIMS) is set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, more preferably lower than $5 \times 10^{18}$ atoms/cm$^3$, more preferably lower than or equal to $1 \times 10^{18}$ atoms/cm$^3$, more preferably lower than or equal to $5 \times 10^{17}$ atoms/cm$^3$, more preferably lower than or equal to $1 \times 10^{16}$ atoms/cm$^3$.

On the other hand, the oxide conductor layer 308b functioning as the electrode of the capacitor is a low-resistance oxide conductor layer having a high hydrogen concentration and/or a large amount of oxygen vacancies as compared to the oxide semiconductor layer 308a.

The oxide semiconductor layer 308a and the oxide conductor layer 308b are typically formed using a metal oxide such as an In—Ga oxide, an In—Zn oxide, or an In-M-Zn oxide (M is Mg, Al, Ti, Ga, Y, Zr, La, Ce, Nd, or Hf). Note that oxide semiconductor layer 308a and the oxide conductor layer 308b have a light-transmitting property.

Note that in the case where the oxide semiconductor layer 308a is an In-M-Zri oxide, when the summation of In and M is assumed to be 100 atomic %, the proportions of In and Mare preferably set to be greater than or equal to 25 atomic % and less than 75 atomic %, respectively, or greater than or equal to 34 atomic % and less than 66 atomic %, respectively.

The energy gap of the oxide semiconductor layer 308a is 2 eV or more, 2.5 eV or more, or 3 eV or more.

The thickness of the oxide semiconductor layer 308a can be greater than or equal to 3 nm and less than or equal to 200 nm, greater than or equal to 3 nm and less than or equal to 100 nm, or greater than or equal to 3 nm and less than or equal to 60 nm.

Further, in the case where the oxide semiconductor layer 308a is an In-M-Zn oxide, the atomic ratio of metal elements of a sputtering target used for forming the In-M-Zn oxide preferably satisfies In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:MZn=3:1:2, or the like is preferable. Note that the atomic ratio of metal elements in the formed oxide semiconductor layer 308a varies from the above atomic ratio of metal elements of the sputtering target within a range of ±40% as an error.

Note that other components of the touch sensor shown in FIG. 1A are described in detail in the description of the manufacturing method of a touch sensor, for example.

When hydrogen is added to an oxide semiconductor in which an oxygen vacancy is generated, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed using an oxide semiconductor (hereinafter referred to as an oxide semiconductor film (OS)) and that of a film formed using an oxide conductor (hereinafter referred to as an oxide conductor film (OC)) are described with reference to FIG. 2. In FIG. 2, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) is prepared by forming a 35-nm-thick In—Ga—Zn oxide film over a glass substrate by a sputtering method using a sputtering target with an atomic ratio of In:Ga:Zn=1:1:1.2, forming a 20-nm-thick IGZO film over the 35-nm-thick In—Ga—Zn oxide film by a sputtering method using a sputtering target with an atomic ratio of In:Ga:Zn=1:4:5, performing heat treatment at 450° C. in a nitrogen atmosphere and then performing heat treatment at 450° C. in an atmosphere of a mixed gas of nitrogen and oxygen, and forming a silicon oxynitride film over the oxide films by a plasma CVD method.

A sample including the oxide conductor film (OC) is prepared by forming a 100-nm-thick In—Ga—Zn oxide film over a glass substrate by a sputtering method using a sputtering target with an atomic ratio of In:Ga:Zn=1:1:1, performing heat treatment at 450° C. in a nitrogen atmosphere and then performing heat treatment at 450° C. in an atmosphere of a mixed gas of nitrogen and oxygen, and forming a silicon nitride film over the oxide film by a plasma CVD method.

As can be seen from FIG. 2, the temperature dependence of resistivity of the oxide conductor film (OC) is lower than the temperature dependence of resistivity of the oxide semiconductor film (OS). Typically, variation of the resistivity of the oxide conductor film (OC) at temperatures from 80 K to 290 K is more than −20% and less than +20%. Alternatively, the range of variation of resistivity at temperatures from 150 K to 250 K is from more than −10% to less than +10%. In other words, the oxide conductor is a degenerate semiconductor and it is suggested that the conduction band edge agrees with or substantially agrees with the Fermi level. Therefore, the oxide conductor film can be used as the electrode of the capacitor, for example.

<Modification Example 1 of Touch Sensor>

A touch sensor of one embodiment of the present invention has flexibility.

A layer to be separated can be formed over a formation substrate, separated from the formation substrate, and then transferred to another substrate. With this method, for example, a layer to be separated which is formed over a substrate having a high heat resistance can be transferred to a substrate having a low heat resistance. Therefore, the forming temperature of the layer to be separated is not limited by the substrate having a low heat resistance.

For example, after the transistor 102, the capacitor 105, and the like are formed over a formation substrate, these elements are separated from the formation substrate. Then, these elements are transferred onto the flexible substrate by being bonded to the flexible substrate using an adhesive. Thus, a touch sensor shown in FIG. 1B can be manufactured. In FIG. 1B, the transistor 102 and the capacitor 105 are located between a flexible substrate 392 and a flexible substrate 398. The flexible substrate 392 and the insulating film 338 are bonded to each other with a bonding layer 394. The flexible substrate 398, the conductive film 350, and the insulating film 348 are bonded together using a bonding layer 396.

Furthermore, in FIG. 1B, structure examples of a terminal portion of the touch sensor and a driver circuit portion including the transistor 103 are illustrated. Structures of the transistor 102 and the capacitor 105 in a sensor portion are not described because they are similar to those in FIG. 1A.

A transistor 103 included in the driver circuit portion differs from the transistor 102; in the transistor 103, a conductive film 303 is provided over the insulating film 312. The conductive film 303 can function as a second gate electrode. As compared with the transistor 102, the transistor 103 can have a high field-effect mobility and thus have high on-state current. As a result, a driver circuit portion that can operate at high speed can be formed. Furthermore, a touch sensor including a driver circuit portion occupying a small area can be formed. Note that in the example illustrated here, the transistor included in the driver circuit portion and the transistor included in the sensor portion have different structures. However, the transistor included in the driver circuit portion and the transistor included in the sensor portion may have the same structure. All of a plurality of transistors included in the driver circuit portion may have the same structure, or the plurality of transistors included in the driver circuit portion may have two or more kinds of structures. All of a plurality of transistors included in the sensor portion may have the same structure, or the plurality of transistors included in the sensor portion may have two or more kinds of structures. A transistor including one gate electrode may be used for the driver circuit portion, and a transistor including two gate electrodes may be used for the sensor portion.

The conductive film 303 as the second gate electrode of the transistor 103 and the conductive film 350 as the electrode of the capacitor 105 are preferably located over the same surface.

It is preferable that the electrode of the transistor and the electrode of the capacitor be formed in the same step because the touch sensor can be manufactured in a small number of steps.

The conductive film 346 is electrically connected to an external input terminal through which a signal or a potential from the outside is transmitted to the driver circuit portion. Here, an example is described in which a flexible printed circuit (FPC) 808 is provided as the external input terminal. To prevent an increase in the number of manufacturing steps, the conductive film 346 is preferably formed using the same material step as those of the electrode or the wiring in the sensor portion or the driver circuit portion. Here, an example in which the conductive film 346 is formed using the same material and step as those of the electrodes included in the transistors 102 and 103 is described.

A connector 825 is connected to the FPC 808. The FPC 808 is electrically connected to the conductive film 346 through the connector 825.

In the touch sensor of one embodiment of the present invention, in the case where external light is delivered from the flexible substrate 392 side, the conductive film 304 is preferably formed using a light-blocking material so that the oxide semiconductor layer 308a of the transistor 102 provided in the sensor portion is not irradiated with light. Furthermore, it is preferable that a whole bottom surface (a surface in contact with the insulating film 305) of the oxide semiconductor layer 308a overlap with the conductive film 304. Note that for example, in the case where external light is not delivered from the flexible substrate 392 side, the structures of the oxide semiconductor layer 308a and the conductive film 304 are not limited thereto, and a size relation of the oxide semiconductor layer 308a and the conductive film 304 in a top view thereof is not limited thereto. Also in the transistor 103 of the driver circuit portion, a whole bottom surface of the oxide semiconductor layer 308a may overlap with the conductive film 304.

<Structure Example 2 of Touch Sensor>

FIG. 3A illustrates transistors 104 and 106 and the capacitor 105 in a touch sensor of one embodiment of the present invention. The transistor included in the touch sensor of one embodiment of the present invention has a top-gate structure. The transistor 104 and the capacitor 105 are provided in the sensor portion of the touch sensor, for example. The transistor 106 is provided in the driver circuit portion of the touch sensor, for example.

FIG. 3B is a top view of the transistor 104. A cross-sectional view of the transistor 104 shown in FIG. 3A corresponds to a cross-sectional view along the dashed-dotted line X1-X2 in FIG. 3B. FIG. 3C is a top view of the transistor 106. A cross-sectional view of the transistor 106 shown in FIG. 3A corresponds to a cross-sectional view along the dashed-dotted line X3-X4 in FIG. 3C. FIG. 3E corresponds to a cross-sectional view along the dashed-dotted line Y3-Y4 in FIG. 3C. Note that in FIGS. 3A and 3E, the substrate and some other components are not illustrated. Furthermore, in FIGS. 3B and 3C, the substrate, the insulating film, and some other components are not illustrated for the sake of clarity. Furthermore, the direction of the dashed dotted line X1-X2 may be called a channel length direction, and the direction of the dashed dotted line Y3-Y4 may be called a channel width direction.

The transistor 104 shown in FIGS. 3A and 3B includes the oxide semiconductor layer 308a over an insulating surface, the insulating film 305 over the oxide semiconductor layer 308a, the conductive film 304 overlapping with the oxide semiconductor layer 308a with the insulating film 305 provided therebetween, the insulating film 312 covering the oxide semiconductor layer 308a, the insulating film 305, and the conductive film 304, and the conductive films 310a and 310b connected to the oxide semiconductor layer 308a in an opening portion provided in the insulating film 312. Note that the insulating films 314 and 348 covering the insulating film 312, the conductive film 310a, and the conductive film 310b may be provided over the transistor 104.

In the transistor 104, the conductive film 304 functions as a gate electrode (also referred to as a top-gate electrode), the conductive film 310a functions as one of a source electrode and a drain electrode, and the conductive film 310b functions as the other of the source electrode and the drain electrode. Furthermore, in the transistor 104, the insulating film 338 functions as a base film of the oxide semiconductor layer 308a and the insulating film 305 functions as a gate insulating film.

The capacitor 105 includes the conductive film 350 as one of the pair of electrodes and the oxide conductor layer 308b as the other of the pair of electrodes. The insulating films 314 and 348 serve a dielectric layer of the capacitor 105. In other words, the insulating films 314 and 348 are provided for both the transistor 104 and the capacitor 105. In the example illustrated in FIG. 3A, the conductive film 310b and the conductive film 350 are in contact with each other. The conductive film 310b and the conductive film 350 may be electrically connected to each other through another conductive film.

The oxide semiconductor layer 308a and the oxide conductor layer 308b are layers processed into island-like shapes through the same film formation step and the same etching step. It is preferable that the semiconductor layer of the transistor and the electrode of the capacitor be formed in the same step because the touch sensor can be manufactured in a small number of steps. Thus, a manufacturing cost can be reduced.

Next, the oxide semiconductor layer 308a included in the transistor 104 is described in detail below.

An element which forms an oxygen vacancy is contained in a region that does not overlap with the conductive film 304 in the oxide semiconductor layer 308a of the transistor 104. The element which feints an oxygen vacancy will be described as an impurity element. Typical examples of impurity elements are hydrogen, boron, carbon, nitrogen, fluorine, aluminum, silicon, phosphorus, chlorine, and rare gas elements. Typical examples of rare gas elements are helium, neon, argon, krypton, and xenon.

When the impurity element is added to the oxide semiconductor film, a bond between a metal element and oxygen in the oxide semiconductor film is cut, whereby an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. Thus, the carrier density is increased in the oxide semiconductor film, and the conductivity of the oxide semiconductor film is increased as a result.

A region in which the carrier density of the oxide semiconductor film is increased and the conductivity thereof is increased (hereinafter such a region is referred to as a low-resistance region) is formed in a cross section of the oxide semiconductor layer 308a in the channel length direction. The low-resistance region formed in the oxide semiconductor layer 308a has a plurality of structures. FIG. 3D shows an example of the plurality of structures. Note that in FIG. 3D, a channel length L corresponds to a length of a region between a pair of low-resistance regions.

As illustrated in FIG. 3D, the oxide semiconductor layer 308a includes a channel region 332a formed in a region overlapping with the conductive film 304 and low-resistance regions 332b and 332c between which the channel region 332a is provided and which contain the impurity elements.

Note that as illustrated in FIG. 3D, in the cross-sectional shape in the channel length direction, the boundaries between the channel region 332a and the low-resistance regions 332b and 332c coincide with or substantially coincide with bottom end portions of the conductive film 304, with the insulating film 305 provided between the conductive film 304 and the boundaries. That is, in a top surface shape, the boundaries between the channel region 332a and the low-resistance regions 332b and 332c coincide with or substantially coincide with the bottom end portions of the conductive film 304.

Figure 7A:
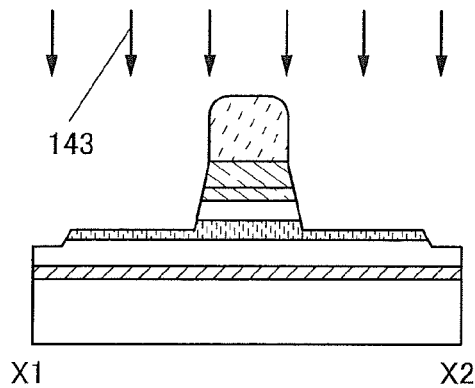
FIGS. 7A to 7G illustrate an example of the method for manufacturing a touch sensor.
Figure 7B:
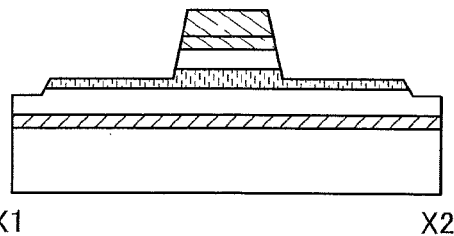
Figure 7C:
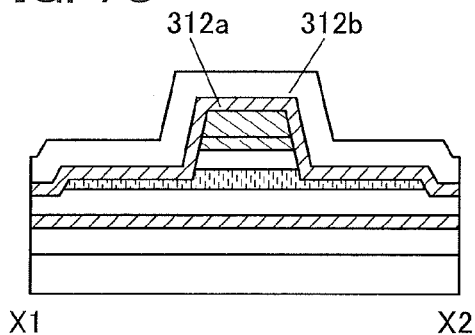
Figure 7D:
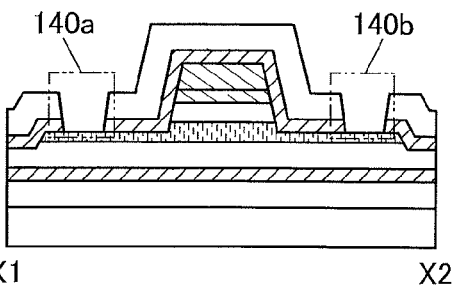
Figure 7E:
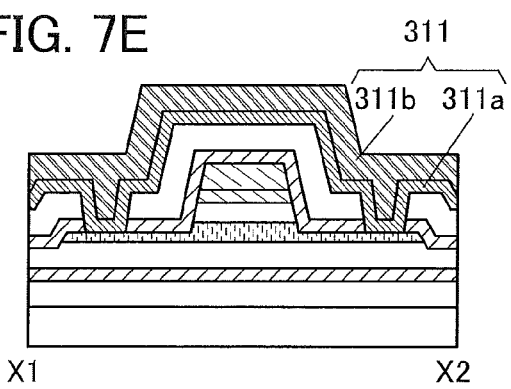
Figure 7F:
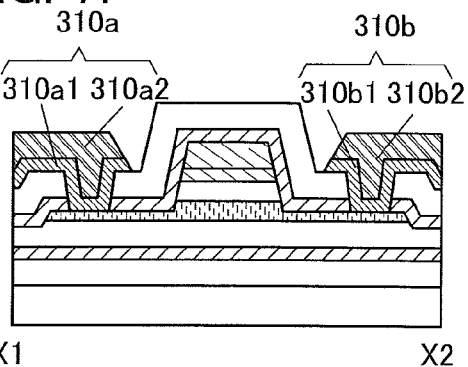
Figure 7G:
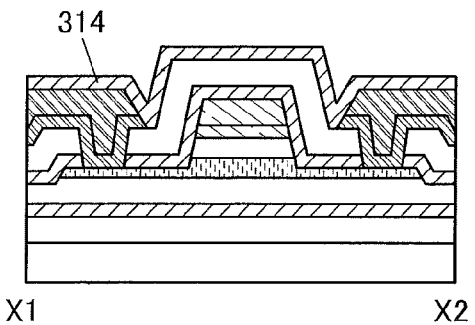

In some cases, the oxide semiconductor layer 308a includes a region that does not overlap with the insulating film 305 and the conductive film 304 and is thinner than a region overlapping with insulating film 305 and the conductive film 304 (see FIG. 7G, for example). The thin region is thinner than the region of the oxide semiconductor film overlapping with the insulating film 305 and the conductive film 304 by 0.1 nm or more and 5 nm or less, for example.

Note that the low-resistance regions 332b and 332c in the oxide semiconductor layer 308a function as a source region and a drain region. The impurity element is contained in the low-resistance regions 332b and 332c.

In the case where the impurity element is a rare gas element and the oxide semiconductor layer 308a is formed by a sputtering method, the channel region 332a and the low-resistance regions 332b and 332c each contain a rare gas element. Note that the concentrations of the rare gas elements in the low-resistance regions 332b and 332c are higher than the concentration of the rare gas element in the channel region 332a.

The reasons for this are as follows: in the case where the oxide semiconductor layer 308a is formed by a sputtering method, a rare gas is used as a sputtering gas, so that the oxide semiconductor layer 308a contains the rare gas; and a rare gas is intentionally added to the low-resistance regions 332b and 332c in order to form oxygen vacancies in the low-resistance regions 332b and 332c.

In the case where the impurity element is boron, carbon, nitrogen, fluorine, aluminum, silicon, phosphorus, or chlorine, the low-resistance regions 332b and 332c contain the above-described impurity element. Therefore, the concentrations of the above-described impurity elements in the low-resistance regions 332b and 332c are higher than the concentration of the above-described impurity element in the channel region 332a. Note that the concentrations of the impurity elements in the low-resistance regions 332b and 332c which are measured by secondary ion mass spectrometry can be greater than or equal to $5\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

In the case where the impurity element is hydrogen, the impurity element concentrations in the low-resistance regions 332b and 332c are higher than the impurity element concentration in the channel region 332a. Note that the concentrations of hydrogen in the low-resistance regions 332b and 332c which are measured by secondary ion mass spectrometry can be higher than or equal to $8\times10^{19}$ atoms/cm$^3$, higher than or equal to $1\times10^{20}$ atoms/cm$^3$, or higher than or equal to $5\times10^{20}$ atoms/cm$^3$.

Since the low-resistance regions 332b and 332c contain the impurity elements, oxygen vacancies and carrier densities are increased. As a result, the low-resistance regions 332b and 332c have higher conductivity.

Note that as the impurity element, a rare gas and one or more of hydrogen, boron, carbon, nitrogen, fluorine, aluminum, silicon, phosphorus, and chlorine may be used. In that case, in the low-resistance regions 332b and 332c, by interaction between oxygen vacancies formed by the rare gas and one or more of hydrogen, boron, carbon, nitrogen, fluorine, aluminum, silicon, phosphorus, and chlorine which is added, the conductivity of the low-resistance regions 332b and 332c is further increased in some cases.

The low-resistance regions 332b and 332c can be regarded as regions formed of an oxide conductor (or including an oxide conductor). In other words, the oxide conductor is a degenerate semiconductor and it is suggested that the conduction band edge agrees with or substantially agrees with the Fermi level. For that reason, an ohmic contact is made between the oxide conductor and the conductive films functioning as a source electrode and a drain electrode; thus, contact resistance between the oxide conductor and the conductive films functioning as a source electrode and a drain electrode can be reduced.

When the impurity element in the oxide semiconductor layer 308a, in particular, the channel region 332a, is reduced, the carrier density of the oxide semiconductor film can be lowered. Therefore, in the oxide semiconductor layer 308a, in particular, the channel region 332a, carrier density can be less than or equal to $1\times10^{17}/cm^3$, less than or equal to $1\times10^{15}/cm^3$, less than or equal to $1\times10^{13}/cm^3$, or less than or equal to $1\times10^{11}/cm^3$.

Note that an oxide semiconductor film with a low impurity concentration and a low density of defect states can be used for the oxide semiconductor layer 308a, in which case the transistor can have more excellent electrical characteristics.

The oxide semiconductor layer 308a may have a non-single crystal structure, for example. The non-single-crystal structure includes a c-axis aligned crystalline oxide semiconductor (CAAC-OS) which is described later, a polycrystalline structure, a microcrystalline structure which is described later, or an amorphous structure, for example. Among the non-single crystal structure, the amorphous structure has the highest density of defect levels, whereas CAAC-OS has the lowest density of defect levels.

Note that the oxide semiconductor layer 308a may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a region of CAAC-OS, and a region having a single-crystal structure in some cases. Furthermore, the mixed film has a stacked-layer structure of two or more of a region having an amorphous structure, a region having a microcrystalline structure, a region having a polycrystalline structure, a region of CAAC-OS, and a region having a single-crystal structure in some cases.

Note that in the oxide semiconductor layer 308a, the crystallinity of the channel region 332a is different from the crystallinity of each of the low-resistance regions 332b and 332c in some cases. Specifically, in the oxide semiconductor layer 308a, the crystallinity of the channel region 332a is higher than the crystallinity of each of the low-resistance regions 332b and 332c. This is because, when the impurity element is added to the low-resistance regions 332b and 332c, the low-resistance regions 332b and 332c are damaged and thus have lower crystallinity.

In the transistor 104 described in this embodiment, the channel region 332a is sandwiched between the low-resistance regions 332b and 332c functioning as a source region and a drain region. Therefore, the on-state current and field-effect mobility of the transistor 104 are high. In addition, in the transistor 104, the impurity element is added to the oxide semiconductor layer 308a using the conductive film 304 as a mask. That is, the low-resistance region can be formed in a self-aligned manner.

Furthermore, in the transistor 104, the conductive film 304 functioning as a gate electrode does not overlap with the conductive films 310a and 310b functioning as a source electrode and a drain electrode. Therefore, parasitic capacitance between the conductive film 304 and the conductive films 310a and 310b can be reduced. As a result, in the case where a large-area substrate is used as the substrate, signal delay in the conductive film 304 and the conductive films 310a and 310b can be reduced.

The transistor 106 shown in FIGS. 3A, 3C, and 3E includes the conductive film 303 over the insulating film 338, an insulating film 301 over the insulating film 338 and the conductive film 303, the oxide semiconductor layer 308a overlapping with the conductive film 303 with the insulating film 301 provided therebetween, the insulating film 305 over the oxide semiconductor layer 308a, the conductive film 304 overlapping with the oxide semiconductor layer 308a with the insulating film 305 provided therebetween, the insulating film 312 covering the oxide semiconductor layer 308a, the insulating film 305, and the conductive film 304, and the conductive films 310a and 310b connected to the oxide semiconductor layer 308a in opening portions 140a and 140b provided in the insulating film 312. Note that the insulating films 314 and 348 covering the insulating film 312, the conductive film 310a, and the conductive film 310b may be provided over the transistor 106.

In the transistor 106, the conductive film 303 functions as a first gate electrode (also referred to as a bottom-gate electrode), the conductive film 304 functions as a second gate electrode (also referred to as a top-gate electrode), the conductive film 310a functions as one of a source electrode and a drain electrode, and the conductive film 310b functions as the other of the source electrode and the drain electrode. Furthermore, in the transistor 106, the insulating film 301 functions as a first gate insulating film, and the insulating film 305 functions as a second gate insulating film.

Note that the transistor 106 shown in FIGS. 3A, 3C, and 3E is different from the transistor 104 described above and has a structure in which the conductive film functioning as a gate electrode is provided over and under the oxide semiconductor layer 308a. As shown in the transistor 106, a transistor included in a touch sensor of one embodiment of the present invention may have two or more gate electrodes.

As illustrated in FIG. 3E, the conductive film 304 functioning as a second gate electrode is connected to the conductive film 303 functioning as a first gate electrode in an opening portion 139 provided in the insulating film 301 and the insulating film 305.

Therefore, the same potential is applied to the conductive film 304 and the conductive film 303. Note that the opening portion 139 is not necessarily provided, so that different potentials are supplied to the conductive film 304 and the conductive film 303.

As illustrated in FIG. 3E, the oxide semiconductor layer 308a is positioned to face each of the conductive film 303 functioning as a first gate electrode and the conductive film 304 functioning as a second gate electrode, and is sandwiched between the two conductive films functioning as gate electrodes. The length in the channel width direction of the conductive film 304 functioning as a second gate electrode is longer than the length in the channel width direction of the oxide semiconductor layer 308a. In the channel width direction, the whole oxide semiconductor layer 308a is covered with the conductive film 304 with the insulating film 305 provided therebetween. Since the conductive film 304 functioning as a second gate electrode is connected to the conductive film 303 functioning as a first gate electrode in the opening portion 139 provided in the insulating film 305, a side surface of the oxide semiconductor layer 308a in the channel width direction faces the conductive film 304 functioning as a second gate electrode with the insulating film 305 provided therebetween.

In other words, in the channel width direction of the transistor 106, the conductive film 303 functioning as a first gate electrode and the conductive film 304 functioning as a second gate electrode are connected to each other in the opening portion provided in the insulating film 301 functioning as a first gate insulating film and the insulating film 305 functioning as a second gate insulating film; and the conductive film 303 and the conductive film 304 surround the oxide semiconductor layer 308a with the insulating film 301 functioning as a first gate insulating film and the insulating film 305 functioning as a second gate insulating film provided therebetween.

Such a structure enables electric fields of the conductive film 303 functioning as a first gate electrode and the conductive film 304 functioning as a second gate electrode to electrically surround the oxide semiconductor layer 308a included in the transistor 106. A device structure of a transistor, like that of the transistor 106, in which electric fields of a first gate electrode and a second gate electrode electrically surround an oxide semiconductor film where a channel region is formed can be referred to as a surrounded channel (s-channel) structure.

Since the transistor 106 has the s-channel structure, an electric field for inducing a channel can be effectively applied to the oxide semiconductor layer 308a by the conductive film 303 functioning as a first gate electrode or the conductive film 304 functioning as a second gate electrode; therefore, the current drive capability of the transistor 106 can be improved and high on-state current characteristics can be obtained. Since the on-state current can be increased, it is possible to reduce the size of the transistor 106. In addition, since the transistor 106 has a structure in which the oxide semiconductor layer 308a is surrounded by the conductive film 303 functioning as a first gate electrode and the conductive film 304 functioning as a second gate electrode, the mechanical strength of the transistor 106 can be increased.

Note that in the channel width direction of the transistor 106, an opening portion which is different from the opening portion 139 may be formed on the side of the oxide semiconductor layer 308a where the opening portion 139 is not formed.

<Modification Example 2 of Touch Sensor>

A touch sensor of one embodiment of the present invention includes an oxide semiconductor layer having a stacked-layer structure.

Figure 8A:
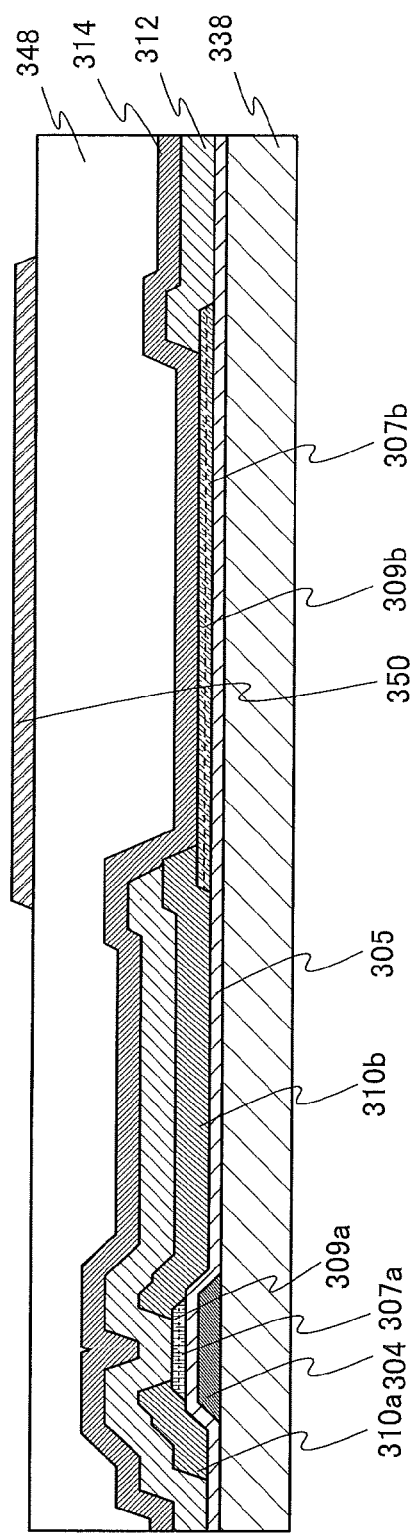
FIGS. 8A and 8B illustrate an example of a touch sensor and an example of a band structure.

Next, in an example of a touch sensor illustrated in FIG. 8A, a stacked-layer structure of an oxide semiconductor layer 307a and an oxide semiconductor layer 309a is used instead of the oxide semiconductor layer 308a used for the transistor 102. Furthermore, in the example of the touch sensor illustrated in FIG. 8A, a stacked-layer structure of the oxide semiconductor layer 307a and the oxide semiconductor layer 309a is used instead of the oxide conductor layer 308b used for the capacitor 105. Thus, the other components are the same as those of the touch sensor illustrated in FIG. 1A; hence, the above description can be referred to. Note that the oxide semiconductor layer 307b and the oxide semiconductor layer 309b can also be called oxide conductor layers. Therefore, in FIG. 8A, the oxide semiconductor layer 307b and the oxide semiconductor layer 309b are hatched like the oxide conductor layer 308b in FIG. 1A or the like. Note that in FIG. 8A, the substrate and other components are not illustrated.

A metal oxide of the oxide semiconductor layers 307a and 307b (in this specification below, also referred to as the oxide semiconductor layer 307) and a metal oxide of the oxide semiconductor layers 309a and 309b (in this specification below, also referred to as an oxide semiconductor layer 309) preferably have at least one constituent element in common. Furthermore, the constituent elements of the oxide semiconductor layer 307 and the oxide semiconductor layer 309 may be the same and the compositions of the constituent elements of the oxide semiconductor layer 307 and the oxide semiconductor layer 309 may be different from each other.

In the case where the oxide semiconductor layer 307 is an In-M-Zn oxide (M represents Al, Ga, Ge, Y, Zr, Sn, La, Ce, or Hf), it is preferable that the atomic ratio of metal elements of a sputtering target used for forming a film of the In-M-Zn oxide satisfy In≥M and Zn≥M As the atomic ratio of metal elements of such a sputtering target, In:M:Zn=1:1:1, In:MZn=5:5:6 (1:1:1.2), and In:MZn=3:1:2 are preferable. Note that the atomic ratio of metal elements in the formed oxide semiconductor layer 307 varies from the above atomic ratio of metal elements of the sputtering target within a range of ±20% as an error.

When the oxide semiconductor layer 307 is an In-M-Zn oxide, the atomic ratio of In to M when the summation of In and M is assumed to be 100 at. % is preferably as follows: the atomic percentage of In is higher than or equal to 25 at. % and the atomic percentage of M is lower than 75 at. %; more preferably, the atomic percentage of In is higher than or equal to 34 at. % and the atomic percentage of M is lower than 66 at. %.

The energy gap of the oxide semiconductor layer 307 is 2 eV or more, preferably 2.5 eV or more, more preferably 3 eV or more. In this manner, off-state current of a transistor can be reduced by using an oxide semiconductor having an energy gap.

The thickness of the oxide semiconductor layer 307 is greater than or equal to 3 nm and less than or equal to 200 nm, preferably greater than or equal to 3 nm and less than or equal to 100 nm, more preferably greater than or equal to 3 nm and less than or equal to 50 nm.

The oxide semiconductor layer 309 is typically an In—Ga oxide, an In—Zn oxide, or an In-M-Zn oxide (M is Al, Ga, Ge, Y, Zr, Sn, La, Ce, or Hf). The energy of the bottom of the conduction band in the oxide semiconductor layer 309 is closer to a vacuum level than that of the oxide semiconductor layer 307 is, and typically, the difference between the energy of the bottom of the conduction band in the oxide semiconductor layer 309 and the energy of the bottom of the conduction band in the oxide semiconductor layer 307 is 0.05 eV or more, 0.07 eV or more, or 0.1 eV or more, or 0.15 eV or more, and 2 eV or less, 1 eV or less, 0.5 eV or less, or 0.4 eV or less. That is, the difference between the electron affinity of the oxide semiconductor layer 309 and the electron affinity of the oxide semiconductor layer 307 is 0.05 eV or more, 0.07 eV or more, 0.1 eV or more, or 0.15 eV or more, and 2 eV or less, 1 eV or less, 0.5 eV or less, or 0.4 eV or less.

The oxide semiconductor layer 309 containing a larger amount of the element M in an atomic ratio than the amount of In in an atomic ratio may have any of the following effects: (1) the energy gap of the oxide semiconductor layer 309 is wide; (2) the electron affinity of the oxide semiconductor layer 309 is low; (3) an impurity from the outside is blocked; (4) the insulating property is more excellent than that of the oxide semiconductor layer 307. Further, oxygen vacancies are less likely to be generated in the oxide semiconductor layer 309 containing a larger amount of M in an atomic ratio than the amount of In in an atomic ratio because M is a metal element which is strongly bonded to oxygen.

When an In-M-Zn oxide is used for the oxide semiconductor layer 309, the proportions of In and M when the summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %.

In the case where each of the oxide semiconductor layer 307 and the oxide semiconductor layer 309 is In-M-Zn oxide (M is Al, Ga, Ge, Y, Zr, Sn, La, Ce, or Hf), the proportion of M atoms in the oxide semiconductor layer 309 is higher than the proportion of M atoms in the oxide semiconductor layer 307. Typically, the proportion of M atoms in the oxide semiconductor layer 309 is more than or equal to 1.5 times, preferably more than or equal to 2 times, more preferably more than or equal to 3 times as high as that in the oxide semiconductor layer 307.

In the case where the oxide semiconductor layer 309 has an atomic ratio of In to M and Zn that is and the oxide semiconductor layer 307 has an atomic ratio of In to M and Zn that is $x_2:y_2:z_2$, $y_1/x_1$ is larger than $y_2/x_2$, preferably $y_1/x_1$ is more than or equal to 1.5 times as large as $y_2/x_2$, more preferably $y_1/x_1$ is more than or equal to 2 times as large as $y_2/x_2$, still more preferably $y_1/x_1$ is more than or equal to three times as large as $y_2/x_2$. In this case, it is preferable that in the oxide semiconductor layer, $y_2$ be higher than or equal to $x_2$ because the transistor including the oxide semiconductor layer can have stable electric characteristics. However, when $y_2$ is larger than or equal to three or more times $x_2$, the field-effect mobility of the transistor including the oxide semiconductor layer is reduced. Thus, it is preferable that $y_2$ be lower than three times $x_2$.

In the case where the oxide semiconductor layer 309 is an In-M-Zn oxide, it is preferable that the atomic ratio of metal elements of a sputtering target used for forming a film of the In-M-Zn oxide satisfy M>In and Zn≥M As the atomic ratio of metal elements of such a sputtering target, In:Ga:Zn=1: 3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga: Zn=1:3:9, In:Ga:Zn=1:3:10, In:Ga:Zn=1:6:4, In:Ga:Zn=1:6: 5, In:Ga:Zn=1:6:6, In:Ga:Zn=1:6:7, In:Ga:Zn=1:6:8, In:Ga: Zn=1:6:9, and In:Ga:Zn=1:6:10 are preferable. Note that the atomic ratio of metal elements in each of the oxide semiconductor layer 307 formed using the above sputtering target and the oxide semiconductor layer 309 varies from the above atomic ratio of metal elements of the sputtering target within a range of ±20% as an error.

In the case where gallium oxide is used for the oxide semiconductor layer 309, leakage current of the transistor can be reduced. Note that, without limitation to the compositions and materials described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 307 be set to appropriate values.

The oxide semiconductor layer 309 also functions as a film that relieves damage to the oxide semiconductor layer 307 at the time of forming the insulating film 312 or 314 later. The thickness of the oxide semiconductor layer 309 is greater than or equal to 3 nm and less than or equal to 100 nm, preferably greater than or equal to 3 nm and less than or equal to 50 nm.

When silicon or carbon, which is one of Group 14 elements, is contained in the oxide semiconductor layer 307a, the amount of oxygen vacancies is increased, and the oxide semiconductor layer 307a becomes n-type. Thus, the concentration of silicon or carbon (the concentration is measured by secondary ion mass spectrometry) in the oxide semiconductor layer 307a or the concentration of silicon or carbon (the concentration is measured by secondary ion mass spectrometry) in the vicinity of the interface between the oxide semiconductor layer 309a and the oxide semiconductor layer 307a is set to be lower than or equal to $2\times10^{18}$ atoms/cm$^3$, preferably lower than or equal to $2\times10^{17}$ atoms/cm$^3$.

Furthermore, the concentration of alkali metal or alkaline earth metal of the oxide semiconductor layer 307a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor layer 307a.

When containing nitrogen, the oxide semiconductor layer 307a easily becomes n-type because of generation of electrons serving as carriers and an increase in carrier density. Thus, a transistor including an oxide semiconductor which contains nitrogen is likely to be normally on. For this reason, nitrogen in the oxide semiconductor film is preferably reduced as much as possible; the concentration of nitrogen which is measured by secondary ion mass spectrometry is preferably set to, for example, lower than or equal to $5\times10^{18}$ atoms/cm$^3$.

Note that in the transistor illustrated in FIG. 8A, the oxide semiconductor layer 309a is provided between the oxide semiconductor layer 307a and the insulating film 312. The oxide semiconductor layer 307a is positioned on the conductive film 304 side (the conductive film 304 serves as a gate electrode) and serves as a main path of carriers. Hence, if trap states are formed between the oxide semiconductor layer 309a and the insulating film 312 owing to impurities and defects, electrons flowing in the oxide semiconductor layer 307a are less likely to be captured by the trap states because there is a distance between the trap states and the oxide semiconductor layer 307a. Accordingly, the amount of on-state current of the transistor can be increased, and the field-effect mobility can be increased. When the electrons are captured by the trap states, the electrons become negative fixed charges. As a result, a threshold voltage of the transistor fluctuates. However, the distance between the oxide semiconductor layer 307a and the trap states enables reducing capture of the electrons by the trap states, and accordingly a change in the threshold voltage can be reduced.

Note that the oxide semiconductor layers 307a and 309a are not formed by simply stacking layers but are formed to have a continuous energy band (here, in particular, a structure in which energies of the bottoms of the conduction bands are changed continuously between the layers). In other words, a stacked-layer structure in which there exists no impurity which forms a defect level such as a trap center or a recombination center at each interface is provided. If an impurity exists between the stacked oxide semiconductor layers 307a and 309a, continuity of the energy band is lost, and thus carriers are trapped or disappear by recombination at the interface.

In order to form such a continuous energy band, it is necessary to form films continuously without being exposed to air, with use of a multi-chamber deposition apparatus (sputtering apparatus) including a load lock chamber. It is preferable that each chamber of the sputtering apparatus be evacuated to a high vacuum (to the degree of approximately higher than or equal to $5 \times 10^4$ Pa and lower than or equal to $1 \times 10^{-4}$ Pa) by an adsorption vacuum pump such as a cryopump so that water and the like acting as impurities of the oxide semiconductor layer are removed as much as possible. Alternatively, a turbo molecular pump and a cold trap are preferably combined so as to prevent a backflow of a gas, especially a gas containing carbon or hydrogen from an exhaust system to the inside of the chamber.

Next, a band structure of the stacked-layer structure included in the transistor illustrated in FIG. 8A is described with reference to FIG. 8B.

Figure 8B:
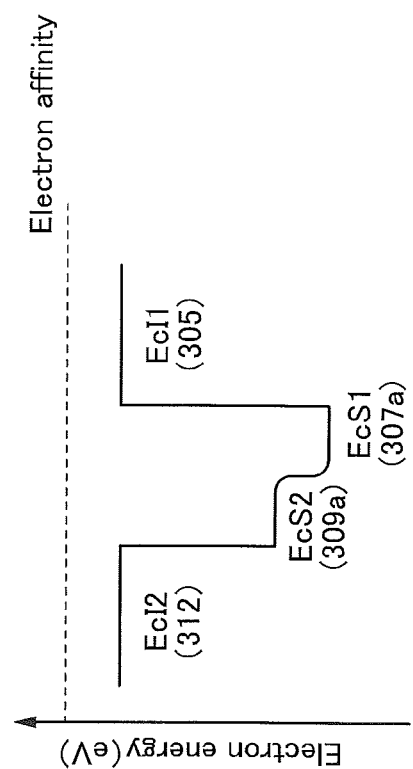

FIG. 8B schematically shows a part of the band structure included in the transistor illustrated in FIG. 8A. Here, the case where a silicon oxide layer is provided as each of the insulating film 305 and the insulating film 312 (or as a layer in contact with the oxide semiconductor layer in the case of using a stacked-layer structure for the insulating film 305 and/or the insulating film 312) is described. In FIG. 8B, EcI1 denotes the energy of the bottom of the conduction band in the silicon oxide layer used as the insulating film 305; EcS1 denotes the energy of the bottom of the conduction band in the oxide semiconductor layer 307a; EcS2 denotes the energy of the bottom of the conduction band in the oxide semiconductor layer 309a; and EcI2 denotes the energy of the bottom of the conduction band in the silicon oxide layer used as the insulating film 312.

As shown in FIG. 8B, there is no energy barrier between the oxide semiconductor layers 307a and 309a, and the energy level of the bottom of the conduction band is changed smoothly, or continuously. This is because the oxide semiconductor layers 307a and 309a contain a common element and oxygen is transferred between the oxide semiconductor layers 307a and 309a, so that a mixed layer is formed.

As shown in FIG. 8B, the oxide semiconductor layer 307a in the oxide semiconductor layer 308a serves as a well and a channel region of the transistor including the oxide semiconductor layer 308a is formed in the oxide semiconductor layer 307a. Note that since the energy of the bottom of the conduction band of the oxide semiconductor layer 308a is continuously changed, it can be said that the oxide semiconductor layers 307a and 309a are continuous.

Although trap states due to defects or impurities such as silicon or carbon, which is a constituent element of the insulating film 312, might be Ruined in the vicinity of the interface between the oxide semiconductor layer 309a and the insulating film 312 as shown in FIG. 8B, the oxide semiconductor layer 307a can be distanced from the trap states owing to existence of the oxide semiconductor layer 309a. However, in the case where an energy difference between EcS1 and EcS2 is small, electrons in the oxide semiconductor layer 307a might reach the trap state by passing over the energy gap. Since the electron is trapped at the trap level, a negative fixed charge is generated at the interface with the insulating film, causing the threshold voltage of the transistor to be shifted in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are obtained.

In the structure illustrated in FIG. 8A, one electrode of the capacitor 105 has a stacked-layer structure of the oxide semiconductor layers 307b and 309b. Hydrogen diffusion from the insulating film in contact with the oxide semiconductor layer 309b or impurity implantation and/or diffusion by plasma treatment improves the conductivity of the stacked-layer structure of the oxide semiconductor layers 307b and 309b. Thus, the oxide semiconductor layers 307b and 309b serve as the one electrode of the capacitor 105.

<Example 1 of Manufacturing Method of Touch Sensor>

An example of a method for manufacturing a touch sensor illustrated in FIG. 1A is described with reference to FIGS. 4A to 4D and FIGS. 5A and 5B.

Note that the films (i.e., the insulating film, the oxide semiconductor film, the conductive film, and the like) of the transistor and the capacitor in the touch sensor of one embodiment of the present invention can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As a thermal CVD method, a metal organic chemical vapor deposition (MOCVD) method or an atomic layer deposition (ALD) method may be used, for example.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

Figure 4A:
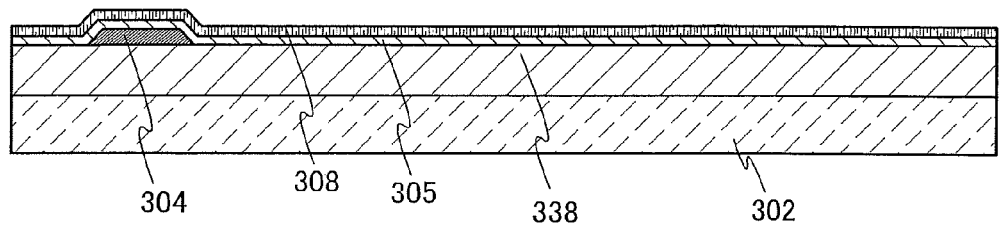
FIGS. 4A to 4D illustrate an example of a method for manufacturing a touch sensor.

First, the insulating film 338 is formed over the substrate 302, the conductive film 304 is formed over the insulating film 338, and the insulating film 305 is formed over the conductive film 304. After that, an oxide semiconductor layer 308 is formed over the insulating film 305 (FIG. 4A).

As the substrate 302, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. In particular, by forming the transistor and the capacitor with the use of a semiconductor substrate, a single crystal substrate, an SOI substrate, or the like, a transistor and a capacitor with fewer variations in characteristics, sizes, shapes, or the like, with high current supply capability, and with small sizes can be formed. By forming a circuit using such a transistor and a capacitor, power consumption of the circuit can be reduced or the circuit can be highly integrated.

Alternatively, a flexible substrate may be used as the substrate 302, and the transistor and the capacitor may be provided directly on the flexible substrate. Alternatively, a separation layer may be provided between the substrate 302, and the transistor and the capacitor. The separation layer can be used when part or the whole of a functional element such as a transistor formed over the separation layer is completed and separated from the substrate 302 and transferred to another substrate. In such a case, the transistor and the capacitor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of the substrate to which the transistor and the capacitor are transferred include, in addition to the above-described substrates over which the transistor and the capacitor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

For stable characteristics of the transistor, the insulating film 338 functioning as a base film is preferably provided. As the insulating film 338, a single layer or a stack including an inorganic insulating film such as a silicon oxide film, a silicon nitride film, a silicon oxynitride film, a silicon nitride oxide film, an aluminum oxide film, a hafnium oxide film, a gallium oxide film, or a Ga—Zn oxide film. The insulating film 338 can be formed by a sputtering method, a CVD method (e.g., a plasma CVD method, a thermal CVD method, or an MOCVD method), an ALD method, an evaporation method, a PLD method, a coating method, a printing method, or the like.

The conductive film 304 can be formed using a metal material such as molybdenum, titanium, tantalum, tungsten, aluminum, copper, chromium, neodymium, nickel, iron, cobalt, or scandium, or an alloy material containing any of these materials as a main component. Further, one or more metal elements selected from manganese and zirconium may be used. Alternatively, a semiconductor film typified by a polycrystalline silicon film doped with an impurity element such as phosphorus, or a silicide film such as a nickel silicide film may be used as the conductive film 304. The conductive film 304 has either a single-layer structure or a stacked-layer structure. The conductive film 304 may have a tapered shape with a taper angle of greater than or equal to 15° and less than or equal to 70° for example. Here, the taper angle refers to an angle formed between a side surface of a layer having a tapered shape and a bottom surface of the layer.

Note that in the case where the conductive film 304 is irradiated with external light, a film having a low reflecting property or a film that absorbs light may be provided on the light-irradiated side of the conductive film 304, in order to prevent the reflection of the external light. Note that in one embodiment of the present invention, in the case where another conductive film is irradiated with external light, a film having a low reflecting property or a film that absorbs light may be provided on the light-irradiated side of the conductive film, in order to prevent the reflection of the external light. For example, titanium nitride or tantalum nitride may be used. For example, a stacked-layer structure in which a copper film is stacked over a titanium nitride film may be used.

For example, as the conductive film 304, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film that contains aluminum and one or more elements selected from titanium, tantalum, tungsten, molybdenum, chromium, neodymium, and scandium may be used.

The conductive film 304 can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layer structure formed using the above light-transmitting conductive material and the above metal element.

Note that the conductive films 310a and 310b may be formed using such a material.

The insulating film 305 is an insulating film corresponding to the gate insulating film of the transistor 102. As the insulating film 305, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and a Ga—Zn oxide. Note that the insulating film 305 may have either a single-layer structure or a stacked-layer structure.

Note that the insulating film that is in contact with the oxide semiconductor layer 308 is preferably an oxide insulating film and preferably has a region (oxygen-excess region) containing oxygen in excess of the stoichiometric composition. In order to provide the oxygen excess region in the insulating film 305, the insulating film 305 may be formed in an oxygen atmosphere, for example. Alternatively, oxygen may be introduced into the formed insulating film 305 to provide the oxygen excess region therein. As a method for introducing oxygen, an ion implantation method, an ion doping method, a plasma immersion ion implantation method, plasma treatment, or the like may be employed.

In this embodiment, a silicon nitride layer and a silicon oxide layer over the silicon nitride layer are formed as the insulating film 305. The relative dielectric constant of the silicon nitride layer is higher than that of the silicon oxide layer, and the silicon nitride layer needs to have a larger film thickness than the silicon oxide layer to obtain a capacitance equivalent to that of the silicon oxide layer. Thus, when the silicon nitride layer is included in the insulating film 305 serving as the gate insulating film of the transistor 102, the physical thickness of the insulating film can be increased. This makes it possible to reduce a decrease in withstand voltage of the transistor 102 and furthermore to increase the withstand voltage, thereby reducing electrostatic discharge damage to the transistor 102.

The oxide semiconductor layer 308 preferably includes a film represented by an In-M-Zn oxide that contains at least indium (In), zinc (Zn), and M (metal such as Al, Ga, Ge, Y, Zr, Sn, La, Ce, or Hf). Alternatively, both In and Zn are preferably contained. In order to reduce fluctuations in electrical characteristics of the transistors including the oxide semiconductor, the oxide semiconductor preferably contains a stabilizers in addition to In and Zn.

As for stabilizers, gallium (Ga), tin (Sn), hafnium (Hf), aluminum (Al), and zirconium (Zr) can be given as examples. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in the oxide semiconductor layer 308, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

The oxide semiconductor layer 308 can be formed by a sputtering method, a molecular beam epitaxy (MBE) method, a CVD method, a PLD method, an ALD method, or the like as appropriate.

In forming the oxide semiconductor layer 308, the concentration of hydrogen to be contained is preferably as low as possible. In order to reduce the hydrogen concentration, besides the high vacuum evacuation of a deposition chamber, high purity of a sputtering gas is also needed when film formation is performed by a sputtering method, for example. As an oxygen gas or an argon gas used for a sputtering gas, a gas which is highly purified to have a dew point of −40° C. or lower, preferably −80° C. or lower, further preferably −100° C. or lower, further preferably −120° C. or lower is used, whereby entry of moisture or the like into the oxide semiconductor layer 308 can be prevented as much as possible.

In order to remove moisture remaining in the deposition chamber, an entrapment vacuum pump, such as a cryopump, an ion pump, or a titanium sublimation pump, is preferably used. A turbo molecular pump provided with a cold trap may be alternatively used. When the deposition chamber is evacuated with a cryopump, which has a high capability in removing a hydrogen molecule, a compound including a hydrogen atom such as water ($H_2O$), a compound including a carbon atom, and the like, the concentration of an impurity to be contained in a film formed in the deposition chamber can be reduced.

In the case where the oxide semiconductor layer 308 is formed by a sputtering method, the relative density (fill rate) of a metal oxide target that is used for the deposition is greater than or equal to 90% and less than or equal to 100%, preferably greater than or equal to 95% and less than or equal to 100%. With the use of the metal oxide target having high relative density, a dense oxide film can be formed.

Note that formation of the oxide semiconductor layer 308 while the substrate 302 is maintained at a high temperature is also effective in reducing the impurity concentration in the oxide semiconductor layer 308. The heating temperature of the substrate 302 is higher than or equal to 150° C. and lower than or equal to 450° C., and preferably the substrate temperature is higher than or equal to 200° C. and lower than or equal to 350° C.

Figure 4B:
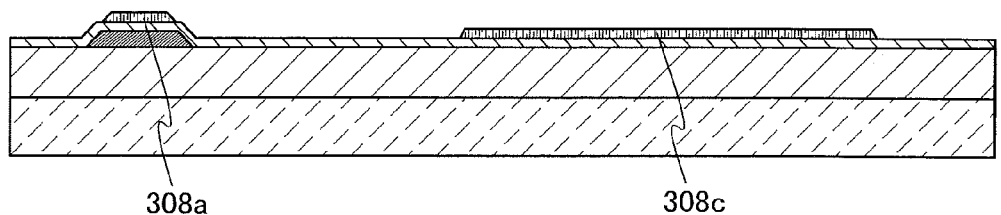

Next, the oxide semiconductor layer 308 is processed into desired shapes, so that the island-shaped oxide semiconductor layers 308a and 308c are formed (FIG. 4B).

The oxide semiconductor layer 308c, which becomes the oxide conductor layer 308b later, and the oxide semiconductor layer 308a are formed by processing the oxide semiconductor layer 308; therefore, they contain at least the same metal elements. When the oxide semiconductor layer 308 is processed by etching, part of the insulating film 305 (a region not covered with the oxide semiconductor layer 308a and the oxide semiconductor layer 308c) might be etched to be thinned because of overetching of the oxide semiconductor layer 308.

After the island-shaped oxide semiconductor layers 308a and 308c are formed, heat treatment is performed. The heat treatment is preferably performed at a temperature of higher than or equal to 250° C. and lower than or equal to 650° C., preferably higher than or equal to 300° C. and lower than or equal to 400° C., more preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By the heat treatment, an impurity such as hydrogen or water can be removed from at least one of the insulating film 305 and the oxide semiconductor layers 308a and 308c. Note that the heat treatment may be performed before the oxide semiconductor layer 308 is processed into an island shape.

In order to obtain stable electrical characteristics of the transistor 102 whose channel is formed using an oxide semiconductor, it is effective to reduce the impurity concentration in the oxide semiconductor so that the oxide semiconductor becomes intrinsic or substantially intrinsic.

Figure 4C:
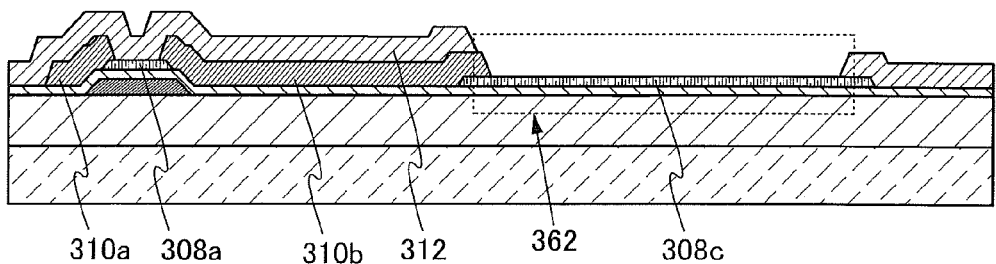

Next, the conductive films 310a and 310b and the insulating film 312 are formed over the insulating film 305 and the oxide semiconductor layers 308a and 308c (FIG. 4C). An opening portion 362 is formed in the insulating film 312 so as to expose the oxide semiconductor layer 308c.

The conductive films 310a and 310b can each be formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive films 310a and 310b can be formed by a sputtering method, for example.

For the insulating film 312, a silicon oxide film, a silicon oxynitride film, an aluminum oxide film, or the like having a thickness in the range from 150 nm to 400 nm can be used, for example. In this embodiment, a 300-nm-thick silicon oxynitride film is used as the insulating film 312. The insulating film 312 can be formed by a PECVD method, for example.

An example of a formation method of the opening portion 362 includes, but is not limited to, a dry etching method. Alternatively, a wet etching method or a combination of dry etching and wet etching can be employed for formation of the opening portion 362. An etching step for forming the opening portion 362 reduces the thickness of the oxide semiconductor layer 308c in some cases.

Note that oxygen vacancies are faulted in the oxide semiconductor layers 308a and 308c in the step of etching the conductive films 310a and 310b and the insulating film 312, for example, in some cases. Therefore, heat treatment is preferably performed after the etching step or the like. In the case where an insulating film that can release oxygen is used as the insulating film 312, part of oxygen contained in the insulating film 312 can be transferred to the oxide semiconductor layer 308a by the heat treatment, so that oxygen vacancies in the oxide semiconductor layer 308a can be reduced. Consequently, oxygen vacancies in the oxide semiconductor layer 308a can be reduced, while oxygen vacancies in the oxide semiconductor layer 308c that is not in contact with the insulating film 312 are not reduced. Thus, the amount of oxygen vacancies in the oxide semiconductor layer 308c is larger than that of oxygen vacancies in the oxide semiconductor layer 308a. The heat treatment can be performed under conditions similar to those for the heat treatment performed after the formation of the oxide semiconductor layers 308a and 308c.

Figure 4D:
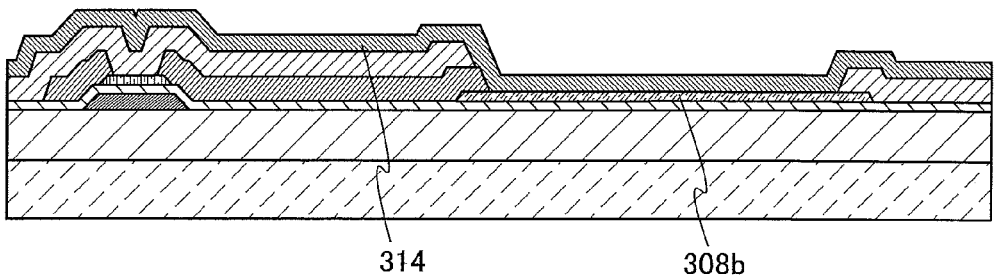

Next, the insulating film 314 is formed over the insulating film 312 and the oxide semiconductor layer 308c so as to cover the opening portion 362. Forming the insulating film 314 changes the oxide semiconductor layer 308c into the oxide conductor layer 308b (FIG. 4D).

When the insulating film 314 is formed, hydrogen is contained therein. When hydrogen in the insulating film 314 is diffused to the oxide semiconductor layer 308c, hydrogen is bonded to oxygen vacancies in the oxide semiconductor layer 308c and electrons serving as carriers are generated. As a result, the oxide semiconductor layer 308c has a reduced resistivity to form the oxide conductor layer 308b.

The resistivity of the oxide conductor layer 308b is lower than at least the resistivity of the oxide semiconductor layer 308a and is preferably higher than or equal to 1 Ωcm and lower than $1\times10^4$ Ωcm, more preferably higher than or equal to $1\times10^{-3}$ Ωcm and lower than $1\times10^{-1}$ Ωcm. Note that the insulating film 314 also has an advantageous effect of preventing an external impurity such as water, alkali metal, or alkaline earth metal, from diffusing into the oxide semiconductor layer 308a included in the transistor 102.

For example, the insulating film 314 can be formed using a silicon nitride film, a silicon nitride oxide film, or the like having a thickness in the range from 50 nm to 400 nm. In this embodiment, the insulating film 314 is formed using a silicon nitride film having a thickness of 100 nm.

The silicon nitride film is preferably, formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor layer 308a and the carrier density is increased is caused in some cases; therefore, the upper limit of the temperature is a temperature at which the phenomenon is not caused.

Figure 5A:
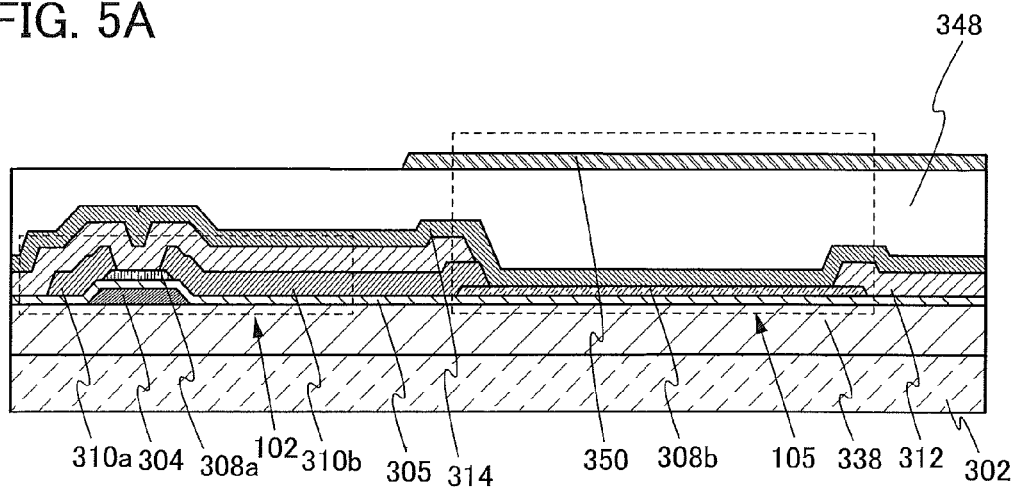
FIGS. 5A and 5B illustrate an example of the method for manufacturing a touch sensor.

Next, the insulating film 348 is formed over the insulating film 314, and the conductive film 350 is fouled over the insulating film 348 (FIG. 5A).

A material similar to those of other insulating films can be used for the insulating film 348.

The conductive film 350 can be formed using a light-transmitting conductive material such as indium oxide, indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, zinc oxide to which gallium is added, or graphene. The conductive film 350 can be formed by a sputtering method, for example. Alternatively, the above-described oxide semiconductor which can be used for the semiconductor layer of the transistor may be used.

Through the above steps, the transistor 102 and the capacitor 105 can be formed over the same substrate.

Figure 5B:
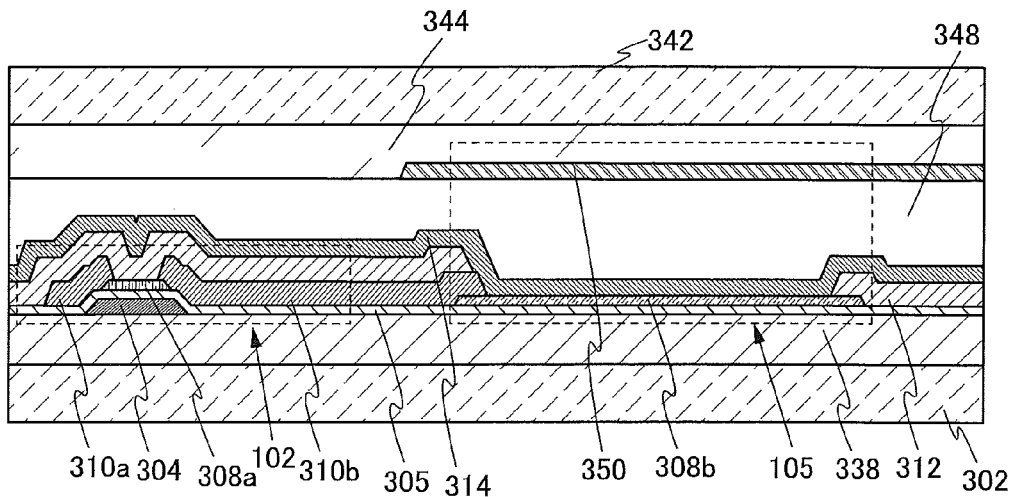

After that, a substrate 342 may be bonded onto the insulating film 348 and the conductive film 350 with a bonding layer 344 (FIG. 5B).

A material similar to that of the substrate 302 can be used for the substrate 342.

Any of a variety of curable adhesives, e.g., light curable adhesives such as a UV curable adhesive, a reactive curable adhesive, a thermal curable adhesive, and an anaerobic adhesive can be used for the bonding layer 344. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

<Example 2 of Manufacturing Method of Touch Sensor>

An example of a method for manufacturing the transistor 104 illustrated in FIG. 3A is described with reference to FIGS. 6A to 6H and FIGS. 7A to 7G. Note that the above description is referred to for description similar to that of Example 1 of manufacturing method of touch sensor, and details thereof are omitted.

Figure 6A:
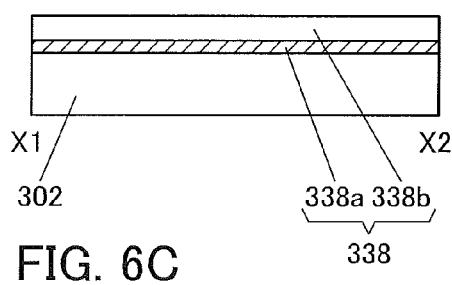
FIGS. 6A to 6H illustrate an example of a method for manufacturing a touch sensor.

First, the insulating film 338 (an insulating film 338a and an insulating film 338b) is formed over the substrate 302 (FIG. 6A).

Note that an oxide insulating film is preferably used for at least a region of the insulating film 338, which is in contact with the oxide semiconductor layer 308a, in order to improve characteristics of the interface with the oxide semiconductor layer 308a. When the insulating film 338 is formed using an oxide insulating film from which oxygen is released by heating, oxygen contained in the insulating film 338 can be moved to the oxide semiconductor layer 308a by heat treatment.

The thickness of the insulating film 338 can be greater than or equal to 50 nm, greater than or equal to 100 nm and less than or equal to 3000 nm, or greater than or equal to 200 nm and less than or equal to 1000 nm With use of the thick insulating film 338, the amount of oxygen released from the insulating film 338 can be increased, and the interface state at the interface between the insulating film 338 and the oxide semiconductor layer 308a and oxygen vacancy included in the channel region 332a of the oxide semiconductor layer 308a can be reduced.

After the insulating film 338b is formed, oxygen may be added to the insulating film 338b. Examples of the oxygen that is added to the insulating film 338b include an oxygen radical, an oxygen atom, an oxygen atomic ion, an oxygen molecular ion, and the like. As a method for adding the oxygen, an ion doping method, an ion implantation method, plasma treatment, or the like can be given. Alternatively, after a film that suppresses release of oxygen is formed over the insulating film, oxygen may be added to the insulating film 338b through the film.

Alternatively, as the insulating film 338b, a silicon oxide film or a silicon oxynitride film that can release oxygen by heat treatment can be formed under the following conditions: the substrate placed in a treatment chamber of a PECVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Here, a method in which a film that suppresses release of oxygen is formed over the insulating film 338b and then oxygen is added to the insulating film 338b through the film is described.

Figure 6B:
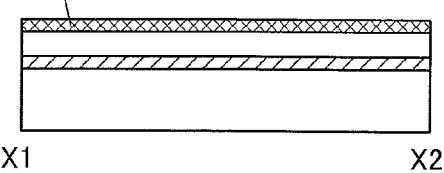

A film 141 that suppresses release of oxygen is formed over the insulating film 338b (FIG. 6B).

Figure 6C:
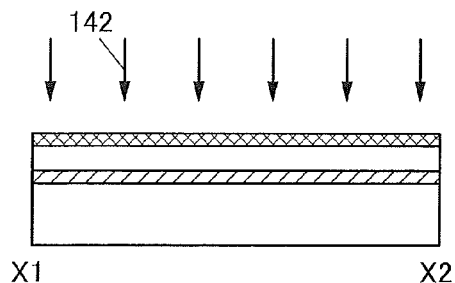

Next, oxygen 142 is added to the insulating film 338b through the film 141 (FIG. 6C).

The film 141 that suppresses release of oxygen is formed using any of the following conductive materials: a metal element selected from aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 141 that suppresses release of oxygen can be greater than or equal to 1 nm and less than or equal to 20 nm, or greater than or equal to 2 nm and less than or equal to 10 nm.

As a method for adding the oxygen 142 to the insulating film 338b through the film 141, an ion doping method, an ion implantation method, plasma treatment, or the like is given. By adding oxygen to the insulating film 338b with the film 141 provided over the insulating film 338b, the film 141 functions as a protective film that suppresses release of oxygen from the insulating film 338b. Thus, more oxygen can be added to the insulating film 338b.

In the case where oxygen is added by plasma treatment, by making oxygen excited by a microwave to generate high density oxygen plasma, the amount of oxygen added to the insulating film 338b can be increased.

Figure 6D:
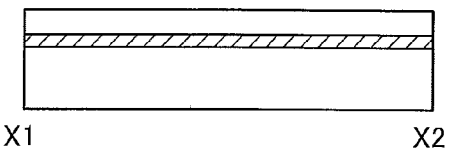

Then, the film 141 is removed (FIG. 6D).

Note that the treatment for adding oxygen which is illustrated in FIGS. 6B and 6C is not necessarily performed in the case where the insulating film 338b to which a sufficient amount of oxygen is added can be formed after its deposition.

Figure 6E:
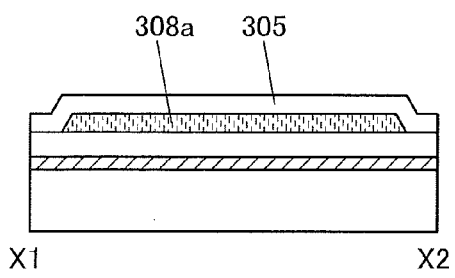

Next, an oxide semiconductor film is formed over the insulating film 338, and the oxide semiconductor film is processed into a desired shape, so that the island-shaped oxide semiconductor layer 308a is formed. After that, the insulating film 305 is formed over the insulating film 338 and the oxide semiconductor layer 308a (FIG. 6E).

A formation method of the oxide semiconductor layer 308a is described below. An oxide semiconductor film is formed over the insulating film 338b by a sputtering method, a coating method, a PLD method, a laser ablation method, a thermal CVD method, or the like. Then, after a mask is formed over the oxide semiconductor film by lithography, the oxide semiconductor film is partly etched using the mask. Thus, the oxide semiconductor layer 308a illustrated in FIG. 6E can be formed. After that, the mask is removed. Note that heat treatment may be performed after the oxide semiconductor layer 308a is formed.

Alternatively, by using a printing method for forming the oxide semiconductor layer 308a, the oxide semiconductor layer 308a subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

In the case where the oxide semiconductor film is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

Furthermore, in the case where the oxide semiconductor film is formed by a sputtering method, a sputtering target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, or 100 vol. %.

Further, after the oxide semiconductor film is formed, heat treatment may be performed so that the oxide semiconductor film is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film which is measured by SIMS can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

For example, in the case where an oxide semiconductor film, e.g., an InGaZnO$_x$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn(CH$_3$)$_2$ gas may be used.

Note that in this embodiment, the oxide semiconductor layer 308a is formed as follows. A 50-nm-thick oxide semiconductor film is deposited using a sputtering apparatus and using an In—Ga—Zn metal oxide (In:Ga:Zn=1:1:1.2 [atomic ratio]) as a sputtering target, and then, heat treatment is performed, whereby oxygen contained in the insulating film 338b is moved to the oxide semiconductor film Next, a mask is formed over the oxide semiconductor film, and part of the oxide semiconductor film is selectively etched. In this manner, the oxide semiconductor layer 308a is formed.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC which is to be described later is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

The insulating film 305 can be formed using a single layer or a stack of an oxide insulating film or a nitride insulating film Note that in order to improve the characteristics of the interface with the oxide semiconductor layer 308a, a region of the insulating film 305 which is in contact with at least the oxide semiconductor layer 308a preferably includes an oxide insulating film.

Further, it is possible to prevent outward diffusion of oxygen from the oxide semiconductor layer 308a and entry of hydrogen, water, or the like into the oxide semiconductor layer 308a from the outside by providing an insulating film having a blocking effect against oxygen, hydrogen, water, and the like as the insulating film 305. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating film 305 may be formed using a high-k material such as hafnium silicate ($HfSiO_x$), hafnium silicate to which nitrogen is added ($HfSi_xO_yN_z$) hafnium aluminate to which nitrogen is added ($HfAl_xO_yN_z$), hafnium oxide, or yttrium oxide, so that gate leakage current of the transistors can be reduced.

When the insulating film 305 is formed using an oxide insulating film from which oxygen is released by heating, oxygen contained in the insulating film 305 can be moved to the oxide semiconductor layer 308a by heat treatment.

The thickness of the insulating film 305 can be greater than or equal to 5 nm and less than or equal to 400 nm, greater than or equal to 5 nm and less than or equal to 300 nm, or greater than or equal to 10 nm and less than or equal to 250 nm.

The insulating film 305 can be formed by the formation method of the insulating film 338b as appropriate. As the insulating film 305, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The silicon oxynitride film having a small amount of defects can be formed as the insulating film 305 by a PECVD method under the conditions where the ratio of an oxidizing gas to a deposition gas is higher than 20 times and lower than 100 times or higher than or equal to 40 times and lower than or equal to 80 times and the pressure in a treatment chamber is lower than 100 Pa or lower than or equal to 50 Pa.

A silicon oxide film or a silicon oxynitride film which is dense can be formed as the insulating film 305 under the following conditions: the substrate placed in a treatment chamber of a PECVD apparatus that is vacuum-evacuated is held at a temperature higher than or equal to 280° C. and lower than or equal to 400° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 305 can be formed by a plasma CVD method using a microwave. The microwave refers to a wave in the frequency range of 300 MHz to 300 GHz. In a microwave, electron temperature is low and electron energy is low. Further, in supplied power, the proportion of power used for acceleration of electrons is low, and therefore, much more power can be used for dissociation and ionization of molecules. Thus, plasma with high density (high-density plasma) can be excited. Therefore, a deposition surface and a deposit are less damaged by plasma, and the insulating film 305 with few defects can be formed.

Alternatively, the insulating film 305 can be formed by a CVD method using an organosilane gas. As the organosilane gas, any of the following silicon-containing compound can be used: tetraethyl orthosilicate (IEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. By a CVD method using the organosilane gas, the insulating film 305 having high coverage can be formed.

In the case where a gallium oxide film is formed as the insulating film 305, an MOCVD method can be used.

In the case where a hafnium oxide film is formed as the insulating film 305 by a thermal CVD method such as an MOCVD method or an ALD method, two kinds of gases, i.e., ozone ($O_3$) as an oxidizer and a source material gas which is obtained by vaporizing a liquid containing a solvent and a hafnium precursor compound (e.g., a hafnium alkoxide or a hafnium amide such as tetrakis(dimethylamide) hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the insulating film 305 by a thermal CVD method such as an MOCVD method or an ALD method, two kinds of gases, e.g., $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Note that the ALD method enables the insulating film 305 to have excellent coverage and small thickness.

Furthermore, in the case where a silicon oxide film is formed as the insulating film 305 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Here, a 100-nm-thick silicon oxynitride film is formed using a PECVD apparatus as the insulating film 305.

Figure 6F:
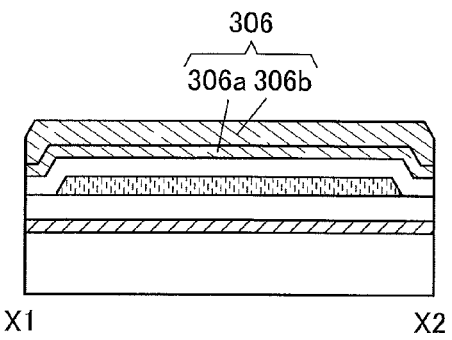

Next, a conductive film 306 (a conductive film 306a and a conductive film 306b) is formed over the insulating film 305 (FIG. 6F).

The conductive film 306 can be formed by a sputtering method, a vacuum vapor deposition method, a PLD method, a thermal CVD method, or the like. In this embodiment, a 10-nm-thick tantalum nitride film is formed using a sputtering apparatus as the conductive film 306a. Furthermore, a 300-nm-thick copper film is formed using a sputtering apparatus as the conductive film 306b. Note that the successive formation of the conductive film 306a and the conductive film 306b in a vacuum is preferable because entry of impurities into an interface between the conductive film 303a and the conductive film 303b can be suppressed.

Alternatively, a tungsten film can be formed as the conductive film 306b with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 6G:
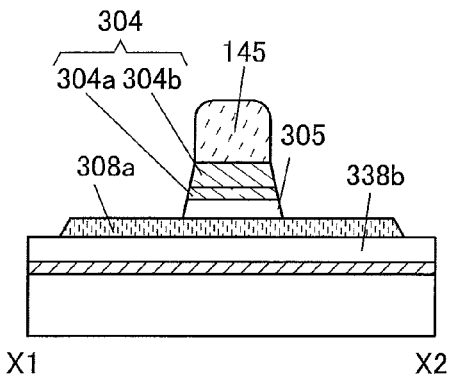

Next, a mask 145 is formed over the conductive film 306b by a lithography step, and then, the conductive film 306b, the conductive film 306a, and the insulating film 305 are partly etched, so that conductive films 304a and 304b are formed (FIG. 6G).

As a method for etching the conductive film 306 and the insulating film 305, a wet etching method or/and a dry etching method can be used as appropriate.

Figure 6H:
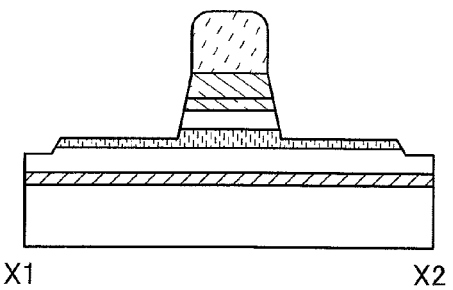

In a step of etching the conductive film 306 and the insulating film 305, part of the oxide semiconductor layer 308a is exposed. Note that as illustrated in FIG. 6H, by the step of etching the conductive film 304 and the insulating film 305, the oxide semiconductor layer 308a in a region including the exposed part has a smaller thickness than the oxide semiconductor layer 308a in a region overlapping with the conductive film 304, in some cases. Furthermore, as illustrated in FIG. 6H, by the step of etching the conductive film 306 and the insulating film 305, the insulating film 338b functioning as a base film in a region that is not covered with the oxide semiconductor layer 308a is removed partly and thus has a smaller thickness than the insulating film 338b in a region overlapping with the oxide semiconductor layer 308a.

Next, an impurity element 143 is added over the insulating film 338b, the insulating film 305, the oxide semiconductor layer 308a, the conductive film 304, and the mask 145 (FIG. 7A).

In a step of adding the impurity element 143, the impurity element is added to regions of the oxide semiconductor layer 308a which are not covered with the conductive film 304, the insulating film 305, and the mask 145. Note that an oxygen vacancy is formed in the oxide semiconductor layer 308a by the addition of the impurity element 143.

As a method for adding the impurity element 143, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, an ashing apparatus, a plasma CVD apparatus, a high-density plasma CVD apparatus, or the like can be used to generate the plasma.

Note that, as a source gas of the impurity element 143, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 143 to the oxide semiconductor layer 308a using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the oxide semiconductor layer 308a.

Alternatively, after a rare gas is added to the oxide semiconductor layer 308a, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor layer 308a.

Further alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor layer 308a, a rare gas may be added to the oxide semiconductor layer 308a.

The addition of the impurity element 143 is controlled by appropriately setting the implantation conditions such as the acceleration voltage and the dose. For example, in the case where argon is added by an ion implantation method, the acceleration voltage is set to 10 kV and the dose is set to greater than or equal to $1 \times 10^{13}$ ions/cm$^2$ and less than or equal to $1 \times 10^{16}$ ions/cm$^2$, e.g., $1 \times 10^{14}$ ions/cm$^2$. In the case where a phosphorus ion is added by an ion implantation method, the acceleration voltage is set to 30 kV and the dose is set to greater than or equal to $1 \times 10^{13}$ ions/cm$^2$ and less than or equal to $5 \times 10^{16}$ ions/cm$^2$, e.g., $1 \times 10^{15}$ ions/cm$^2$.

In the case where argon is added as the impurity element 143 using a dry etching apparatus, the substrate may be set to a parallel plate on the cathode side and an RF power may be supplied so that a bias is applied to the substrate side. As the RF power, for example, power density can be greater than or equal to 0.1 W/cm$^2$ and less than or equal to 2 W/cm$^2$.

It is preferable that the impurity element 143 be added in a state where the mask 145 is left as in this embodiment. By the addition of the impurity element 143 in a state where the mask 145 is left, adhesion of a constituent element of the conductive film 304 to a sidewall of the insulating film 305 can be suppressed. However, a method for adding the impurity element 143 is not limited thereto; for example, the impurity element 143 may be added using the conductive film 304 and the insulating film 305 as masks after the mask 145 is removed.

After that, heat treatment may be performed to further increase the conductivity of the region to which the impurity element 143 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Next, the mask 145 is removed (FIG. 7B).

Next, an insulating film 312a is formed over the insulating film 338b, the oxide semiconductor layer 308a, and the conductive film 304, and an insulating film 312b is formed over the insulating film 312a (FIG. 7C).

The insulating film 312a and the insulating film 312b can be formed using the formation methods of the insulating film 338a and the insulating film 338b as appropriate.

In this embodiment, a 100-nm-thick silicon nitride film is formed using a PECVD apparatus as the insulating film 312a. Furthermore, a 300-nm-thick silicon oxynitride film is formed using a PECVD apparatus as the insulating film 312b.

When the insulating film 312a is formed of a silicon nitride film, hydrogen in the silicon nitride film enters the oxide semiconductor layer 308a, so that the carrier density in a region of the oxide semiconductor layer 308a in contact with the insulating film 312a can be further increased.

Next, a mask is formed over the insulating film 312b by a lithography step, and then, the insulating film 312a and the insulating film 312b are partly etched, whereby the opening portion 140a and the opening portion 140b that reach the oxide semiconductor layer 308a is formed (FIG. 7D).

Next, a conductive film 311 (a conductive film 311a and a conductive film 311b) is formed over the insulating film 312b to cover the opening portion 140a and the opening portion 140b (FIG. 7E).

The conductive film 311 can be formed by the formation method of the conductive film 306 as appropriate. Here, a 50-nm-thick tungsten film is formed using a sputtering apparatus as the conductive film 311a. Furthermore, a 200-nm-thick copper film is formed using a sputtering apparatus as the conductive film 311b.

Next, a mask is formed over the conductive film 311b by a lithography step, and then, the conductive film 311a and the conductive film 311b are partly etched, whereby the conductive film 310a and the conductive film 310b are formed (FIG. 7F).

Note that the conductive film 310a has a stacked-layer structure of a conductive film 310a1 and a conductive film 310a2 over the conductive film 310a1. Furthermore, the conductive film 310b has a stacked-layer structure of a conductive film 310b1 and a conductive film 310b2 over the conductive film 310b1.

Next, the insulating film 314 is formed over the insulating film 312b, the conductive film 310a, and the conductive film 310b (FIG. 7G).

The insulating film 314 can be fox by the formation method of the insulating film 338a as appropriate. Here, a 200-nm-thick silicon nitride film is formed using a PECVD apparatus as the insulating film 314.

Through the above-described steps, the transistor 104 can be manufactured.

Note that in the case of forming the transistor 106, the insulating film 338 is formed over the substrate 302. Next, a conductive film is formed over the insulating film 338, and the conductive film is processed into a desired shape, whereby the conductive film 303 is formed. Next, steps similar to the steps shown in FIGS. 6A to 6F are performed (the insulating film 338 formed in FIG. 6A corresponds to the insulating film 301 in the transistor 106). After that, a mask is formed over the insulating film 305 by a lithography step, and then, the insulating film 305 is partly etched, whereby the opening portion 139 that reaches the conductive film 303 is formed. Steps following this can be performed in manners similar to those of the steps illustrated in FIG. 6G and subsequent figures. Thus, the transistor 106 can be manufactured.

As described above, the touch sensor of one embodiment of the present invention includes the transistor and the capacitor, and the semiconductor layer of the transistor and the one electrode of the capacitor can be formed in the same step. Therefore, an active matrix touch sensor can be manufactured in a small number of steps. Furthermore, a touch sensor that can be used in a large-sized touch panel can be provided.

This embodiment can be combined with any other embodiment as appropriate.

(Embodiment 2)

In this embodiment, a touch panel of one embodiment of the present invention will be described.

The touch panel of one embodiment of the present invention includes an active matrix touch sensor and a display element between a pair of substrates. The touch sensor is a capacitive type touch sensor, for example.

In a touch panel including a sensor portion and a display portion that overlap with each other, a parasitic capacitance is formed in some cases between a wiring or an electrode included in a capacitive type touch sensor and a wiring or an electrode included in the display portion. The parasitic capacitance might reduce the change in capacitance at the time when a finger or the like gets closer, and the detection sensitivity of the touch sensor might decrease. Furthermore, noise caused by operating the display element travels to the touch sensor side through the parasitic capacitance and the detection sensitivity of the touch sensor might decrease.

By sufficiently increasing the distance between the sensor portion and the display portion, the adverse effect of the parasitic capacitance and the noise can be avoided and the decrease in the detection sensitivity of the touch sensor can be suppressed; however, the thickness of the whole touch panel is increased in some cases.

In one embodiment of the present invention, an active matrix touch sensor is provided. The touch sensor includes a transistor and a capacitor. The transistor and the capacitor are electrically connected to each other.

In the active matrix touch sensor of one embodiment of the present invention, an electrode of a capacitor and a read wiring can be formed in different layers. When the read wiring has a narrow width, a parasitic capacitance can be small. Accordingly, a decrease in the detection sensitivity of the touch sensor can be suppressed.

Incidentally, the formation of the parasitic capacitance might decrease the amplitude of a detection signal and decrease detection sensitivity. In one embodiment of the present invention, a detection signal is amplified and the amplified signal is output; thus, the adverse effect of the parasitic capacitance can be suppressed.

An active matrix touch sensor is used in the touch panel of one embodiment of the present invention, whereby the distance between the sensor portion and the display portion can be reduced in the touch panel, and the touch panel can have a small thickness. Furthermore, the touch sensor and the display element can be located between two substrates, whereby the touch panel can have a small thickness. Here, using the touch sensor of one embodiment of the present invention can suppress a decrease in the detection sensitivity of the touch sensor even when the distance between the sensor portion and the display portion is reduced. Therefore, in one embodiment of the present invention, both thickness reduction and high detection sensitivity of a touch sensor or a touch panel can be achieved. Furthermore, by using a flexible material for the pair of substrates of the touch panel, the touch panel can have flexibility. Furthermore, in one embodiment of the present invention, a touch panel with high resistance to repeated bending can be provided. Furthermore, a large-sized touch panel can be provided.

The touch sensor included in the touch panel of one embodiment of the present invention may include the oxide conductor layer as the electrode of the capacitor as described in detail in Embodiment 1. In the active matrix touch sensor, a semiconductor layer and a conductive film of the transistor and the electrode of the capacitor are preferably formed in the same step. Thus, the number of steps of manufacturing the touch panel can be reduced and the cost of manufacturing the touch panel can be reduced.

Note that because the oxide conductor layer is used as the electrode of the capacitor in the touch panel of one embodiment of the present invention, viewing angle dependence is smaller than that of a touch panel using another material as the electrode of the capacitor in some cases. Furthermore, because the oxide conductor layer is used as the electrode of the capacitor in the touch panel of one embodiment of the present invention, an NTSC ratio can be higher than that of a touch panel using another material as the electrode of the capacitor.

Specifically, one embodiment of the present invention is a touch panel including a touch sensor, a light-blocking layer, and a display element between a pair of electrodes. In the touch panel, the light-blocking layer is located between the touch sensor and the display element, the light-blocking layer includes a portion overlapping with a transistor included in the touch sensor, and the display element includes a portion overlapping with a capacitor included in the touch sensor.

The display element can be, but is not particularly limited to, an organic EL element. Therefore, in the above structure, a first electrode, a second electrode, and a layer including a light-emitting organic compound may be included in the display element; an insulating film covering an end portion of the first electrode may be included; the layer including a light-emitting organic compound may be located between the first electrode and the second electrode; and the insulating film may include a portion overlapping with the transistor included in the touch sensor.

<Structure Example of Touch Panel>

FIGS. 9A to 9C are projection views illustrating components of a touch panel of one embodiment of the present invention. FIG. 9A is a projection view of a touch panel 500 of one embodiment of the present invention, and FIG. 9B is a projection view illustrating a structure of a sensor unit 10U included in the touch panel 500.

The touch panel 500 shown in FIG. 9A includes an input device 100 and a display portion 501.

The input device 100 has flexibility. The input device 100 includes a scan line G1, a signal line DL, a first base material 16, and a plurality of sensor units 10U. The sensor unit 10U shown in FIG. 9B is provided with window portions 14 that transmit visible light. The sensor units 10U are arranged in matrix. The scan line G1 is electrically connected to a plurality of sensor units 10U located in the row direction (indicated by the arrow R in the drawing). The signal line DL is electrically connected to a plurality of sensor units 10U located in the column direction (indicated by the arrow C in the drawing). The first base material 16 has flexibility. The first base material 16 supports the sensor unit 10U, the scan line G1, and the signal line DL.

The display portion 501 includes a second base material 510 and a plurality of pixels 502. The plurality of pixels 502 overlap with the window portion 14 and are arranged in matrix. The second base material 510 has flexibility. The second base material 510 supports the plurality of pixels 502 (FIG. 9C).

The sensor unit 10U includes a sensor element C1 overlapping with the window portion 14 and a sensor circuit 19 electrically connected to the sensor element C1 (FIG. 9B).

For example, the capacitor 105 described in Embodiment 1 can be used as the sensor element C1. The conductive film 350 and the oxide conductor layer 308b that are the pair of electrodes included in the capacitor 105 are shown in FIG. 9B.

A selection signal is supplied to the sensor circuit 19, and the sensor circuit 19 supplies a sensor signal DATA based on the change in the capacitance of the sensor element C1 or a parasitic capacitance of the sensor element C1.

The scan line G1 can supply the selection signal. The signal line DL can supply the sensor signal DATA. The sensor circuit 19 is located to overlap with gaps between the plurality of window portions 14.

In addition, the touch panel 500 described in this embodiment includes a coloring layer between the sensor unit 10U and the pixel 502 overlapping with the window portion 14 of the sensor unit 10U.

The touch panel 500 described in this embodiment includes the flexible input device 100 including the plurality of sensor units 10U, each of which is provided with the window portions 14 transmitting visible light, and the flexible display portion 501 including the plurality of pixels 502 overlapping with the window portions 14. The coloring layer is included between the window portion 14 and the pixel 502.

With such a structure, the touch panel can supply a sensor signal based on the change in the capacitance or the parasitic capacitance and positional information of the sensor unit supplying the sensor signal, can display image data relating to the positional information of the sensor unit, and can be bent. As a result, a novel touch panel with high convenience or high reliability can be provided.

The touch panel 500 may include a flexible substrate FPC1 to which a signal from the input device 100 is supplied and/or a flexible substrate FPC2 supplying a signal including image data to the display portion 501.

In addition, a protective layer 17p protecting the touch panel 500 by preventing damage and/or an anti-reflective layer 567p that weakens the intensity of external light reflected by the touch panel 500 may be included.

Moreover, the touch panel 500 includes a scan line driver circuit 503g which supplies the selection signal to a scan line of the display portion 501, a wiring 511 supplying a signal, and a terminal 519 electrically connected to the flexible substrate FPC2.

Components of the touch panel 500 are described below. Note that these components cannot be clearly distinguished and one component also serves as another component or includes part of another component in some cases.

For example, the input device 100 including the coloring layer overlapping with the plurality of window portions 14 also serves as a color filter.

Furthermore, for example, the touch panel 500 in which the input device 100 overlaps the display portion 501 serves as the input device 100 as well as the display portion 501.

The input device 100 includes the plurality of sensor units 10U and the flexible base material 16 supporting the sensor units. For example, the plurality of sensor units 10U is arranged in matrix with 40 rows and 15 columns on the flexible base material 16.

Specifically, the sensor units 10U each of which is 7.668 mm wide and 5.112 mm long can be arranged in matrix with 40 rows and 15 columns in a rectangular region that is 115.02 mm wide and 204.48 mm long.

The window portion 14 transmits visible light.

For example, the window portion 14 may be formed as follows: the base material 16, the sensor element C1, and a flexible protective base material 17 each formed using a material transmitting visible light or a material thin enough to transmit visible light overlap with each other so that transmission of visible light is not prevented.

For example, an opening portion may be provided in a material that does not transmit visible light. Specifically, one opening portion or a plurality of opening portions having any of a variety of shapes such as a rectangle may be provided.

A coloring layer that transmits light of a predetermined color is provided to overlap with the window portion 14. For example, a coloring layer CFB transmitting blue light, a coloring layer CFG transmitting green light, and a coloring layer CFR transmitting red light are included (FIG. 9B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a resin material, a pigment, dye, or the like can be used.

A light-blocking layer BM is provided to surround the window portions 14. The light-blocking layer BM does not easily transmit light as compared to the window portion 14. Note that in an example illustrated in this specification and the like, a black matrix is used as the light-blocking layer, and the letter symbol BM is used to denote the light-blocking layer.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 19 are provided to overlap with the light-blocking layer BM.

Note that a light-transmitting overcoat covering the coloring layer and the light-blocking layer BM can be provided.

As the flexible base material 16 and the base material 510, an organic material, an inorganic material, or a composite material of an organic material and an inorganic material can be used.

For the base material 16 and the base material 510, a material with a thickness of 5 μm or more and 2500 μm or less, preferably 5 μm or more and 680 μm or less, further preferably 5 μm or more and 170 μm or less, further preferably 5 μm or more and 45 μm or less, further preferably 8 μm or more and 25 μm or less can be used.

A material with which unintended passage of impurities is inhibited can be favorably used for the base material 16 and the base material 510. For example, a material with a vapor permeability of lower than or equal to 10-5 g/(m²·day), preferably lower than or equal to $10^{-6}$ g/(m²·day) can be favorably used.

The base material 510 can be favorably formed using a material whose coefficient of linear expansion is substantially equal to that of the base material 16. For example, the base material 510 and the base material 16 can each be formed using a material whose coefficient of linear expansion is preferably lower than or equal to $1\times10^{-3}$/K, further preferably lower than or equal to $5\times10^{-5}$/K, and still further preferably lower than or equal to $1\times10^{-5}$/K.

Examples of the base material 16 and the base material 510 are organic materials such as a resin, a resin film, and a plastic film.

Examples of the base material 16 and the base material 510 are inorganic materials such as a metal plate and a thin glass plate with a thickness of more than or equal to 10 μm and less than or equal to 50 μm.

An example of the base material 16 and the base material 510 is a composite material in which a metal plate, a thin glass plate, or a film of an inorganic material is bonded to a resin film or the like with a resin layer.

An example of the base material 16 and the base material 510 is a composite material in which a fibrous or particulate metal, glass, or an inorganic material is dispersed into resin or a resin film.

The resin layer can be formed using a thermosetting resin or an ultraviolet curable resin.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, a silicon oxide film, a silicon nitride film, a silicon oxynitride film, an alumina film, or the like can be used.

Specifically, SUS, aluminum, or the like in which an opening portion is provided can be used.

Specifically, an acrylic resin, a urethane resin, an epoxy resin, or a resin having a siloxane bond can be used.

For example, a stack in which a flexible substrate 392a, an insulating film 338a that prevents diffusion of impurities, and a bonding layer 394a with which the flexible substrate 392a and the insulating film 338a are bonded to each other are stacked can be preferably used for the base material 16 (see FIG. 12A).

For example, a stack in which a flexible substrate 392b, an insulating film 338b that prevents diffusion of impurities, and a bonding layer 394b with which the flexible substrate 392b and the insulating film 338b are bonded together are stacked can be preferably used for the base material 510 (see FIG. 12A).

Specifically, a stacked-layer structure of a 600-nm-thick silicon oxynitride film and a 200-nm-thick silicon nitride film can be used as the insulating film 338a.

Alternatively, a stacked-layer structure of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the insulating film 338a.

A resin film or resin plate of polyester, polyolefin, polyamide, polyimide, polycarbonate, an acrylic resin, or the like, a stack of two or more of the above materials, or the like can be used for the flexible substrate 392a.

For example, a material that includes polyester, polyolefin, polyamide (e.g., nylon, aramid), polyimide, polycarbonate, or a resin having an acrylic bond, a urethane bond, an epoxy bond, or a siloxane bond can be used for the bonding layer 394a.

A flexible protective base material 17 and/or the protective layer 17p can be provided. The flexible protective base material 17 or the protective layer 17p protects the input device 100 by preventing damage.

For example, a resin film or resin plate of polyester, polyolefin, polyamide, polyimide, polycarbonate, an acrylic resin, or the like, a stack of two or more of the above materials, or the like can be used for the protective base material 17.

For example, a hard coat layer or a ceramic coat layer can be used as the protective layer 17p. Specifically, a layer containing a UV curable resin or aluminum oxide may be formed to overlap with the second electrode.

The display portion 501 includes a plurality of pixels 502 arranged in matrix (FIG. 9C). For example, the pixel 502 includes a sub-pixel 502B, a sub-pixel 502G, and a sub-pixel 502R, and each sub-pixel includes a display element and a pixel circuit for driving the display element.

In a rectangular region that is 115.02 mm wide and 198.72 mm long, 1080 pixels in the horizontal direction and 1920 pixels in the vertical direction, each of which includes three sub-pixels (each sub-pixel is 35.5 μm wide and 106.5 μm long) may be arranged in matrix. Note that the rectangular region may be 9.2 inches diagonal, and the aperture ratio of the pixel may be 56.0%.

Note that in the pixel 502, the sub-pixel 502B is located to overlap with the coloring layer CFB, the sub-pixel 502G is located to overlap with the coloring layer CFG, and the sub-pixel 502R is located to overlap with the coloring layer CFR.

In this embodiment, an example of using an organic EL element that emits white light as a display element will be described; however, the display element is not limited to such an element.

For example, organic EL elements that emit light of different colors may be included in sub-pixels so that the light of different colors can be emitted from the respective sub-pixels.

Other than organic EL elements, any of various display elements such as display elements (electronic ink) that perform display by an electrophoretic method, an electronic liquid powder (registered trademark) method, an electrowetting method, or the like; MEMS shutter display elements; optical interference type MEMS display elements; and liquid crystal elements can be used.

Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. A structure suitable for employed display elements can be selected from among a variety of structures of pixel circuits.

In the display portion, an active matrix method in which an active element (a non-linear element) is included in a pixel or a passive matrix method in which an active element is not included in a pixel can be used.

In the active matrix method, as an active element, not only a transistor but also a variety of active elements can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

Since an active element is not used in the passive matrix method, the number of manufacturing steps is small, so that manufacturing cost can be reduced or yield can be improved. Furthermore, since an active element is not used, the aperture ratio can be improved, so that power consumption can be reduced or higher luminance can be achieved, for example.

The display portion 501 may include the anti-reflective layer 567p positioned in a region overlapping with pixels. As the anti-reflective layer 567p, a circular polarizing plate can be used, for example.

The display portion 501 includes the wiring 511 through which a signal can be supplied. The wiring 511 is provided with the terminal 519. Note that the flexible substrate FPC2 through which a signal such as an image signal or a synchronization signal can be supplied is electrically connected to the terminal 519.

Note that a printed wiring board (PWB) may be attached to the flexible substrate FPC2.

<<Sensor Element C1>>

An example of the sensor element C1 is described using the capacitor 105 illustrated in FIG. 1A. The capacitor 105 includes the oxide conductor layer 308b and the conductive film 350 as the pair of electrodes. The capacitor 105 includes the insulating films 314 and 348 as the dielectric layer.

The oxide conductor layer 308b is formed apart from other regions, for example, is formed into an island shape. A layer that can be formed in the same process as that of the oxide conductor layer 308b is preferably located close to the oxide conductor layer 308b so that the user of the touch panel 500 does not recognize the oxide conductor layer 308b. Further preferably, the number of the window portions 14 located in the gap between the oxide conductor layer 308b and the layer located close to the oxide conductor layer 308b is reduced as much as possible. In particular, the window portion 14 is preferably not located in the gap.

The conductive film 350 is provided to overlap with the oxide conductor layer 308b, and the dielectric layer (here, the insulating films 314 and 348) is provided between the oxide conductor layer 308b and the conductive film 350.

For example, when an object whose dielectric constant is different from that of the air gets closer to one of the pair of electrodes of the sensor element C1 in the air, a capacitance is formed, and the formed capacitance is parasitic in a circuit. Specifically, when a finger or the like gets closer to one electrode of the sensor element C1, a capacitance is formed between the one electrode and the finger or the like. Then, the formed capacitance is parasitic in a circuit that is electrically connected to the sensor element C1, and the operation of the sensor circuit is changed. Accordingly, the sensor element C1 can be used in a proximity sensor.

In one embodiment of the present invention, the sensor element C1 is not limited to the capacitor 105 described in Embodiment 1.

For example, the capacitance of the sensor element C1 that can be changed in shape is changed depending on the change in shape.

Specifically, when a finger or the like is in contact with the sensor element C1, and the gap between the pair of electrodes becomes small, the capacitance of the sensor element C1 is increased. Accordingly, the sensor element C1 can be used in a tactile sensor. As a result, for example, writing pressure can be sensed.

Specifically, when the sensor element C1 is bent, and the gap between the pair of electrodes becomes small, the capacitance of the sensor element C1 is increased. Accordingly, the sensor element C1 can be used in a bend sensor.

The pair of electrodes include a conductive material.

For example, an inorganic conductive material, an organic conductive material, a metal material, a conductive ceramic material, or the like can be used for each of the pair of electrodes.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used.

Alternatively, a conductive oxide such as indium oxide, indium tin oxide, indium zinc oxide, zinc oxide, zinc oxide to which gallium is added, or the like can be used.

Alternatively, graphene or graphite can be used. The film including graphene can be formed, for example, by reducing a film containing graphene oxide. As a reducing method, a method with application of heat, a method using a reducing agent, or the like can be employed.

Alternatively, a conductive polymer can be used. Note that the structure and the formation method of the oxide conductor layer which are given in Embodiment 1 can be referred to.

<<Sensor Unit 10U and Converter CONV>>

FIGS. 10A, 10B1, 10B2, and 10C illustrate a configuration and a driving method of the sensor unit 10U and a converter CONV of one embodiment of the present invention.

Figure 11A:
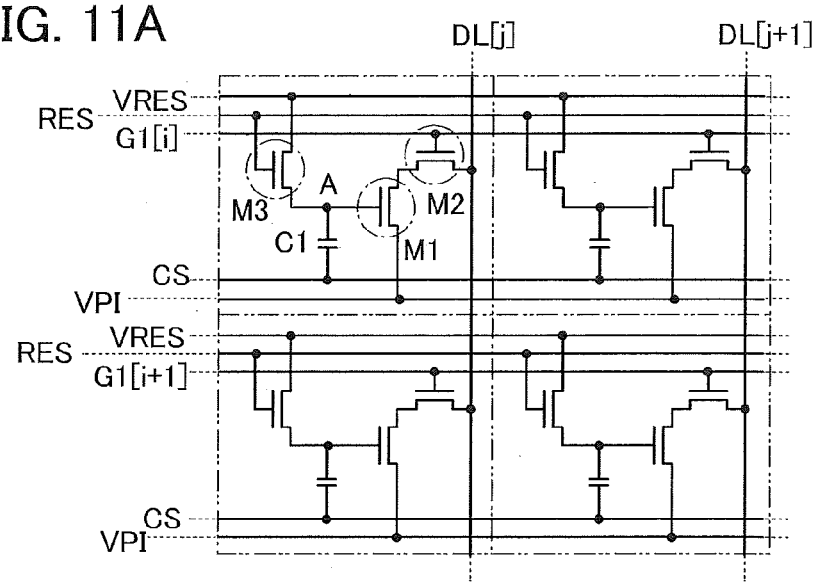
FIGS. 11A to 11C illustrate an example of a sensor circuit.

FIG. 10A is a circuit diagram illustrating configurations of the sensor unit 10U and the converter CONV of one embodiment of the present invention, and FIGS. 10B1 and 10B2 are timing charts illustrating a driving method. FIG. 10C shows converters CONV in a matrix that are different from the converter CONV shown in FIG. 10A. FIG. 11A shows sensor units 10U in a matrix.

The sensor unit 10U includes first to third transistors M1 to M3, for example (FIG. 10A and FIG. 11A). In addition, the sensor unit 10U includes wirings that supply a power supply potential and a signal. For example, the signal line DL, the wiring VPI, a wiring CS, the scan line G1, the wiring RES, the wiring VRES, the signal line DL, and the like are included.

Note that the sensor circuit 19 may be located not to overlap with the window portion 14. For example, a wiring is located not to overlap with the window portion 14, whereby one side of the sensor unit 10U can be visually recognized easily from the other side of the sensor unit 10U.

Furthermore, the first to third transistors M1 to M3 each include a semiconductor layer. For example, for the semiconductor layer, an element belonging to Group 4, a compound semiconductor, or an oxide semiconductor can be used. Specifically, a semiconductor containing silicon, a semiconductor containing gallium arsenide, an oxide semiconductor containing indium, or the like can be used.

Transistors that can be formed in the same process can be used as the first to third transistors M1 to M3.

Any one of the first to third transistors M1 to M3 preferably includes an oxide semiconductor layer. At this time, the oxide semiconductor layer and the oxide conductor layer are preferably located over the same surface. The off-state current of a transistor including an oxide semiconductor layer is small; therefore, it is particularly preferable that the first transistor M1 include the oxide semiconductor layer.

For the wiring, a conductive material can be used.

For example, an inorganic conductive material, an organic conductive material, a metal material, a conductive ceramic material, or the like can be used for the wiring. Specifically, a material that is the same as those of the pair of electrodes of the capacitor can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 19 may be formed over the base material 16 by processing a film formed over the base material 16.

Alternatively, the sensor circuit 19 formed over another base material may be transferred to the base material 16.

Various circuits that can convert the sensor signal DATA supplied from the sensor unit 10U and supply the converted signal to the FPC1 can be used as a converter CONV (FIG. 9A). For example, a transistor M4 shown can be used in the converter CONV. Furthermore, as shown in FIG. 10C, the transistor M4 and a transistor M5 can be used in the converter CONV.

The sensor circuit 19 of one embodiment of the present invention includes the first transistor M1 whose gate is electrically connected to one electrode (here, the oxide conductor layer 308b) of the sensor element C1 and whose first electrode is electrically connected to the wiring VPI (FIG. 10A). The wiring VPI can supply, for example, a ground potential.

Furthermore, the second transistor M2 whose gate is electrically connected to the scan line G1, whose first electrode is electrically connected to a second electrode of the first transistor M1, and whose second electrode is electrically connected to the signal line DL may be included. The scan line G1 can supply a selection signal. The signal line DL can supply, for example, the sensor signal DATA.

Furthermore, the third transistor M3 whose gate is electrically connected to the wiring RES, whose first electrode is electrically connected to the one electrode (here, the oxide conductor layer 308b) of the sensor element C1, and whose second electrode is electrically connected to the wiring VRES may be included. The wiring RES can supply a reset signal. The wiring VRES can supply, for example, a potential at which the first transistor M1 can be turned on.

The capacitance of the sensor element C1 is changed when an object gets closer to the oxide conductor layer 308b or the conductive film 350 or when a gap between the oxide conductor layer 308b and the conductive film 350 is changed, for example. Thus, the sensor unit 10U can supply the sensor signal DATA based on the change in the capacitance of the sensor element C1 or a parasitic capacitance of the sensor element C1.

Furthermore, the sensor unit 10U includes the wiring CS that can supply a control signal for controlling the potential of the other electrode (here, the conductive film 350) of the sensor element C1. Note that the conductive film 350 may serve as the wiring CS of the sensor circuit.

Note that a node at which the one electrode (here, the oxide conductor layer 308b) of the sensor element C1, the gate of the first transistor M1, and the first electrode of the third transistor M3 are electrically connected to each other is referred to as a node A.

The wiring VRES can supply a predetermined potential. For example, a potential at which a transistor provided in the sensor unit 10U is turned on can be supplied to a gate of the transistor. The wiring VPI can supply a ground potential, for example, and the wiring VPO and the wiring BR each can supply a high power supply potential, for example. Furthermore, the wiring RES can supply the reset signal, and the scan line G1 can supply the selection signal. Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 19.

Specifically, by using the converter CONV including the transistor M4, a source follower circuit can be formed (FIG. 10A). Furthermore, as shown in FIG. 10C, the converter CONV may include the transistors M4 and M5. Note that transistors that can be formed in the same process as those of the first transistor M1 to the third transistor M3 may be used as the transistors M4 and M5.

Figure 11B:
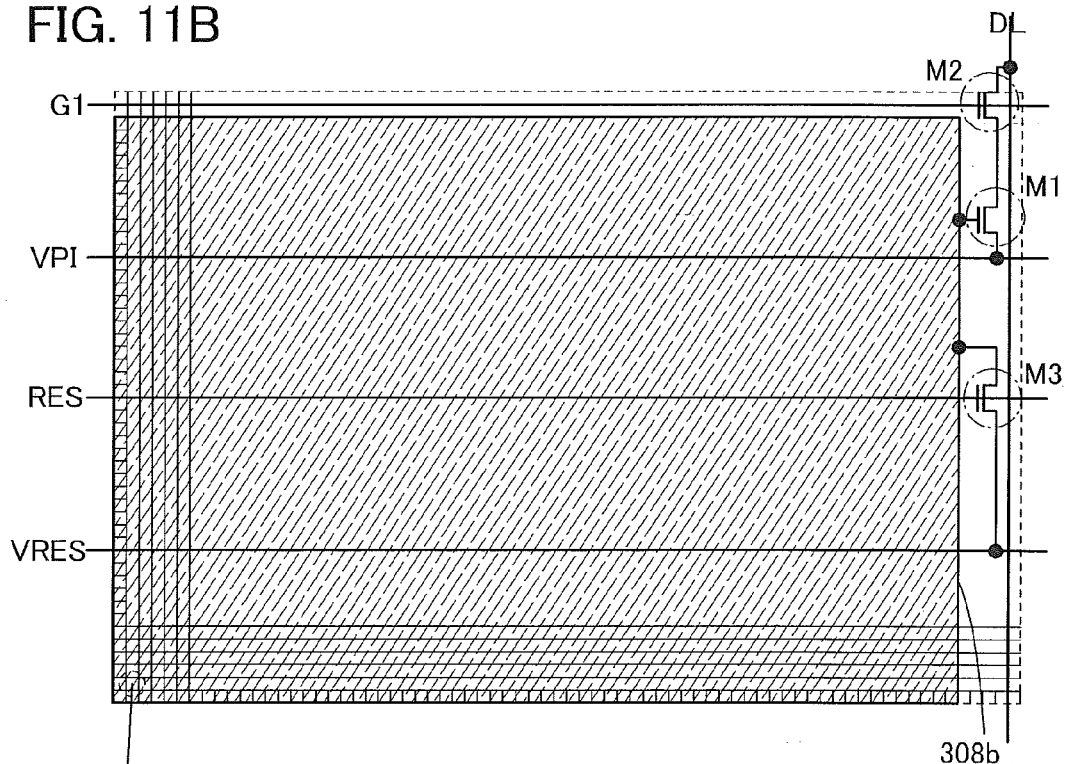
Figure 11C:
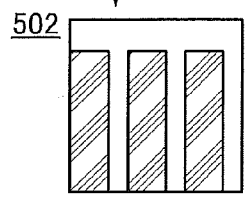

As described above, in the active matrix touch sensor of one embodiment of the present invention, the electrode of the sensor element and the read wiring can be formed in different layers. As shown in FIG. 11B, the oxide conductor layer 308b that is the one electrode of the capacitor and the signal line DL are formed in different layers, and the width of the signal line DL is made narrow. Thus, the parasitic capacitance can be small. Accordingly, a decrease in the detection sensitivity of the touch sensor can be suppressed. Note that the oxide conductor layer 308b overlaps with the plurality of pixels 502 shown in FIG. 11C that is an enlarged view of FIG. 11B.

<Driving Method of Sensor Circuit 19>

A driving method of the sensor circuit 19 is described.

<<First Step>>

In a first step, a reset signal that turns on and then turns off the third transistor M3 is supplied to the gate, and the potential of the one electrode (here, the oxide conductor layer 308b) of the sensor element C1 is set to a predetermined potential (see a period T1 in FIG. 10B1).

Specifically, the reset signal is supplied from the wiring RES. The third transistor M3 to which the reset signal is supplied sets the potential of the node A to a potential at which the first transistor M1 is turned on, for example (FIG. 10A).

<<Second Step>>

In a second step, a selection signal that turns on the second transistor M2 is supplied to the gate of the second transistor M2, and the second electrode of the first transistor M1 is electrically connected to the signal line DL.

Specifically, the selection signal is supplied from the scan line G1. Through the second transistor M2 to which the selection signal is supplied, the second electrode of the first transistor M1 is electrically connected to the signal line DL (see a period T2 in FIG. 10B1).

<<Third Step>>

In a third step, a control signal is supplied to the other electrode (here, the conductive film 350) of the sensor element C1, and a potential changed based on the control signal and the capacitance of the sensor element C1 is supplied to the gate of the first transistor M1.

Specifically, a rectangular wave control signal is supplied from the wiring CS. By supplying the rectangular wave control signal to the conductive film 350 of the sensor element C1, the potential of the node A is increased based on the capacitance of the sensor element C (see the latter half in the period T2 in FIG. 10B1).

For example, in the case where the sensor element is put in the air, when an object whose dielectric constant is higher than that of the air is located closer to the conductive film 350 of the sensor element C1, the capacitance of the sensor element C1 is apparently increased.

Thus, the change in the potential of the node A due to the rectangular wave control signal becomes smaller than that in the case where an object whose dielectric constant is higher than that of the air is not located closer (see a solid line in FIG. 10B2).

<<Fourth Step>>

In a fourth step, a signal obtained by the change in the potential of the gate of the first transistor M1 is supplied to the signal line DL.

For example, current that changes on the basis of the change in the potential of the gate of the first transistor M1 is supplied to the signal line DL.

The converter CONV converts the change in the current flowing through the signal line DL into a change in voltage and outputs the voltage.

<<Fifth Step>>

In a fifth step, a selection signal for turning off the second transistor M2 is supplied to the gate of the second transistor M2.

<Cross-Sectional Structure Example 1 of Touch Panel>

FIG. 12A is a cross-sectional schematic view of a touch panel of one embodiment of the present invention. In the touch panel illustrated in FIG. 12A, an active matrix touch sensor and an active matrix display element are provided between a pair of substrates, and thus, the touch sensor can have a small thickness.

The touch panel includes the flexible substrate 392b, the bonding layer 394b, the insulating film 338b, the transistor 102, the transistor 103, a contact portion 108, a capacitor portion 109, a conductive film 346b, an insulating film 348b, a conductive film 360, an insulating film 371, a light-emitting element 107, an insulating film 373, a spacer 375, and the like. The light-emitting element 107 includes a lower electrode 361, an optical adjustment layer 363, an EL layer 365, and an upper electrode 367 (FIG. 12B).

The flexible substrate 392b and the insulating film 338b are bonded to each other with the bonding layer 394b. The transistor 103, the transistor 102, the contact portion 108, the capacitor portion 109, and the like are provided over the insulating film 338b. A source electrode or a drain electrode of the transistor 103, the conductive film 360, and the lower electrode 361 of the light-emitting element 107 are electrically connected to each other.

In FIG. 12A, the transistors 103 are used as a transistor included in a driver circuit portion and as the transistor in which the source electrode or the drain electrode is connected to the lower electrode 361 of the light-emitting element 107. Furthermore, the transistor 102 is used as a transistor included in a pixel portion. As compared with the transistor 102, the transistor 103 can have a high field-effect mobility and thus have high on-state current. As a result, a driver circuit portion that can operate at high speed can be formed. Furthermore, a touch sensor including a driver circuit portion occupying a small area can be formed. Using the transistor 103 with high on-state current in the pixel portion can suppress signal delay in wirings and display unevenness even when the number of wirings is increased in a large-sized display panel, a large-sized touch panel, a high-resolution display panel, or a high-resolution touch panel. Note that the transistor included in the driver circuit portion and the transistor included in the pixel portion may have the same structure. All of a plurality of transistors included in the driver circuit portion may have the same structure, or the plurality of transistors included in the driver circuit portion may have two or more kinds of structures. All of a plurality of transistors included in the pixel portion may have the same structure, or the plurality of transistors included in the pixel portion may have two or more kinds of structures. A transistor including one gate electrode may be used in the driver circuit portion. Structures of a transistor in the active matrix touch sensor and a transistor in the active matrix display element may be the same as or different from each other, or the structures of the transistors may be partly the same.

The light-emitting element 107 has a top-emission structure and emits light to the upper electrode 367 side. When the transistor 103, the transistor 102, the contact portion 108, the capacitor portion 109, and the like are provided to overlap with a light-emitting region of the light-emitting element 107, the aperture ratio of the pixel can be increased.

The touch panel further includes the flexible substrate 392a, the bonding layer 394a, the insulating film 338a, the capacitor 105, a conductive film 346a, an insulating film 348a, the coloring layer CFR, the light-blocking layer BM, the bonding layer 396, and the like. The capacitor 105 includes the oxide conductor layer 308b and the conductive film 350 as a pair of electrodes.

The flexible substrate 392a and the insulating film 338a are bonded to each other with the bonding layer 394a. The transistor 103, the transistor 102, the capacitor 105, and the like are provided on the insulating film 338a. In the touch panel of one embodiment of the present invention, as described in Embodiment 1, the oxide semiconductor layer of the transistor and the one electrode of the capacitor (the oxide conductor layer or the oxide semiconductor layer having conductivity) are provided over the same surface.

In the touch panel of one embodiment of the present invention, the light-blocking layer is located between the touch sensor and the display element (the light-emitting element), the light-blocking layer includes a portion overlapping with the transistor, and the display element (the light-emitting element) includes a portion overlapping with the capacitor. In the example illustrated in FIG. 12A, the capacitor 105 and the light-emitting element 107 overlap with each other and the light-blocking layer BM overlaps with the transistor 103 and the transistor 102.

In the touch panel of one embodiment of the present invention, the insulating film 373 covering an end portion of the lower electrode 361 of the light-emitting element 107 may have a portion overlapping with the transistor. In the example illustrated in FIG. 12A, the insulating film 373 overlaps with the transistor 103 and the transistor 102.

The touch panel of one embodiment of the present invention preferably has flexibility. In the example illustrated in FIG. 12A, the flexible substrates 392a and 392b are used; however, one embodiment of the present invention is not limited thereto. The substrate that is presented in Embodiment 1 and the like as an example can be used, and a substrate without flexibility may be used.

FIG. 13A is a cross-sectional schematic view including three pixels in the touch panel of one embodiment of the present invention in FIGS. 12A and 12B. A color filter method is employed in the touch panel of one embodiment of the present invention. The touch panel of one embodiment of the present invention can have a structure in which pixels of three colors of, for example, red (R), green (G), and blue (B) express one color, a structure in which pixels of four colors of red (R), green (G), blue (B), and white (W) express one color, a structure in which pixels of four colors of red (R), green (G), blue (B), and yellow (Y) express one color, or the like. There is no particular limitation on the color element and colors other than R, G, B, W, and Y may be used. For example, cyan, magenta, and the like may be used.

Owing to the combination of the coloring layers CFR, CFG, and CFB and a microcavity structure (the optical adjustment layer 363), light with high color purity can be extracted from the touch panel of one embodiment of the present invention. The thickness of the optical adjustment layer 363 may be varied depending on the color of the pixel. Note that in the example, the light-blocking layer BM is provided between the coloring layers CFR and CFG and between the coloring layers CFG and CFB, the light-blocking layer BM is not necessarily provided between the coloring layers CFR and CFG and between the coloring layers CFG and CFB.

As illustrated in FIG. 13B, the EL layers 365 emitting different light may be separately provided so that pixels have different EL layers 365. Furthermore, the spacer 375 may be omitted. Furthermore, the conductive film 360 and the insulating film 371 are not necessarily provided; the lower electrode 361 may be directly connected to the source electrode or the drain electrode of the transistor.

As illustrated in FIG. 13C, the touch panel does not necessarily include a transistor electrically connected to the light-emitting element. A conductive film 857a and a conductive film 857b, which are external connection electrodes, can be electrically connected to an FPC or the like. A conductive film 814 is preferably, though not necessarily, provided because voltage drop due to the resistance of the lower electrode 361 can be inhibited. In addition, for a similar purpose, a conductive film electrically connected to the upper electrode 367 may be provided over the insulating film 371, the EL layer 365, the upper electrode 367, or the like.

<Cross-Sectional Structure Example 2 of Touch Panel>

Figure 14:
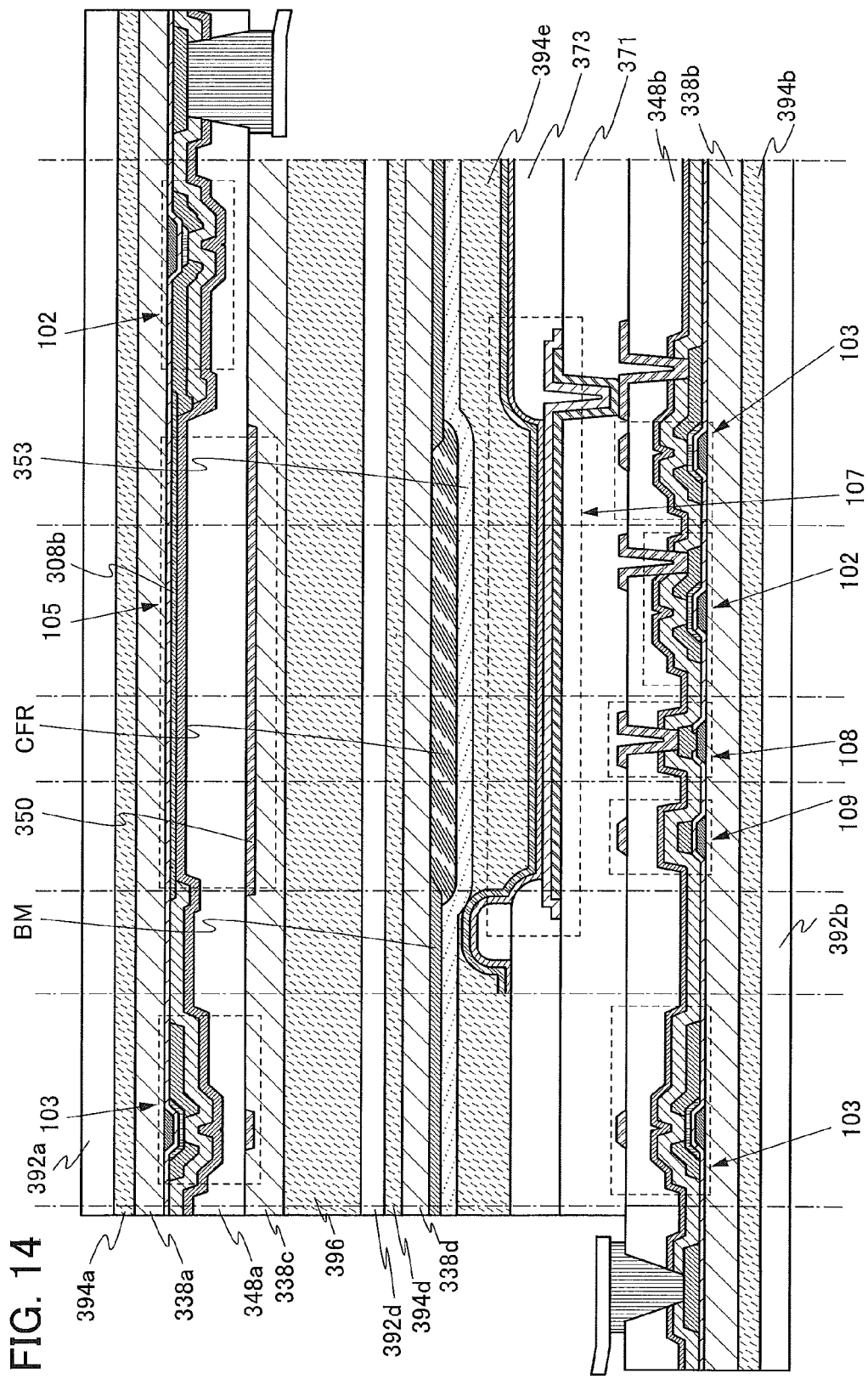
FIG. 14 illustrates an example of a touch panel.

FIG. 14 is a cross-sectional schematic view of a touch panel of one embodiment of the present invention.

The touch panel illustrated in FIG. 14 differs from the touch panel in the structure example 1; three flexible substrates are used in the touch panel illustrated in FIG. 14. Specifically, the touch sensor and the display panel are bonded to each other with the bonding layer 396. The touch sensor includes the transistor 102, the transistor 103, and the capacitor 105 over the flexible substrate 392a. The display panel includes the transistor 102, the transistor 103, the light-emitting element 107, the coloring layer CFR, the light-blocking layer BM, and the like between a pair of flexible substrates 392b and 392d.

Figure 15:
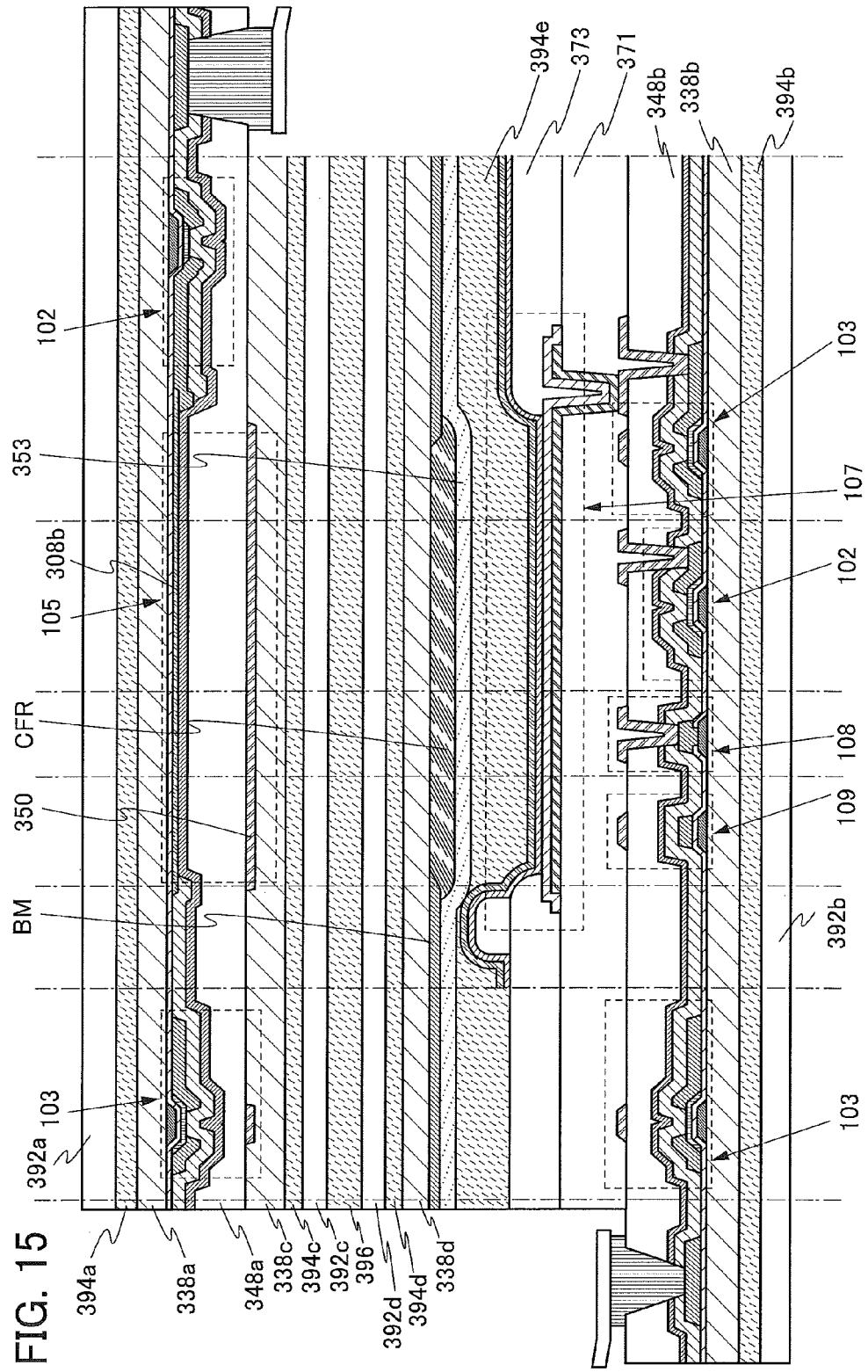
FIG. 15 illustrates an example of a touch panel.

FIG. 15 is a cross-sectional schematic view of a touch panel of one embodiment of the present invention.

The touch panel illustrated in FIG. 15 differs from the structure example 1 of touch panel; four flexible substrates are used in the touch panel illustrated in FIG. 15. Specifically, a touch sensor and a display panel are bonded to each other with the bonding layer 396. The touch sensor includes the transistor 102, the transistor 103, and the capacitor 105 between a pair of flexible substrates 392a and 392c. The display panel includes the transistor 102, the transistor 103, the light-emitting element 107, the coloring layer CFR, the light-blocking layer BM, and the like between the pair of flexible substrates 392b and 392d.

The structure illustrated in FIG. 12A is preferable because the number of substrates and the number of bonding layers are smaller than those in the structures illustrated in FIG. 14 and FIG. 15 and the thickness of the touch panel can be reduced accordingly. Here, in one embodiment of the present invention, a decrease in the detection sensitivity of the touch sensor can be suppressed even when the distance between the sensor portion and the display portion is reduced. Therefore, in one embodiment of the present invention, both thickness reduction and high detection sensitivity of a touch sensor or a touch panel can be achieved. Furthermore, according to one embodiment of the present invention, a touch panel having flexibility can be provided. Note that in the case where there is no limitation on the thickness and flexibility of a touch panel, a structure like that illustrated in FIG. 14 or FIG. 15 can be employed to increase the distance between the sensor portion and the display portion, so that a decrease in the detection sensitivity of the touch sensor can be suppressed.

<Cross-Sectional Structure Example 3 of Touch Panel>

Figure 16:
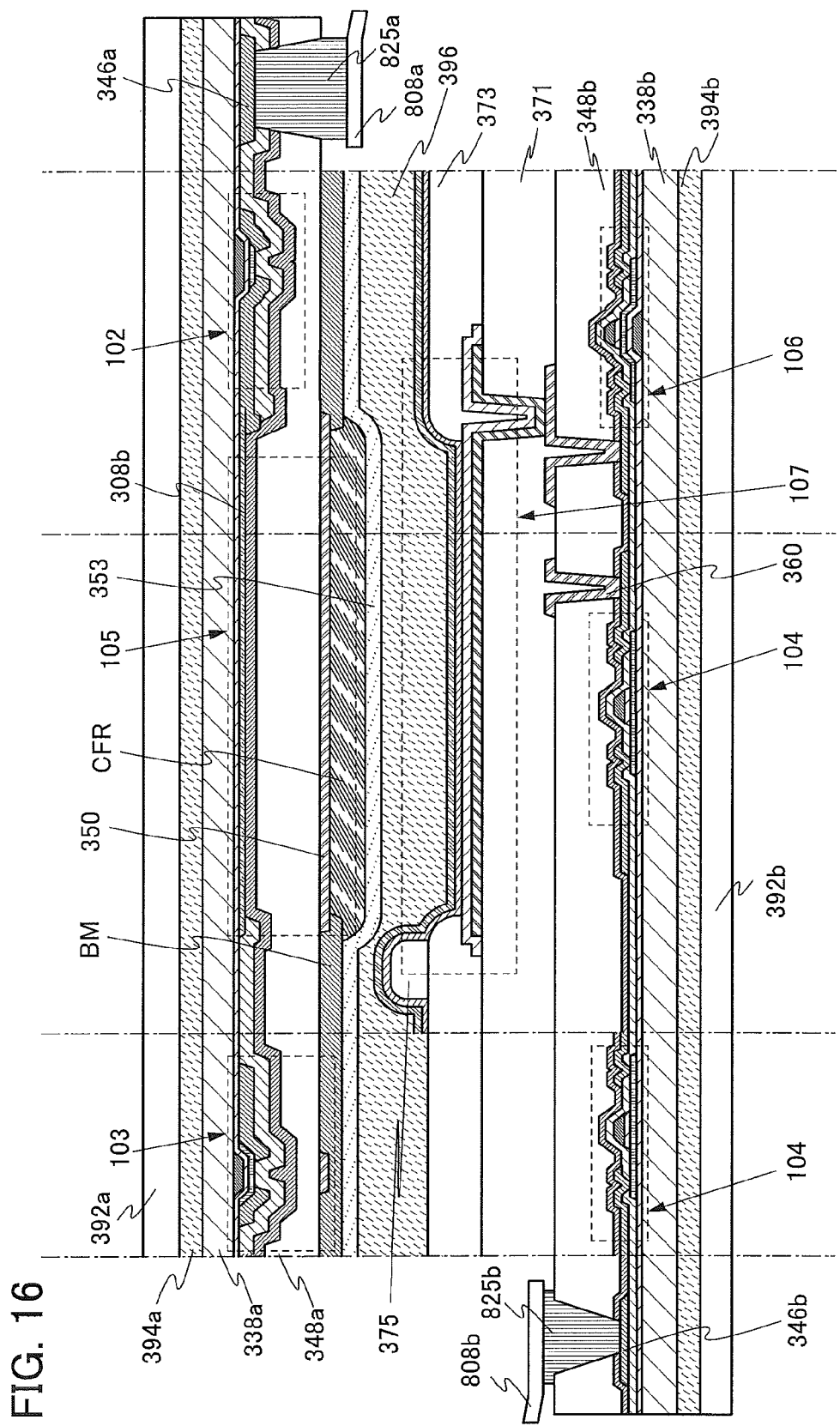
FIG. 16 illustrates an example of a touch panel.

FIG. 16 is a cross-sectional schematic view of a touch panel of one embodiment of the present invention.

The touch panel includes the flexible substrate 392b, the bonding layer 394b, the insulating film 338b, the transistor 104, the transistor 106, the conductive film 346b, the insulating film 348b, the conductive film 360, the insulating film 371, the light-emitting element 107, the insulating film 373, the spacer 375, and the like.

As illustrated in FIG. 16, the transistor electrically connected to the capacitor 105 and the transistor electrically connected to the light-emitting element 107 may have different structures. Alternatively, the transistors may have similar structures as described in the above structure example. Furthermore, a transistor in the driver circuit of the touch sensor and a transistor in the driver circuit of the pixel may have similar structures or different structures.

<Cross-Sectional Structure Example 4 of Touch Panel>

Figure 17:
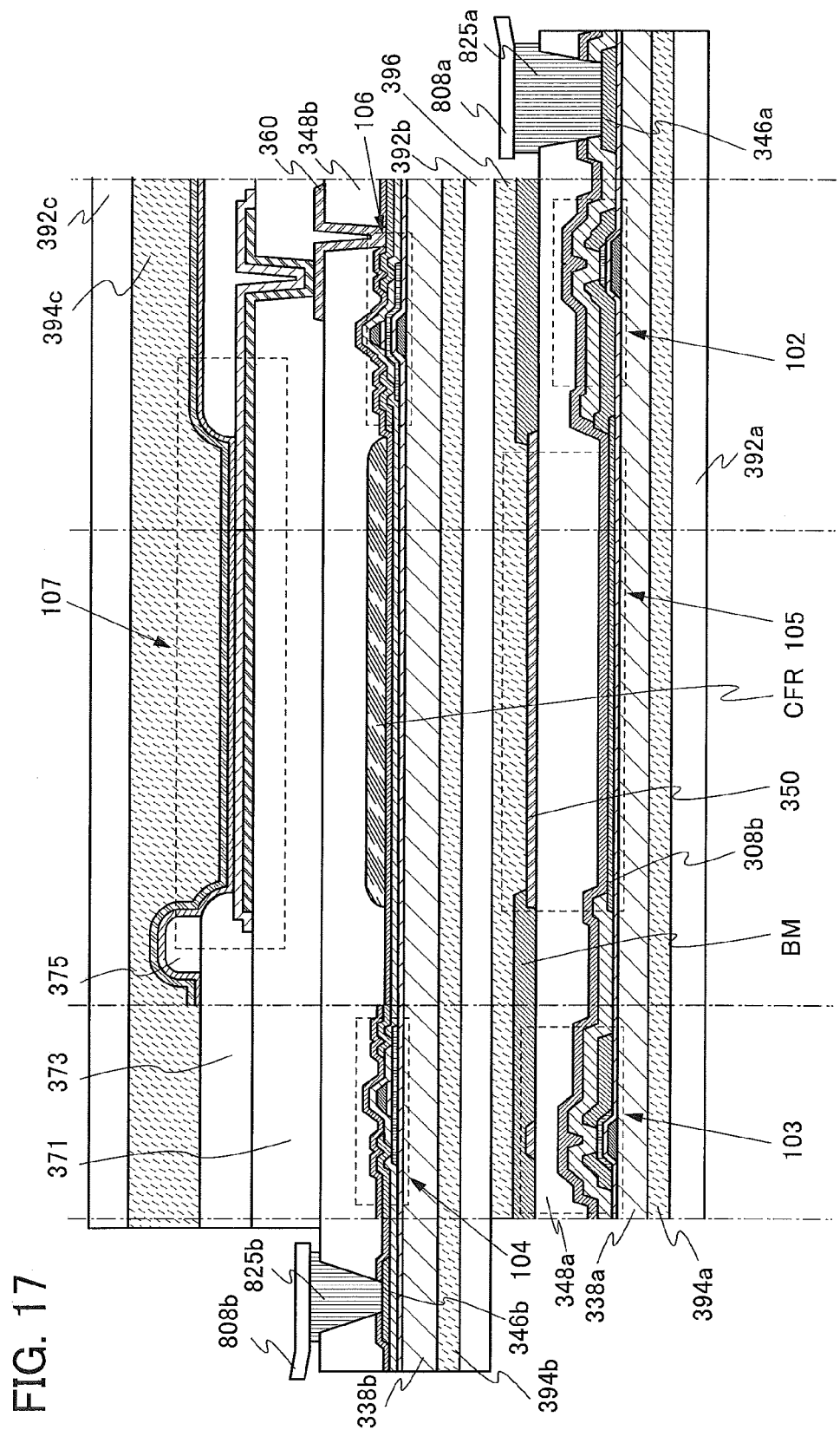
FIG. 17 illustrates an example of a touch panel.

FIG. 17 is a cross-sectional schematic view of a touch panel of one embodiment of the present invention.

The touch panel includes the flexible substrate 392b, the bonding layer 394b, the insulating film 338b, the transistor 104, the transistor 106, the coloring layer CFR, the conductive film 346b, the insulating film 348b, the conductive film 360, the insulating film 371, the light-emitting element 107, the insulating film 373, the spacer 375, a bonding layer 394c, the flexible substrate 392c, and the like.

The light-emitting element 107 has a bottom-emission structure and emits light to the coloring layer CFR side.

The touch panel further includes the flexible substrate 392a, the bonding layer 394a, the insulating film 338a, the transistor 102, the transistor 103, the capacitor 105, the conductive film 346a, the insulating film 348a, the light-blocking layer BM, the bonding layer 396, and the like.

In the touch panel of one embodiment of the present invention, the light-blocking layer includes a portion overlapping with the transistor and the display element (the light-emitting element) includes a portion overlapping with the capacitor. In the example illustrated in FIG. 17, the capacitor 105 overlaps with the light-emitting element 107, and the light-blocking layer BM overlaps with the transistors 102, 103, 104, and 106.

<Examples of Materials Used for Touch Panel>

Next, materials and the like that can be used for a touch panel are described. Note that the other description in this specification can also be referred to.

As materials for the substrates, glass, quartz, an organic resin, metal, an alloy, or the like can be used. The substrate through which light is extracted from the light-emitting element is formed using a material which transmits the light.

In particular, a flexible substrate is preferably used. For example, an organic resin, a glass material that is thin enough to have flexibility, metal, or an alloy can be used.

An organic resin, which has a specific gravity smaller than that of glass, is preferably used for the flexible substrate, in which case the touch panel can be lightweight as compared with the case where glass is used.

The substrate is preferably formed using a material with high toughness. In that case, a touch panel with high impact resistance that is less likely to be broken can be provided. For example, when an organic resin substrate or a thin metal or alloy substrate is used, the touch panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the touch panel. The thickness of a substrate using a metal material or an alloy material is preferably greater than or equal to 10 μm and less than or equal to 200 μm, or further preferably greater than or equal to 20 μm and less than or equal to 50 μm.

There is no particular limitation on a material of the metal substrate or the alloy substrate, but it is preferable to use, for example, aluminum, copper, nickel, a metal alloy such as an aluminum alloy or stainless steel.

Furthermore, when a material with high thermal emissivity is used for the substrate, the surface temperature of the touch panel can be prevented from rising, leading to prevention of breakage or a decrease in reliability of the touch panel. For example, the substrate may have a stacked-layer structure of a metal substrate and a layer with high thermal emissivity (the layer can be formed using a metal oxide or a ceramic material, for example).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material having a low coefficient of thermal expansion is preferable, and for example, a polyamide imide resin, a polyimide resin, PET, or the like can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials.

The flexible substrate may be formed by stacking a plurality of layers. When a glass layer is used, a barrier property against water and oxygen can be improved and thus a highly reliable touch panel can be provided.

For example, a flexible substrate in which a glass layer, a bonding layer, and an organic resin layer are stacked from the side closer to an organic EL element can be used. The thickness of the glass layer is greater than or equal to 20 μm and less than or equal to 200 μm, or preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, or preferably greater than or equal to 20 μm and less than or equal to 50 μm. By providing such an organic resin layer outside the glass layer, occurrence of a crack or a break in the glass layer can be suppressed and mechanical strength can be improved. With the substrate that includes such a composite material of a glass material and an organic resin, a highly reliable flexible touch panel can be provided.

As the bonding layers 394a, 394b, 394c, and 394d, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a PVC resin, a PVB resin, an EVA resin, and the like. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the functional element and can improve the reliability of the touch panel.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

There is no particular limitation on the structure of the transistor in the touch panel. The structure of the transistor may be similar to that of the transistor used in the active matrix touch sensor in the above-described embodiment. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, ITO, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the metal material or the alloy. Moreover, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked on and in contact with an aluminum alloy film, oxidation of the aluminum alloy film can be suppressed. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 361 and the upper electrode 367, holes are injected to the EL layer 365 from the anode side and electrons are injected to the EL layer 365 from the cathode side. The injected electrons and holes are recombined in the EL layer 365 and a light-emitting substance contained in the EL layer 365 emits light.

The EL layer 365 includes at least a light-emitting layer. In addition to the light-emitting layer, the EL layer 365 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 365, either a low molecular compound or a high molecular compound can be used, and an inorganic compound may also be used. Each of the layers included in the EL layer 365 can be formed by any of the following methods: an evaporation method (including a vacuum evaporation method), a transfer method, a printing method, an inkjet method, a coating method, and the like.

The light-emitting element is preferably provided between a pair of insulating films having an excellent moisture-proof property. In that case, entry of an impurity such as moisture into the light-emitting element can be suppressed, leading to suppressing of a decrease in the reliability of the touch panel.

As an insulating film having an excellent moisture-proof property, a film containing nitrogen and silicon (e.g., a silicon nitride film, a silicon nitride oxide film, or the like), a film containing nitrogen and aluminum (e.g., an aluminum nitride film or the like), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], or still further preferably lower than or equal to $1\times10^{-8}$ [g/(m$^2$·day)].

The insulating film having an excellent moisture-resistance property is preferably used for the insulating film 338a or the insulating film 338b.

For example, as the insulating film 348a, the insulating film 348b, and the insulating film 371, an organic material such as polyimide, acrylic, polyamide, polyimide amide, or a benzocyclobutene-based resin can be used. Alternatively, a low-dielectric constant material (a low-k material) or the like can be used. Furthermore, each insulating film may be formed by stacking a plurality of insulating films.

For the insulating film 373, an organic insulating material or an inorganic insulating material is used. As the resin, for example, a polyimide resin, a polyamide resin, an acrylic resin, a siloxane resin, an epoxy resin, a phenol resin, or the like can be used. It is particularly preferable that the insulating film 373 be formed to have an inclined side wall with continuous curvature, using a photosensitive resin material.

There is no particular limitation on the method for forming the insulating film 373; a photolithography method, a sputtering method, an evaporation method, a droplet discharging method (e.g., an inkjet method), a printing method (e.g., a screen printing method, an off-set printing method, or the like), or the like may be used.

The spacer 375 can be formed using an inorganic insulating material, an organic insulating material, a metal material, or the like. As the inorganic insulating material and the organic insulating material, for example, a variety of materials that can be used for the insulating film can be used. As the metal material, titanium, aluminum, or the like can be used. When the spacer 375 containing a conductive material is electrically connected to the upper electrode 367, voltage drop due to the resistance of the upper electrode 367 can be suppressed. The spacer 375 may have either a tapered shape or an inverse tapered shape.

For example, a conductive film functioning as an electrode or a wiring of the transistor, an auxiliary electrode of the light-emitting element, or the like, which is used for the touch panel, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive film may be formed using a conductive metal oxide. As the conductive metal oxide, indium oxide (e.g., In$_2$O$_3$), tin oxide (e.g., SnO$_2$), zinc oxide (ZnO), ITO, indium zinc oxide (e.g., In$_2$O$_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer is provided between the adjacent coloring layers. The light-blocking layer blocks light emitted from an adjacent light-emitting element to suppress color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

For the connectors 825a and 825b, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

Note that in this embodiment, the touch panel including the light-emitting element is described as an example. However, the touch panel of one embodiment of the present invention may include another display element and another light-emitting element.

In this specification and the like, a display element, a light-emitting element, and a touch panel including a display element or a light-emitting element can employ various modes or can include various elements. The display element, the display device, the light-emitting element, the light-emitting device, or the touch panel includes at least one of an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, Electronic Liquid Powder (registered trademark), or an electrophoretic element, such as electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that an example of the case where a variety of display is performed using the display panel is shown here; however, one embodiment of the present invention is not limited thereto. For example, data is not necessarily displayed. As an example, the display panel may be used as a lighting device. By using the panel as a lighting device, it can be used as interior lighting having an attractive design. Alternatively, in one embodiment of the present invention, it can be used as lighting from which light radiates in various directions. Further alternatively, it may be used as a light source, for example, a backlight, a front light, or the like, not the display panel. In other words, it may be used as a lighting device for the display panel.

<Example of Manufacturing Method of Touch Panel>

An example of a manufacturing method of a touch panel having flexibility of one embodiment of the present invention is described.

Figure 18A:
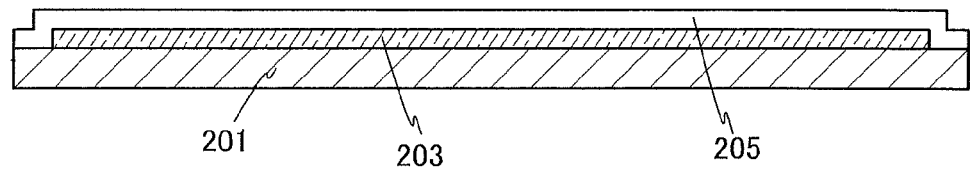
FIGS. 18A to 18D illustrate an example of a method for manufacturing a touch panel.
Figure 18B:
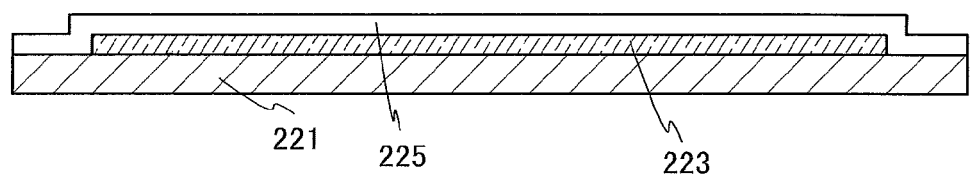

First, a separation layer 203 is formed over a formation substrate 201, and a layer 205 to be separated (hereinafter referred to as a layer 205) is formed over the separation layer 203 (FIG. 18A). In addition, a separation layer 223 is formed over a formation substrate 221, and a layer 225 to be peeled (hereinafter referred to as a layer 225) is formed over the separation layer 223 (FIG. 18B).

Although an example in which the separation layer is formed to have an island shape is described here, one embodiment of the present invention is not limited to such an example. In this step, the material of the separation layer is selected such that separation occurs at the interface between the formation substrate and the separation layer, the interface between the separation layer and the layer to be separated, or in the separation layer when the layer to be separated is separated from the formation substrate. In this embodiment, an example in which separation occurs at the interface between the layer to be separated and the separation layer is described; however, one embodiment of the present invention is not limited to such an example and depends on a material used for the separation layer or the layer to be separated. Note that in the case where the layer to be separated has a stacked-layer structure, a layer in contact with the separation layer is particularly referred to as a first layer.

For example, in the case where the separation layer has a stacked-layer structure of a tungsten film and a tungsten oxide film, part of the separation layer (here, part of the tungsten oxide film) may remain on the layer to be separated side when separation occurs at the interface between the tungsten film and the tungsten oxide film (or the vicinity of the interface). Moreover, the separation layer remaining on the layer to be separated side may be removed after peeling.

As the formation substrate, a substrate having at least heat resistance high enough to withstand process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

In the case where a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer is preferably formed using a high-melting point metal material such as tungsten, titanium, or molybdenum, in which case the degree of freedom of the process for forming the layer to be separated can be increased.

The separation layer can be formed by, for example, a sputtering method, a plasma CVD method, a coating method (including a spin coating method, a droplet discharge method, a dispensing method, and the like), or a printing method. The thickness of the separation layer is, for example, greater than or equal to 10 nm and less than or equal to 200 nm, preferably greater than or equal to 20 nm and less than or equal to 100 nm.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. It is to be noted that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

There is no particular limitation on a layer formed as the layer to be separated. For example, in the case where the touch panel shown in FIG. 12A is formed, the insulating film 338a, the transistor 102, the transistor 103, the capacitor 105, the light-blocking layer BM, the coloring layer CFR, and the like may be formed in one of the layers to be separated. Furthermore, the insulating film 338b, the transistor 102, the transistor 103, the light-emitting element 107, and the like may be formed in the other of the layers to be separated.

The insulating films 338a and 338b formed in contact with the separation layer preferably has a single-layer structure or a stacked-layer structure including any of a silicon nitride film, a silicon oxynitride film, a silicon oxide film, a silicon nitride oxide film, and the like.

The insulating film can be formed by a sputtering method, a plasma CVD method, a coating method, a printing method, or the like. For example, the insulating film is formed at a temperature higher than or equal to 250° C. and lower than or equal to 400° C. by a plasma CVD method, whereby the insulating film can be a dense film having a very high moisture resistance property. Note that the insulating film is preferably formed to have a thickness of greater than or equal to 10 nm and less than or equal to 3000 nm, further preferably greater than or equal to 200 nm and less than or equal to 1500 nm.

Figure 18C:
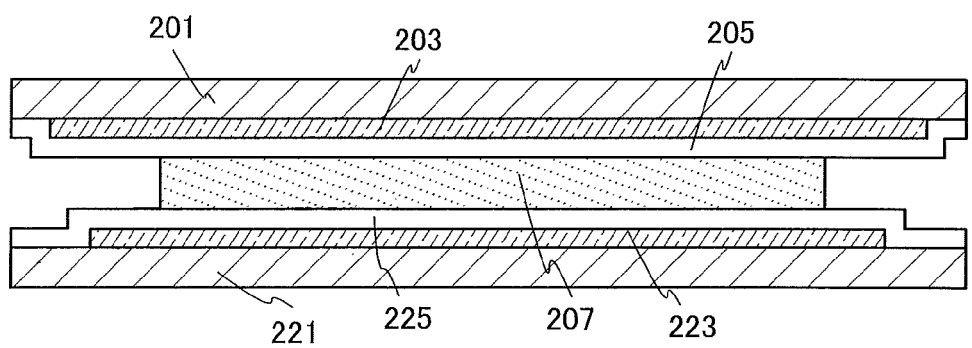

Next, the formation substrate 201 and the formation substrate 221 are attached to each other with a bonding layer 207 so that surfaces on which the layers to be separated are formed face each other, and the bonding layer 207 is cured (FIG. 18C).

Note that the formation substrate 201 and the formation substrate 221 are preferably attached to each other in a reduced-pressure atmosphere.

Figure 18D:
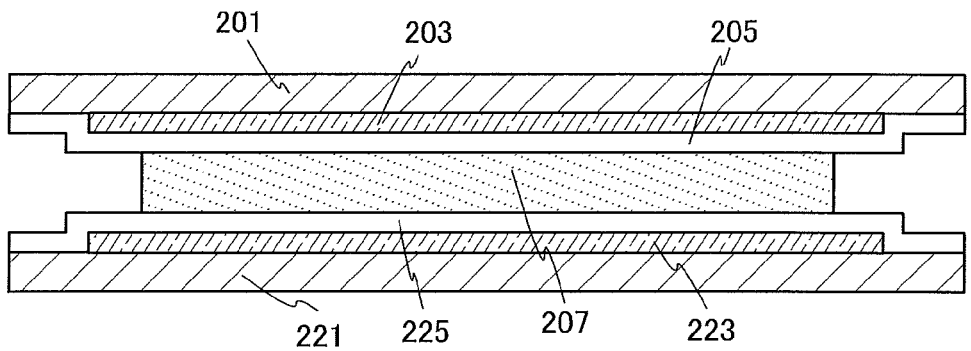

Note that although FIG. 18C illustrates the case where the separation layer 203 and the separation layer 223 are different in size, separation layers having the same size as illustrated in FIG. 18D may be used.

The bonding layer 207 is provided to overlap with the separation layer 203, the layer 205, the layer 225, and the separation layer 223. Then, an end portion of the bonding layer 207 is preferably positioned on an inner side than at least an end portion of either the separation layer 203 or the separation layer 223 (the separation layer which is desirably separated first). Accordingly, strong adhesion between the formation substrate 201 and the formation substrate 221 can be suppressed; thus, a decrease in yield of a subsequent peeling process can be suppressed.

As the bonding layer 207, various curable adhesives such as a reactive curable adhesive, a thermosetting adhesive, an anaerobic adhesive, and a photo-curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. For the adhesive, a material having fluidity low enough to dispose the material only in a desired region is preferably used. For example, an adhesive sheet, a bonding sheet, a sheet-like or film-like adhesive, or the like, can be used. For example, an optical clear adhesive (OCA) film can be preferably used.

The adhesive may have adhesion before attachment or exhibit adhesion after attachment by heating or light irradiation.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the device.

Figure 19A:
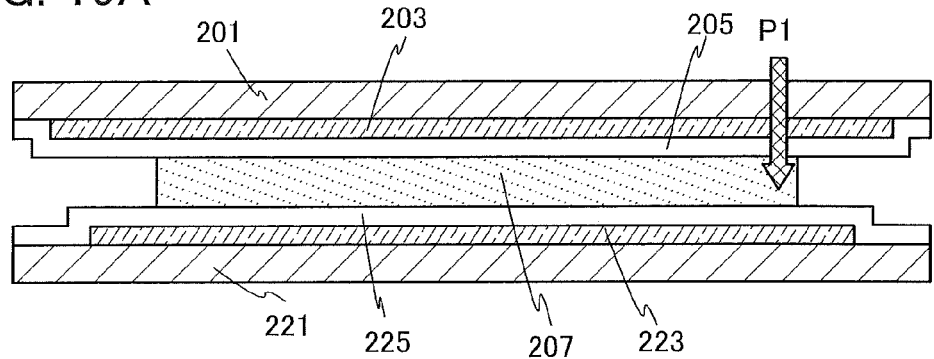
FIGS. 19A to 19D illustrate an example of the method for manufacturing a touch panel.
Figure 19B:
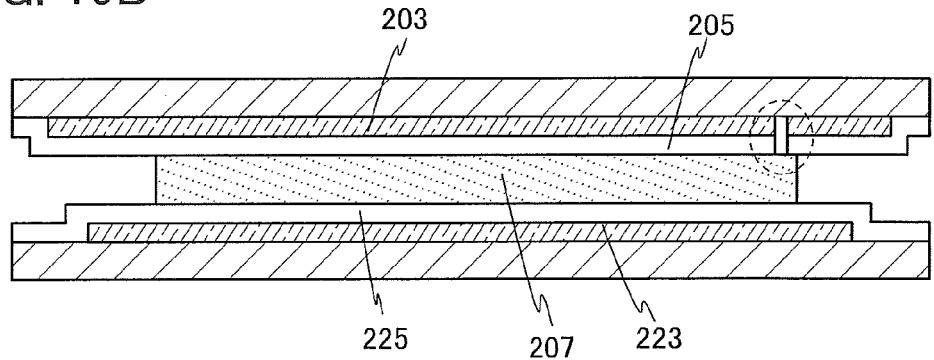

Next, a separation starting point is formed by laser irradiation (FIGS. 19A and 19B).

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate on the side where the element is formed may be separated first or the other substrate may be separated first. Here, an example in which the formation substrate 201 is separated first is described.

A region where the cured bonding layer 207, the layer 205, and the separation layer 203 overlap with each other is irradiated with a laser beam (see an arrow P1 in FIG. 19A).

Part of the first layer is removed; thus, the separation starting point can be formed (see a region surrounded by the dashed line in FIG. 19B). At this time, not only the first layer but also the separation layer 203, the bonding layer 207, or another layer included in the layer 205 may be partly removed.

It is preferable that laser light irradiation be performed from the substrate side provided with the separation layer which is desirably separated. In the case where a region where the separation layer 203 and the separation layer 223 overlap with each other is irradiated with laser light, the formation substrate 201 and the separation layer 203 can be selectively separated by cracking only the layer 205 of the layers 205 and 225 (see a region surrounded by the dashed line in FIG. 19B; in the example illustrated here, layers in the layer 205 are partly removed).

Figure 19C:
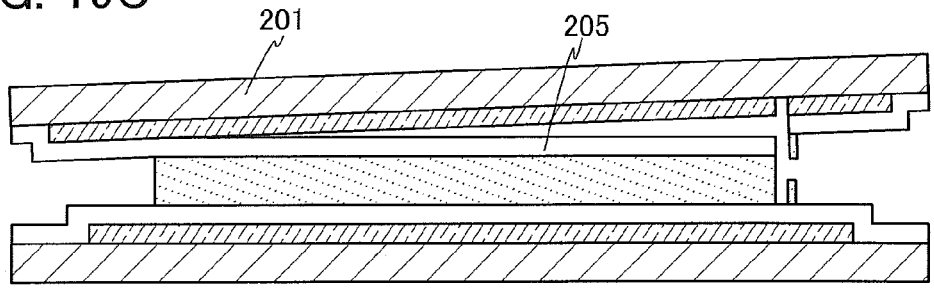
Figure 19D:
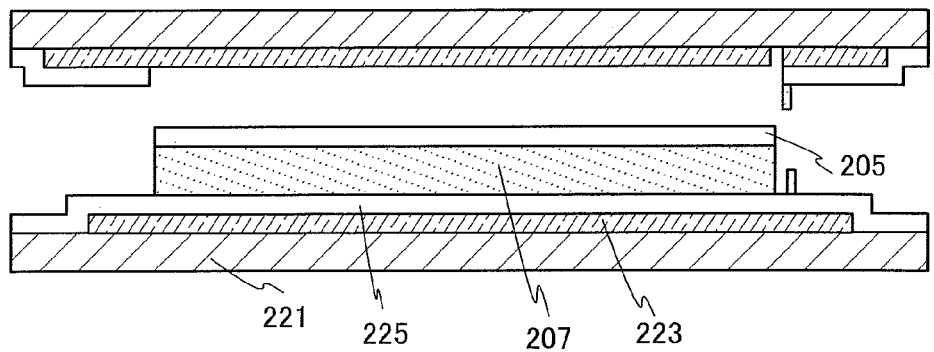

Then, the layer 205 and the formation substrate 201 are separated from each other from the formed separation starting point (FIGS. 19C and 19D). Accordingly, the layer 205 can be transferred from the formation substrate 201 to the formation substrate 221.

For example, the layer to be separated and the formation substrate 201 may be separated by mechanical force (a peeling process with a human hand or a gripper, a separation process by rotation of a roller, or the like) from the separation starting point.

The formation substrate 201 and the layer to be separated may be separated by filling the interface between the separation layer 203 and the layer to be separated with a liquid such as water. A portion between the separation layer 203 and the layer to be separated absorbs a liquid through capillarity action, so that separation occurs easily. Furthermore, an adverse effect on the functional element included in the layer to be separated due to static electricity caused at separation (e.g., a phenomenon in which a semiconductor element is damaged by static electricity) can be suppressed.

Figure 20A:
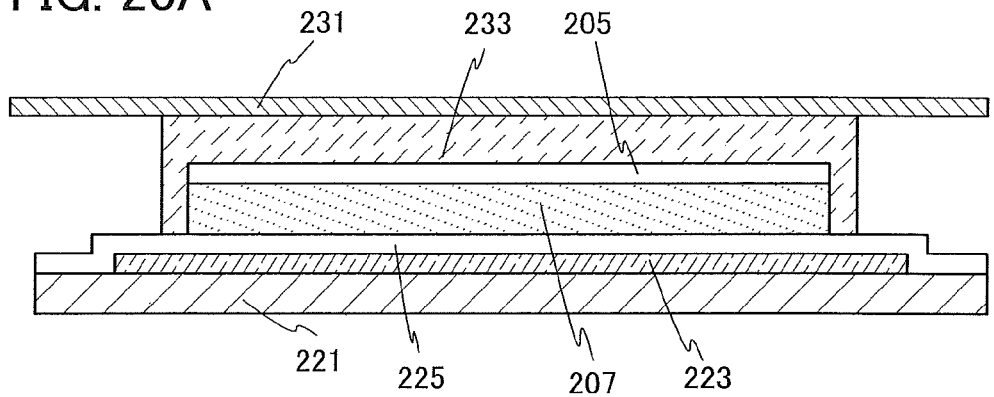
FIGS. 20A to 20D illustrate an example of the method for manufacturing a touch panel.

Next, the exposed layer 205 is attached to a substrate 231 with a bonding layer 233, and the bonding layer 233 is cured (FIG. 20A).

Note that the layer 205 and the substrate 231 are preferably attached to each other in a reduced-pressure atmosphere.

Figure 20B:
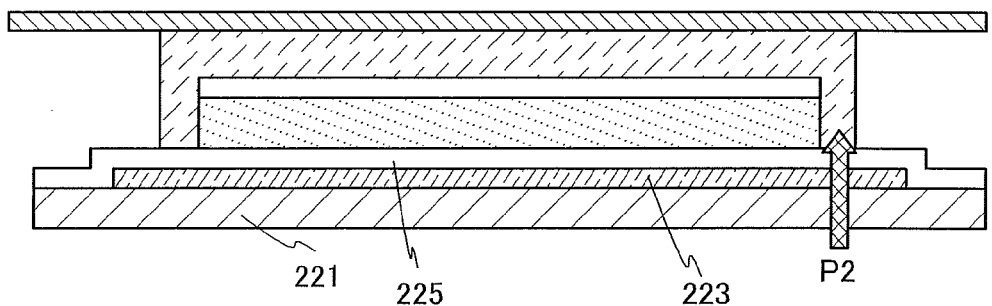
Figure 20C:
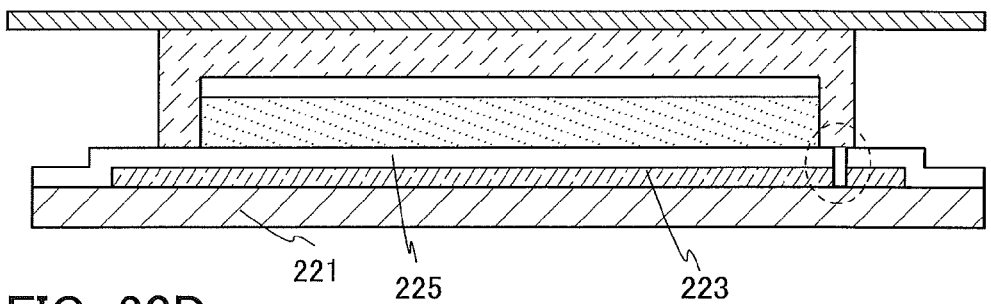

Next, a separation starting point is formed by laser light irradiation (FIGS. 20B and 20C).

A region where the cured bonding layer 233, the layer 225, and the separation layer 223 overlap with each other is irradiated with a laser beam (see an arrow P2 in FIG. 20B). Part of the first layer is removed; thus, the starting point of separation can be formed (see a region surrounded by the dashed line in FIG. 20C; in the example illustrated here, layers in the layer 225 are partly removed). At this time, not only the first layer but also the separation layer 223, the bonding layer 233, or another layer included in the layer 225 may be partly removed.

It is preferable that laser light irradiation be performed from the formation substrate 221 side in which the separation layer 223 is provided.

Figure 20D:
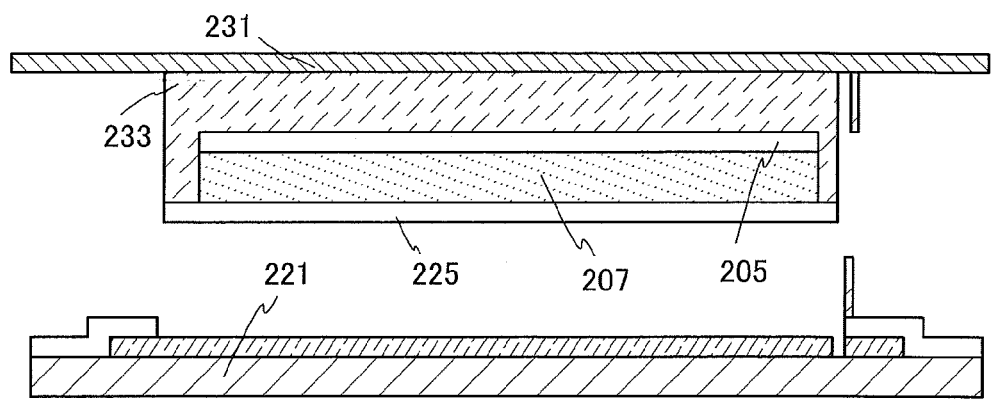

Then, the layer 225 and the formation substrate 221 are separated from each other from the formed separation starting point (FIG. 20D). Accordingly, the layer 205 and the layer 225 can be transferred to the substrate 231.

In the above method for manufacturing the touch panel of one embodiment of the present invention, separation is performed in such a manner that the starting point of separation is formed by laser irradiation after a pair of formation substrates each provided with a separation layer and a layer to be separated are attached to each other and then the separation layers and layers to be separated are made in a state where separation can easily occur. Accordingly, the yield of the separation process can be improved.

In addition, bonding of a substrate over which a device is formed can be performed after the following procedure: a pair of formation substrates each provided with the layer to be separated are attached to each other and then, separation is performed. Therefore, formation substrates having low flexibility can be attached to each other when the layers to be separated are attached to each other, whereby alignment accuracy at the time of attachment can be improved as compared to the case where flexible substrates are attached to each other.

Figure 21A:
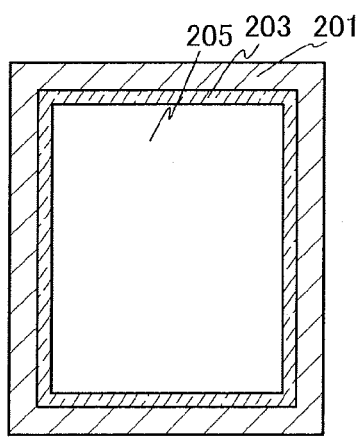
FIGS. 21A to 21C illustrate an example of a method for manufacturing a touch panel.
Figure 21B:
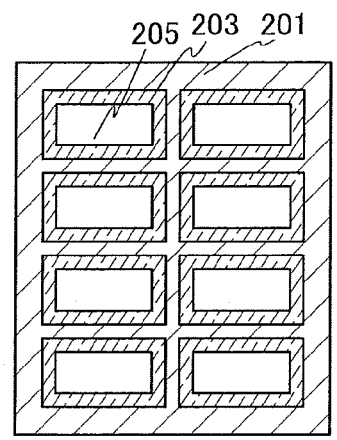
Figure 21C:
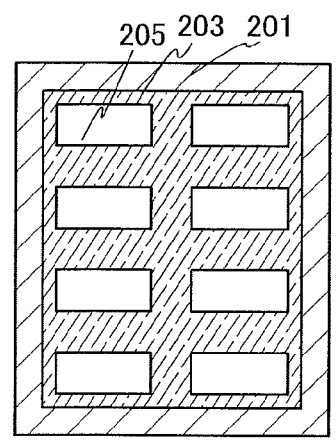

As illustrated in FIG. 21A, an end portion of the layer 205 to be separated is preferably positioned on an inner side of the end portion of the separation layer 203. Accordingly, the yield of the separation process can be improved. In the case where there are a plurality of layers 205 to be separated, the separation layer 203 may be provided for each layer 205 as illustrated in FIG. 21B or a plurality of layers 205 may be provided over one separation layer 203 as illustrated in FIG. 21C.

This embodiment can be combined with any other embodiment as appropriate.

(Embodiment 3)

In this embodiment, a touch panel of one embodiment of the present invention will be described.

The transistor 102 electrically connected to the capacitor 105 and the transistor 103 located over the surface over which the transistor 102 is formed are described in each cross-sectional structure example of the touch panel in Embodiment 2 (see FIGS. 12A and 12B, FIGS. 13A to 13C, FIG. 14, FIG. 15, FIG. 16, and FIG. 17). The gate electrode, the source electrode, and the drain electrode of each of the transistors and the conductive film used as the wiring or the like are visually recognized by a user of the touch panel in some cases. For example, in FIGS. 12A and 12B, the electrode and the wiring between the flexible substrate 392a and the light-blocking layer BM are visually recognized by a user of the touch panel in some cases. Particularly, in the case where the electrode and the wiring are formed using a conductive film having a high reflecting property or a conductive film having a low light-transmitting property, the electrode and the wiring are visually recognized by the user with ease. In order to increase the quality or the display quality of the touch panel, it is preferable that the electrode and the wiring be not visually recognized by the user with ease.

In view of this, in the touch panel of one embodiment of the present invention, a light-blocking layer is provided so that the electrode and the wiring are not visually recognized by a user of the touch panel.

Figure 22:
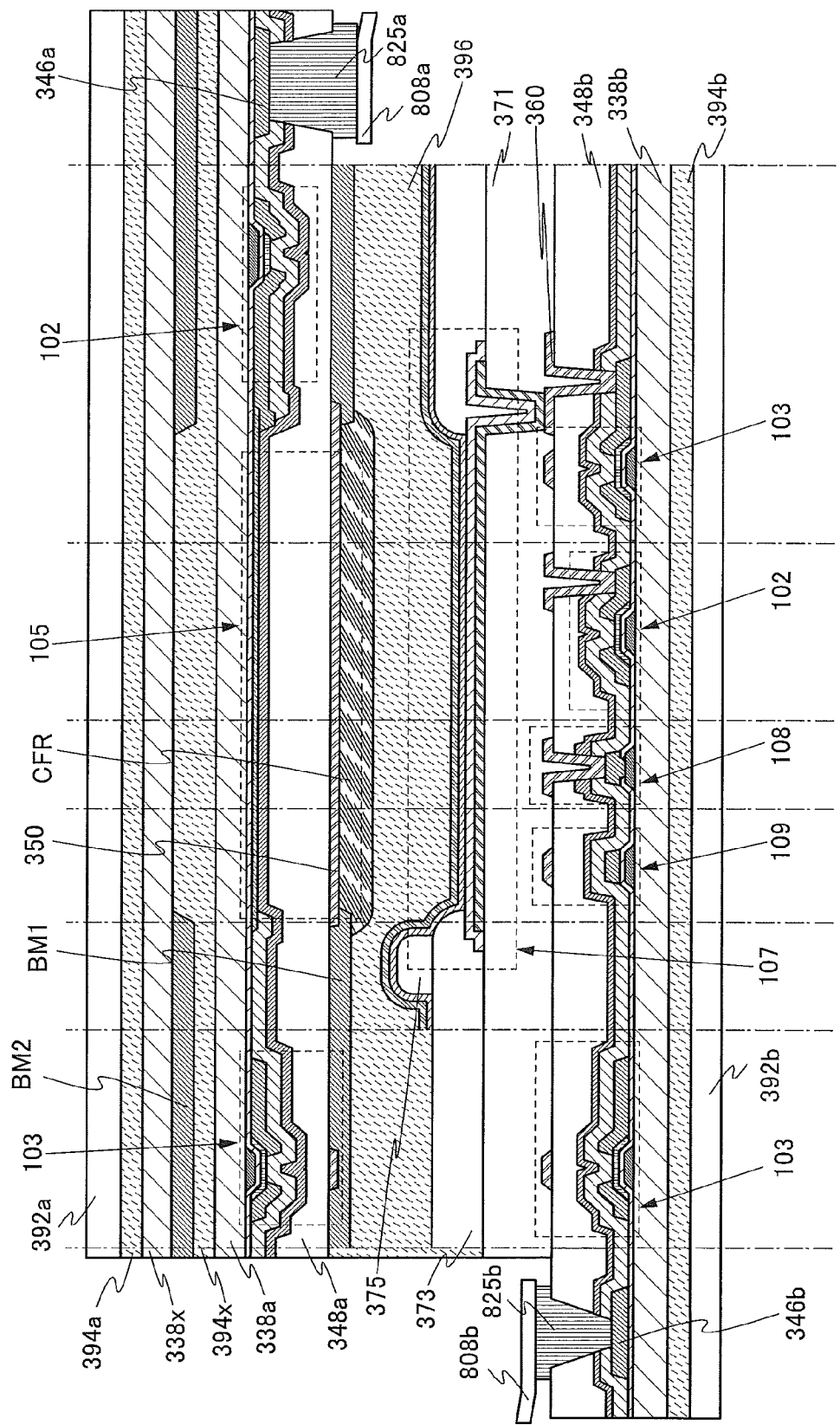
FIG. 22 illustrates an example of a touch panel.

Specifically, as shown in FIG. 22, a light-blocking layer BM2 is located so that the transistor 103, the transistor 102, the conductive film 346a, and the like overlap with the flexible substrate 392a with the light-blocking layer BM2 provided therebetween. Thus, the electrode and the wiring can be less recognized visually by a user of the touch panel, which leads to an increase in the quality or the display quality of the touch panel. For example, in FIG. 22, the light-blocking layer BM2 overlaps with the transistor 103 that is electrically connected to the capacitor 105.

Note that instead of the light-blocking layer BM shown in FIGS. 12A and 12B, a light-blocking layer BM1 is shown in FIG. 22. The light-blocking layer BM1 can be formed using a material similar to that of the light-blocking layer BM. Furthermore, the light-blocking layer BM2 can be formed using a material similar to that of the light-blocking layer BM. Other components are similar to those in FIGS. 12A and 12B; therefore, the above description can be referred to for the components.

The light-blocking layer BM2 is provided more on the display surface side or the sensor surface side of the touch panel than on the electrode side and the wiring side of the touch panel. Note that the light-blocking layer BM2 includes a region not overlapping with the display element.

An example of a manufacturing method of the touch panel shown in FIG. 22 is described with reference to FIGS. 23A to 23H.

Figure 23A:
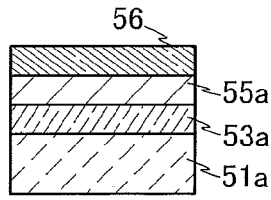
FIGS. 23A to 23H illustrate an example of a method for manufacturing a touch panel.

A first separation layer 53a is formed over a first formation substrate 51a, a first insulating film 55a is formed over the first separation layer 53a, and a first functional layer 56 is formed over the first insulating film 55a (FIG. 23A). The first insulating film 55a corresponds to the insulating film 338b shown in FIG. 22. The first functional layer 56 includes the light-emitting element 107, the transistor 103 electrically connected to the light-emitting element 107, the transistor 102 included in the display portion, the transistor 103 included in the driver circuit portion on the light-emitting element 107 side, and the like shown in FIG. 22.

Figure 23B:
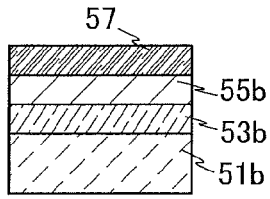

Similarly, a second separation layer 53b is formed over a second formation substrate 51b, a second insulating film 55b is formed over the second separation layer 53b, and a second functional layer 57 is formed over the second insulating film 55b (FIG. 23B). The second insulating film 55b corresponds to the insulating film 338a shown in FIG. 22. The second functional layer 57 includes the capacitor 105, the transistor 102 electrically connected to the capacitor 105, the transistor 103 included in the driver circuit portion on the capacitor 105 side, the coloring layer CFR, the light-blocking layer BM1, and the like shown in FIG. 22.

At this time, an oxide conductor layer is preferably used as the electrode of the capacitor 105 as described in Embodiment 1. Furthermore, an oxide semiconductor layer is preferably used as the semiconductor layer of the transistor 102.

Figure 23C:
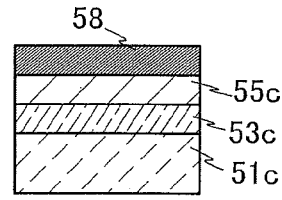

Similarly, a third separation layer 53c is formed over a third formation substrate 51c, a third insulating film 55c is formed over the third separation layer 53c, and a third functional layer 58 is formed over the third insulating film 55c (FIG. 23C). The third insulating film 55c corresponds to the insulating film 338x shown in FIG. 22. The third functional layer 58 includes the light-blocking layer BM2 and the like shown in FIG. 22.

Figure 23D:
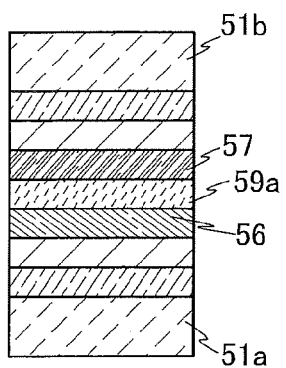

The first functional layer 56 formed over the first formation substrate 51a and the second functional layer 57 formed over the second formation substrate 51b are bonded to each other with a first bonding layer 59a (FIG. 23D). The first bonding layer 59a corresponds to the bonding layer 396 shown in FIG. 22.

At this time, the first functional layer 56 and the second functional layer 57 are preferably bonded to each other so that a portion where the light-emitting element 107 overlaps with the capacitor 105 is provided.

Figure 23E:
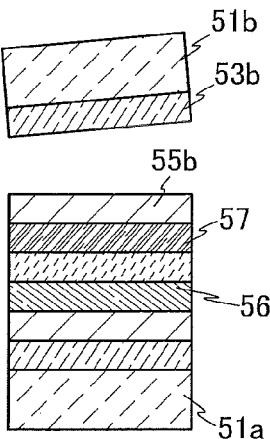
Figure 23F:
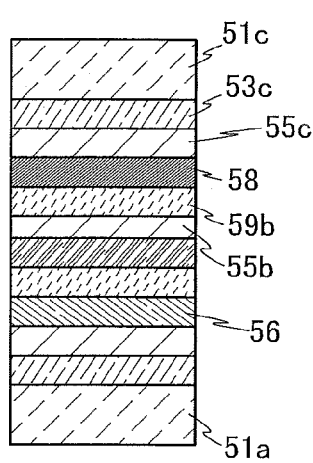

Next, the second formation substrate 51b and the second insulating film 55b are separated from each other (FIG. 23E). In the example illustrated here, the separation occurs at the interface between the second separation layer 53b and the second insulating film 55b. However, the location where the separation occurs is not limited thereto. Then, the second insulating film 55b that is exposed and the third functional layer 58 formed over the third formation substrate 51c are bonded to each other with a second bonding layer 59b (FIG. 23F). At this time, the second insulating film 55b and the third functional layer 58 are preferably bonded to each other so that a portion where the light-blocking layer BM2 overlaps with the transistor 102 is provided.

Figure 23G:
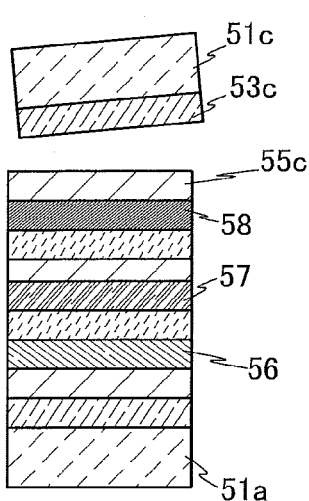
Figure 23H:
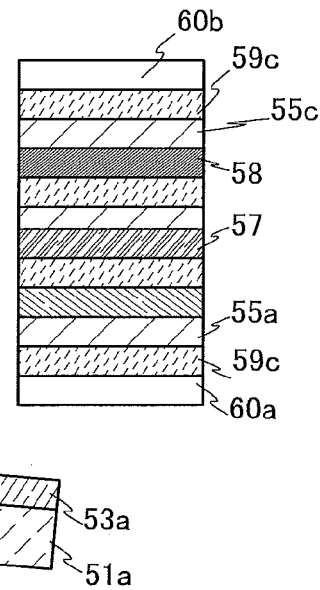

Then, the third formation substrate 51c and the third insulating film 55c are separated from each other (FIG. 23G). In the example illustrated here, the separation occurs at the interface between the third separation layer 53c and the third insulating film 55c. However, the location where the separation occurs is not limited thereto. Then, the third insulating film 55c that is exposed and a first flexible substrate 60b are bonded to each other with a third bonding layer 59c (FIG. 23H). The first formation substrate 51a and the first insulating film 55a are separated from each other in a manner similar to that described above. In the example illustrated here, the separation occurs at the interface between the first separation layer 53a and the first insulating film 55a. However, the location where the separation occurs is not limited thereto. Then, the first insulating film 55a that is exposed and a second flexible substrate 60a are bonded to each other with a fourth bonding layer 59d (FIG. 23H). Note that either the first formation substrate 51a or the third formation substrate 51c may be separated first.

In this manufacturing method, bonding of the flexible substrates can be performed after the following procedure: a pair of formation substrates each provided with the functional layer are attached to each other and then, separation is performed. Therefore, formation substrates having low flexibility can be attached to each other when the functional layers are attached to each other, whereby alignment accuracy at the time of bonding can be improved compared with the case where flexible substrates are bonded to each other. Therefore, it can be said that this manufacturing method has high alignment accuracy at the time of, for example, bonding of, the light-emitting element and a color filter or bonding of the light-emitting element and a touch sensor.

Figure 24:
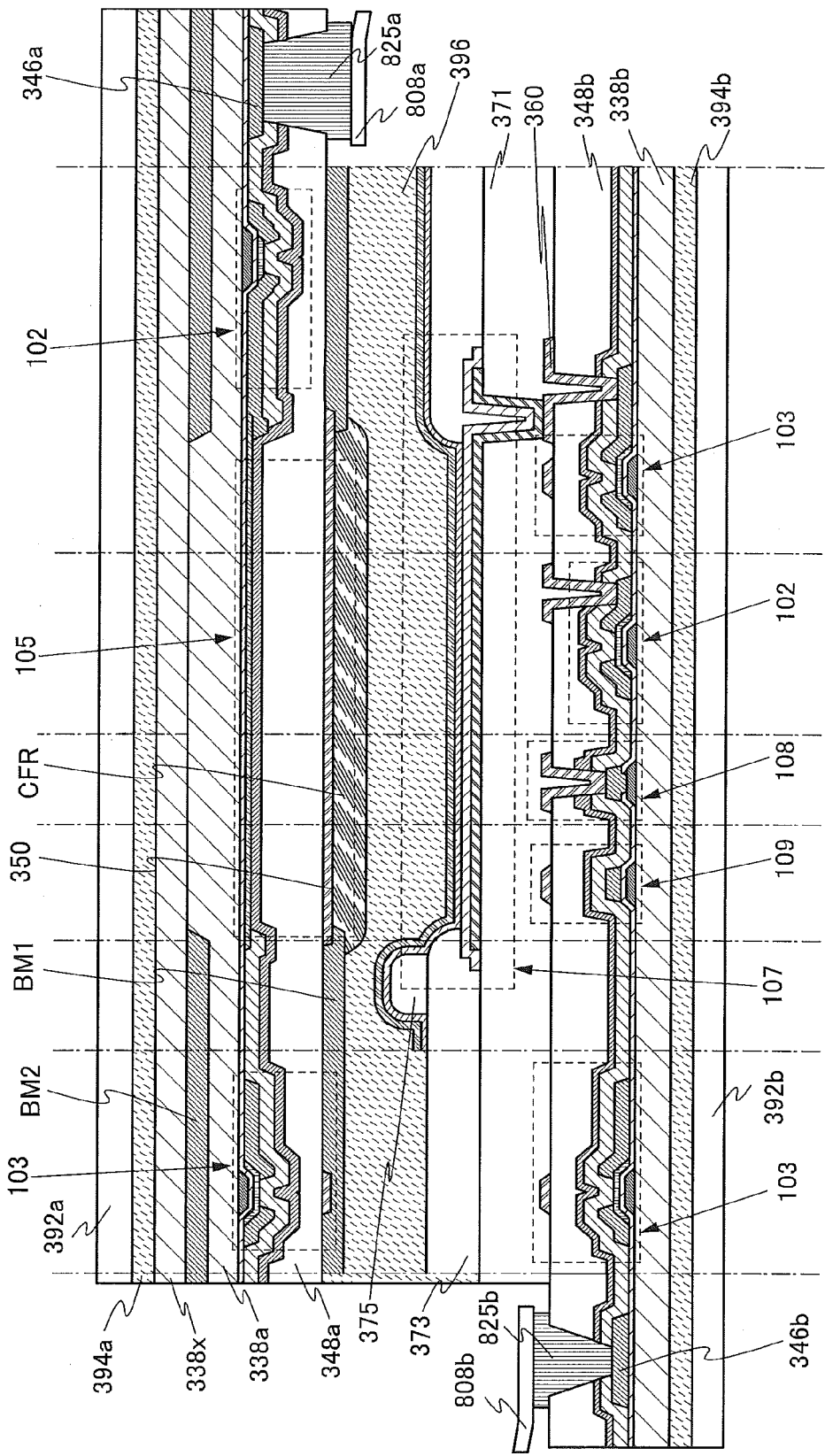
FIG. 24 illustrates an example of a touch panel.

Note that in the case where a touch sensor can be formed directly over the light-blocking layer BM2, a touch panel may be manufactured using only two formation substrates. Specifically, the light-blocking layer BM2 and the touch sensor are formed as the second functional layer 57. Then, the first functional layer 56 formed over the first formation substrate 51a and the second functional layer 57 formed over the second formation substrate 51b are bonded to each other with the first bonding layer 59a. The formation substrates are separated from the functional layers, and the insulating films that are exposed are bonded to flexible substrates. Thus, a touch panel of one embodiment of the present invention as shown in FIG. 24 can be manufactured.

The touch panel of one embodiment of the present invention does not necessarily include the light-blocking layer BM2. For example, an anti-reflective layer such as a circularly polarizing plate can be used instead of the flexible substrate 392a to increase the quality of the touch panel of one embodiment of the present invention. Furthermore, the touch panel of one embodiment of the present invention may include both the flexible substrate 392a and the anti-reflective layer.

This embodiment can be combined with any other embodiment as appropriate.

(Embodiment 4)

In this embodiment, electronic devices and lighting devices that can be fabricated according to one embodiment of the present invention will be described with reference to FIGS. 25A to 25G and FIGS. 26A to 26I.

A touch panel of one embodiment of the present invention has flexibility. Therefore, a touch panel of one embodiment of the present invention can be used in electronic devices and lighting devices having flexibility. Furthermore, according to one embodiment of the present invention, electronic devices and lighting devices having high reliability and resistance against repeated bending can be manufactured.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The touch panel of one embodiment of the present invention has flexibility and therefore can be incorporated along a curved inside/outside wall surface of a house or a building or a curved interior/exterior surface of a car.

An electronic device of one embodiment of the present invention may include a touch panel and a secondary battery. It is preferable that the secondary battery is capable of being charged by contactless power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include a touch panel and an antenna. When a signal is received by the antenna, the electronic device can display an image, data, or the like on a display portion. When the electronic device includes a secondary battery, the antenna may be used for contactless power transmission.

Figure 25A:
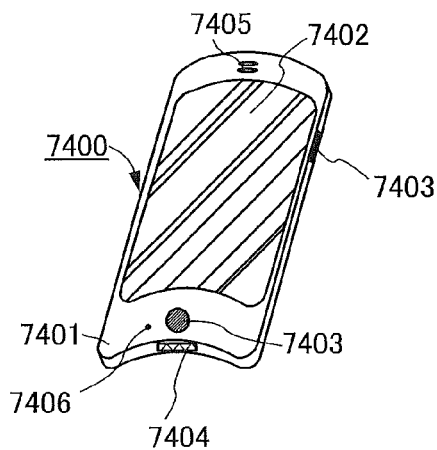
FIGS. 25A to 25G illustrate examples of electronic devices and lighting devices.

FIG. 25A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the touch panel of one embodiment of the present invention for the display portion 7402. In accordance with one embodiment of the present invention, a highly reliable mobile phone having a curved display portion can be provided at a high yield.

When the display portion 7402 of the mobile phone 7400 illustrated in FIG. 25A is touched with a finger or the like, data can be input into the mobile phone 7400. Further, operations such as making a call and inputting a letter can be performed by touch on the display portion 7402 with a finger or the like.

With the operation buttons 7403, power ON or OFF can be switched. In addition, types of images displayed on the display portion 7402 can be switched; switching images from a mail creation screen to a main menu screen.

Figure 25B:
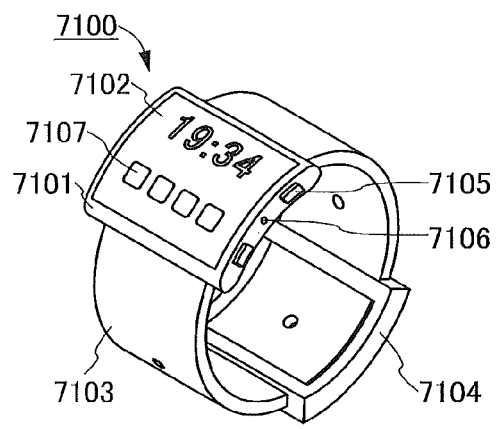

FIG. 25B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes the touch panel of one embodiment of the present invention. According to one embodiment of the present invention, a highly reliable portable information terminal having a curved display portion can be provided with a high yield.

Figure 25C:
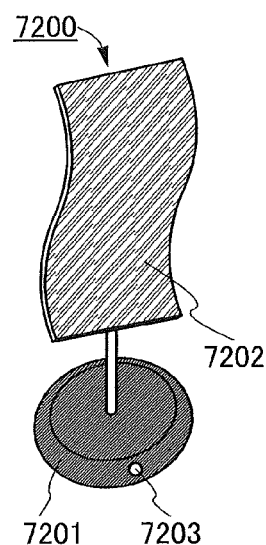
Figure 25D:
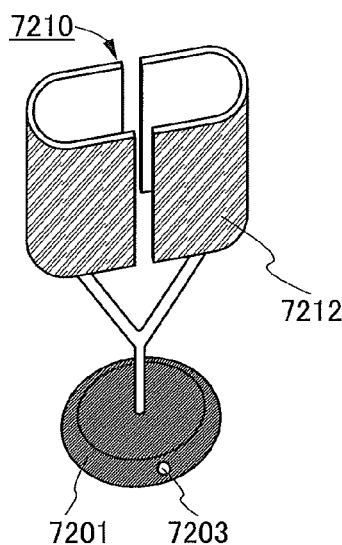
Figure 25E:
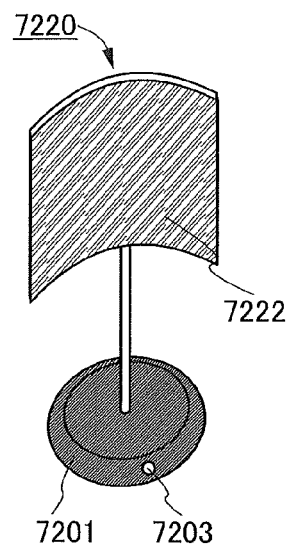

FIGS. 25C to 25E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 25C includes a light-emitting portion 7202 having a wave-shaped light-emitting surface, and thus has good design.

A light-emitting portion 7212 included in the lighting device 7210 illustrated in FIG. 25D has two convex-curved light-emitting portions symmetrically placed. Thus, all directions can be illuminated with the lighting device 7210 as a center.

The lighting device 7220 illustrated in FIG. 25E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, the light-emitting portions each include the touch panel of one embodiment of the present invention. In accordance with one embodiment of the present invention, a highly reliable lighting device having a curved light-emitting portion can be provided at a high yield.

Figure 25F:
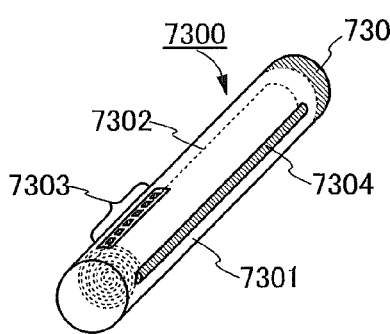

FIG. 25F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7302 in the cylindrical housing 7301.

The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, power ON/OFF, switching of displayed videos, and the like can be performed.

Figure 25G:
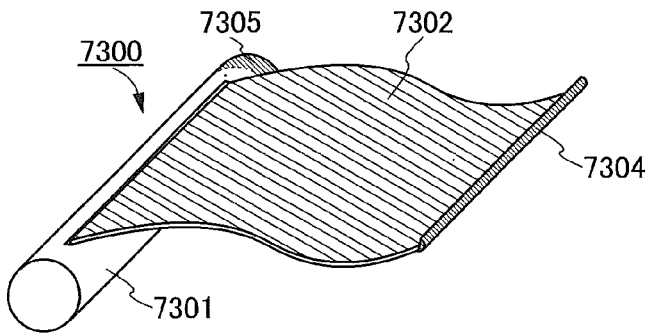

FIG. 25G illustrates a touch panel 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation buttons 7303 are provided not in the center of the housing 7301 but on one side of the housing 7301 as illustrated in FIG. 25F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the touch panel of one embodiment of the present invention. According to one embodiment of the present invention, a lightweight and highly reliable touch panel can be provided with a high yield.

Figure 26A:
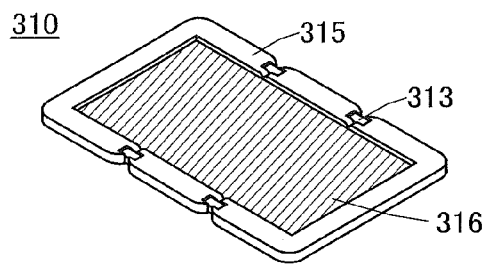
FIGS. 26A to 26I illustrate examples of electronic devices.
Figure 26F:
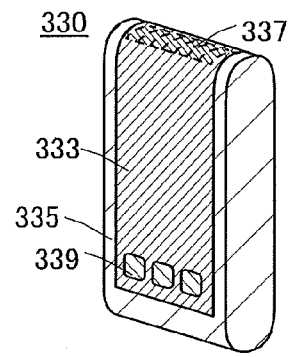
Figure 26B:
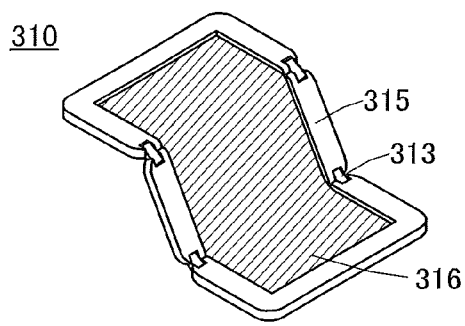
Figure 26G:
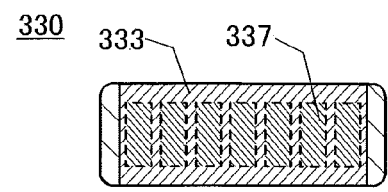
Figure 26C:
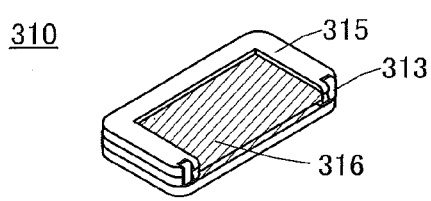

FIGS. 26A to 26C illustrate a foldable portable information terminal 310. FIG. 26A illustrates the portable information terminal 310 that is opened. FIG. 26B illustrates the portable information terminal 310 that is being opened or being folded. FIG. 26C illustrates the portable information terminal 310 that is folded. The portable information terminal 310 is highly portable when folded. When the portable information terminal 310 is opened, a seamless large display region is highly browsable.

A display panel 316 is supported by three housings 315 joined together by hinges 313. By folding the portable information terminal 310 at a connection portion between two housings 315 with the hinges 313, the portable information terminal 310 can be reversibly changed in shape from an opened state to a folded state. The touch panel according to one embodiment of the present invention can be used for the display panel 316. For example, a touch panel that can be bent with a radius of curvature of greater than or equal to 1 mm and less than or equal to 150 mm can be used.

Note that in one embodiment of the present invention, a sensor that senses whether the touch panel is in a folded state or an unfolded state and supplies sensing data may be used. The operation of a folded portion (or a portion that becomes invisible by a user by folding) of the touch panel may be stopped by a control device through the acquisition of data indicating the folded state of the touch panel. Specifically, display of the portion may be stopped, and furthermore, sensing by the touch sensor may be stopped.

Similarly, the control device of the touch panel may acquire data indicating the unfolded state of the touch panel to resume displaying and sensing by the touch sensor.

Figure 26H:
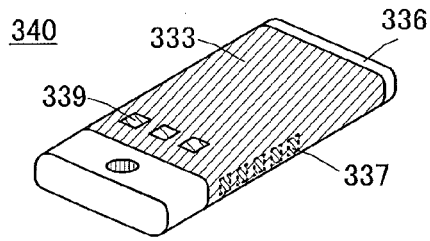
Figure 26D:
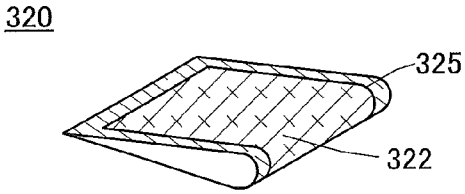
Figure 26I:
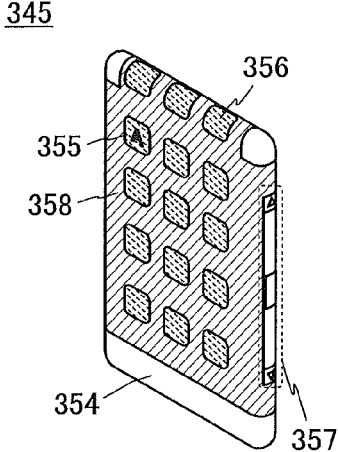
Figure 26E:
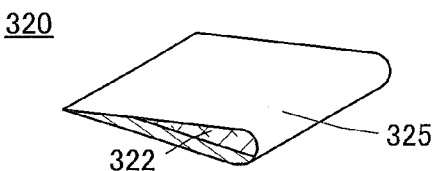

FIGS. 26D and 26E each illustrate a foldable portable information terminal 320. FIG. 26D illustrates the portable information terminal 320 that is folded so that a display portion 322 is on the outside. FIG. 26E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The touch panel in one embodiment of the present invention can be used for the display portion 322.

FIG. 26F is a perspective view illustrating an external shape of the portable information terminal 330. FIG. 26G is a top view of the portable information terminal 330. FIG. 26H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 26F and 26H). In addition, information 337 indicated by dashed rectangles can be displayed on another surface (FIGS. 26G and 26H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 26F and 26G illustrate an example in which the information 337 is displayed at the top, one embodiment of the present invention is not limited thereto. The information may be displayed, for example, on the side as in the portable information terminal 340 illustrated in FIG. 26H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A touch panel of one embodiment of the present invention can be used for a display portion 333 mounted in each of a housing 335 of the portable information terminal 330 and a housing 336 of the portable information terminal 340. According to one embodiment of the present invention, a highly reliable touch panel having a curved display portion can be provided with a high yield.

As in a portable information terminal 345 illustrated in FIG. 26I, data may be displayed on three or more surfaces. Here, data 355, data 356, and data 357 are displayed on different surfaces.

The touch panel of one embodiment of the present invention can be used for a display portion 358 included in a housing 354 of the portable information terminal 345. According to one embodiment of the present invention, a highly reliable touch panel having a curved display portion can be provided with a high yield.

This embodiment can be combined with any other embodiment as appropriate.

(Embodiment 5)

In this embodiment, a structure of an oxide semiconductor included in a touch sensor or a touch panel of one embodiment of the present invention is described.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. Furthermore, the term "perpendicular" indicates that the angle formed between two straight lines is greater than or equal to $80°$ and less than or equal to $100°$, and accordingly also includes the case where the angle is greater than or equal to $85°$ and less than or equal to $95°$. The term "substantially perpendicular" indicates that the angle formed between two straight lines is greater than or equal to $60°$ and less than or equal to $120°$.

In this specification, trigonal and rhombohedral crystal systems are included in a hexagonal crystal system.

<Structure of Oxide Semiconductor>

First, a structure of an oxide semiconductor is described.

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 27A:
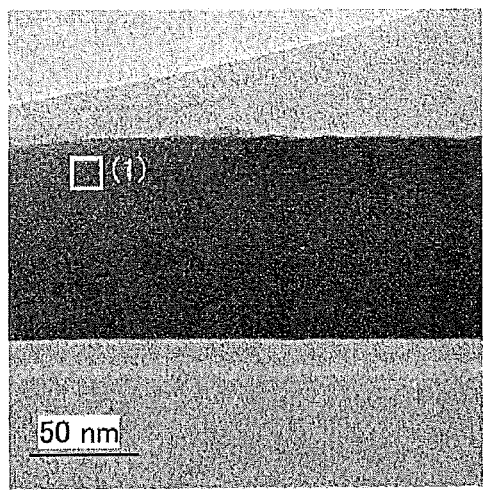
FIGS. 27A to 27D are Cs-corrected high-resolution TEM images of a cross section of a CAAC-OS and a cross-sectional schematic view of the CAAC-OS.

The CAAC-OS observed with a TEM is described below. FIG. 27A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 27B:
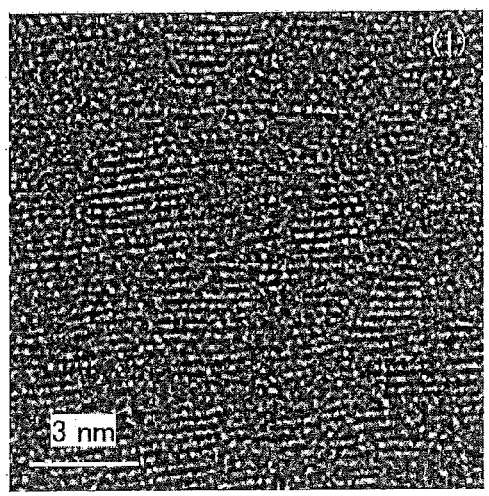

FIG. 27B is an enlarged Cs-corrected high-resolution TEM image of a region (1) in FIG. 27A. FIG. 27B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 27C:
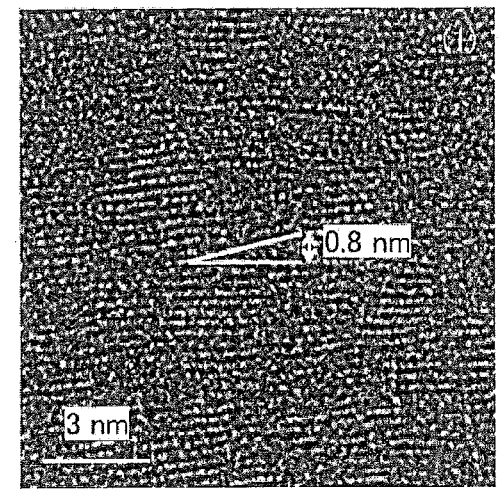

As shown in FIG. 27B, the CAAC-OS has a characteristic atomic arrangement. The characteristic atomic arrangement is denoted by an auxiliary line in FIG. 27C. FIGS. 27B and 27C prove that the size of a pellet is approximately 1 nm to 3 nm, and the size of a space caused by tilt of the pellets is approximately 0.8 nm Therefore, the pellet can also be referred to as a nanocrystal (nc). Furthermore, the CAAC-OS can also be referred to as an oxide semiconductor including c-axis aligned nanocrystals (CANC).

Figure 27D:
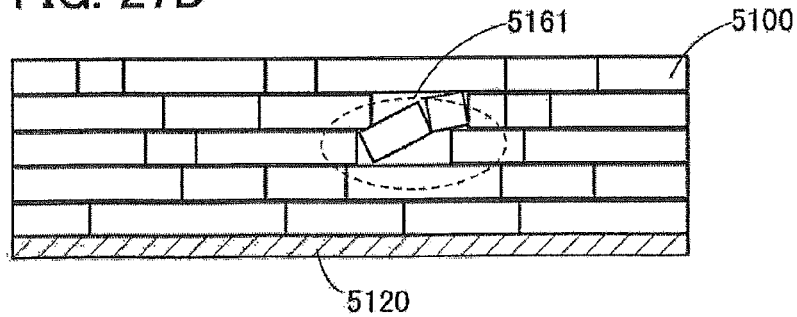

Here, according to the Cs-corrected high-resolution TEM images, the schematic arrangement of pellets 5100 of a CAAC-OS over a substrate 5120 is illustrated by such a structure in which bricks or blocks are stacked (FIG. 27D). The part in which the pellets are tilted as observed in FIG. 27C corresponds to a region 5161 shown in FIG. 27D.

FIG. 28A shows a Cs-corrected high-resolution TEM image of a plane of the CAAC-OS observed from a direction substantially perpendicular to the sample surface. FIGS. 28B, 28C, and 28D are enlarged Cs-corrected high-resolution TEM images of regions (1), (2), and (3) in FIG. 28A, respectively. FIGS. 28B, 28C, and 28D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 29A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 29B, a peak is not clearly observed. In contrast, in the case of a single crystal oxide semiconductor of $InGaZnO_4$, when $\phi$ scan is performed with $2\theta$ fixed at around 56°, as shown in FIG. 29C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 30A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30B shows a diffraction pattern obtained in such a manner that an electron beam with a probe diameter of 300 nm is incident on the same sample in a direction perpendicular to the sample surface. As shown in FIG. 30B, a ring-like diffraction pattern is observed. Thus, the electron diffraction also indicates that the a-axes and b-axes of the pellets included in the CAAC-OS do not have regular alignment. The first ring in FIG. 30B is considered to be derived from the (010) plane, the (100) plane, and the like of the $InGaZnO_4$ crystal. The second ring in FIG. 30B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 31:
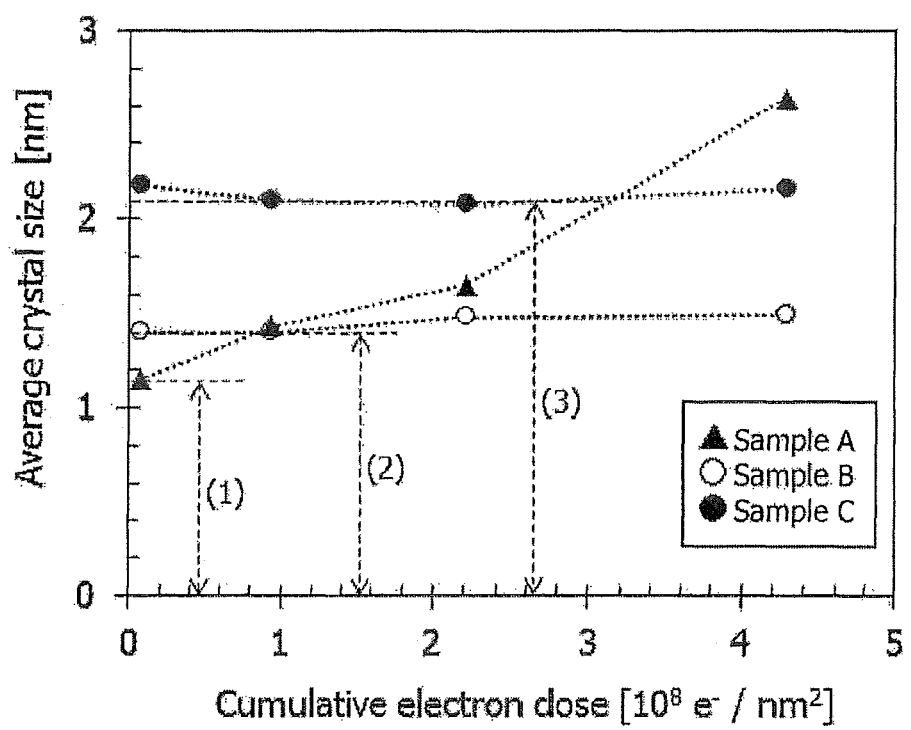
FIG. 31 shows a change in crystal part of an In—Ga—Zn oxide induced by electron irradiation.

FIG. 31 shows change in the average size of crystal parts (at 22 points to 45 points) in each sample. Note that the crystal part size corresponds to the length of a lattice fringe. FIG. 31 indicates that the crystal part size in the a-like OS increases with an increase in the cumulative electron dose. Specifically, as shown by (1) in FIG. 31, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 31, the average crystal sizes in an nc-OS and a CAAC-OS are approximately 1.4 inn and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Deposition Model>

Deposition models of a CAAC-OS and an nc-OS are described below.

Figure 32A:
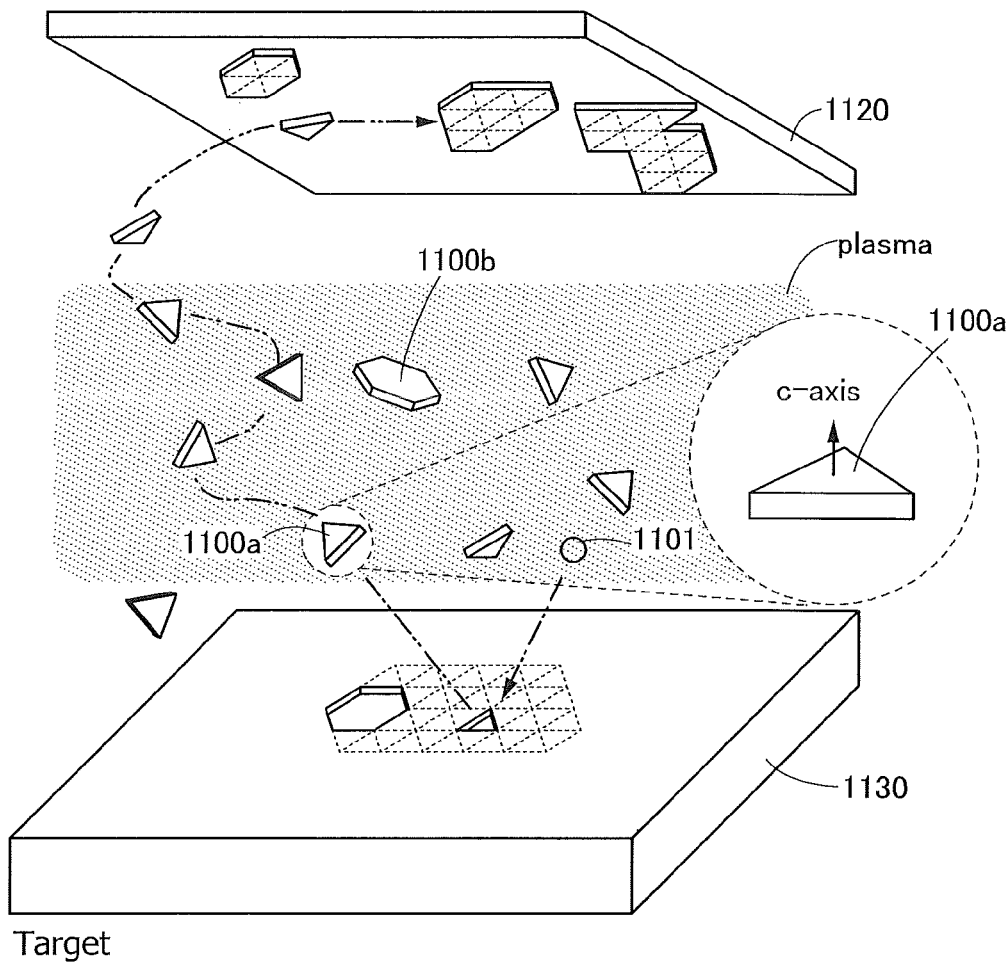
FIG. 32A schematically illustrates a CAAC-OS deposition model.

FIG. 32A is a schematic view of the inside of a deposition chamber where a CAAC-OS is deposited by a sputtering method.

A target 1130 is attached to a backing plate. Under the target 1130 and the backing plate, a plurality of magnets are provided. The plurality of magnets cause a magnetic field over the target 1130. A sputtering method in which the disposition speed is increased by utilizing a magnetic field of magnets is referred to as a magnetron sputtering method.

The target 1130 has a polycrystalline structure in which a cleavage plane exists in at least one crystal grain. Note that the details of the cleavage plane are described later.

A substrate 1120 is placed to face the target 1130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 1130, and plasma is observed. Note that the magnetic field over the target 1130 forms a high-density plasma region. In the high-density plasma region, the deposition gas is ionized, so that an ion 1101 is generated. Examples of the ion 1101 include an oxygen cation (O$^+$) and an argon cation (Ar$^+$).

The ion 1101 is accelerated to the target 1130 side by an electric field, and collides with the target 1130 eventually. At this time, a pellet 1100a and a pellet 1100b which are flat-plate-like or pellet-like sputtered particles are separated and sputtered from the cleavage plane. Note that structures of the pellet 1100a and the pellet 1100b may be distorted by an impact of collision of the ion 1101.

The pellet 1100a is a flat-plate-like (pellet-like) sputtered particle having a triangle plane, e.g., regular triangle plane. The pellet 1100b is a flat-plate-like (pellet-like) sputtered particle having a hexagon plane, e.g., regular hexagon plane. Note that flat-plate-like or pellet-like sputtered particles such as the pellet 1100a and the pellet 1100b are collectively called pellets 1100. The shape of a flat plane of the pellet 1100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 1100 is determined depending on the kind of the deposition gas and the like. The thicknesses of the pellets 1100 are preferably uniform; the reasons thereof are described later. In addition, the sputtered particle preferably has a pellet shape with a small thickness as compared to a dice shape with a large thickness.

Figure 34:
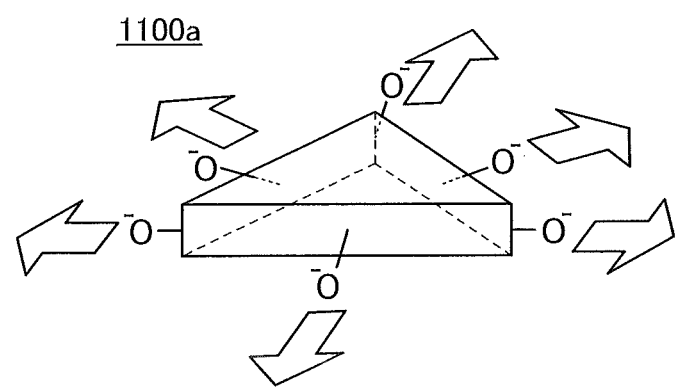
FIG. 34 illustrates a pellet.

The pellet 1100 receives charge when passing through the plasma, so that side surfaces of the pellet 1100 are negatively or positively charged in some cases. The pellet 1100 includes an oxygen atom on its side surface, and the oxygen atom may be negatively charged. For example, a case in which the pellet 1100a includes, on its side surfaces, oxygen atoms that are negatively charged is illustrated in FIG. 34. As in this view, when the side surfaces are charged in the same polarity, charges repel each other, and accordingly, the pellet 1100a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 35:
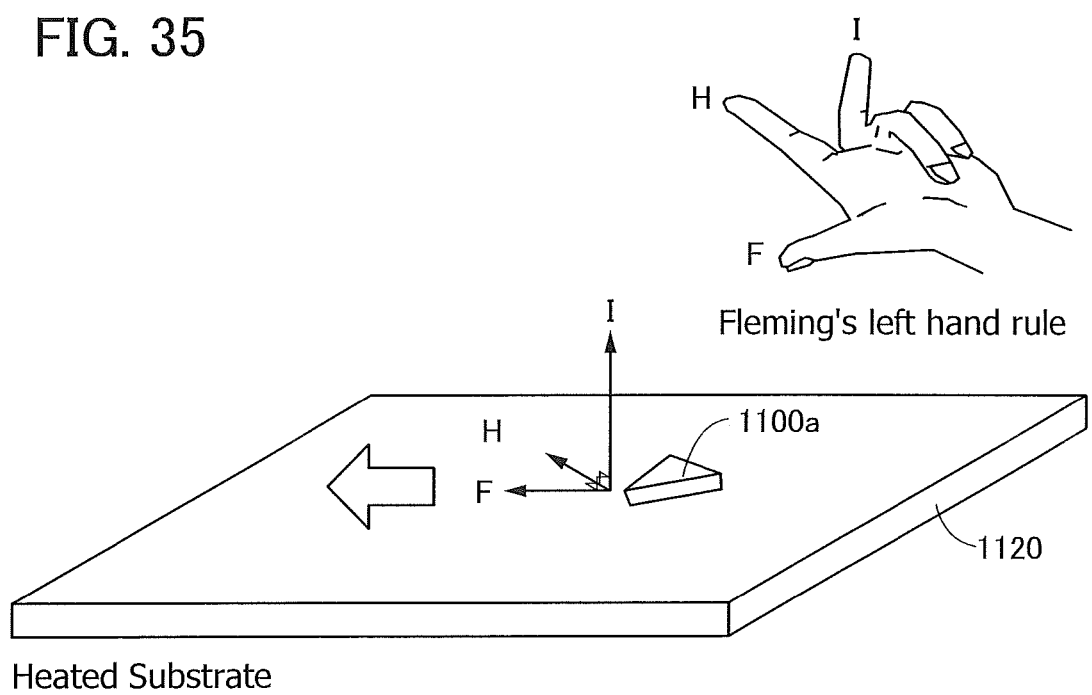
FIG. 35 illustrates force applied to a pellet on a formation surface.

As shown in FIG. 32A, the pellet 1100 flies like a kite in plasma and flutters up to the substrate 1120. Since the pellets 1100 are charged, when the pellet 1100 gets close to a region where another pellet 1100 has already been deposited, repulsion is generated. Here, above the substrate 1120, a magnetic field is generated in a direction parallel to a top surface of the substrate 1120. A potential difference is given between the substrate 1120 and the target 1130, and accordingly, current flows from the substrate 1120 toward the target 1130. Thus, the pellet 1100 is given a force (Lorentz force) on the top surface of the substrate 1120 by an effect of the magnetic field and the current (see FIG. 35). This is explainable with Fleming's left-hand rule. In order to increase a force applied to the pellet 1100, it is preferable to provide, on the top surface, a region where the magnetic field in a direction parallel to the top surface of the substrate 1120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 1120 is 1.5 times or higher, preferably twice or higher, further preferably 3 times or higher, still further preferably 5 times or higher as high as the magnetic field in a direction perpendicular to the top surface of the substrate 1120.

Figure 36A:
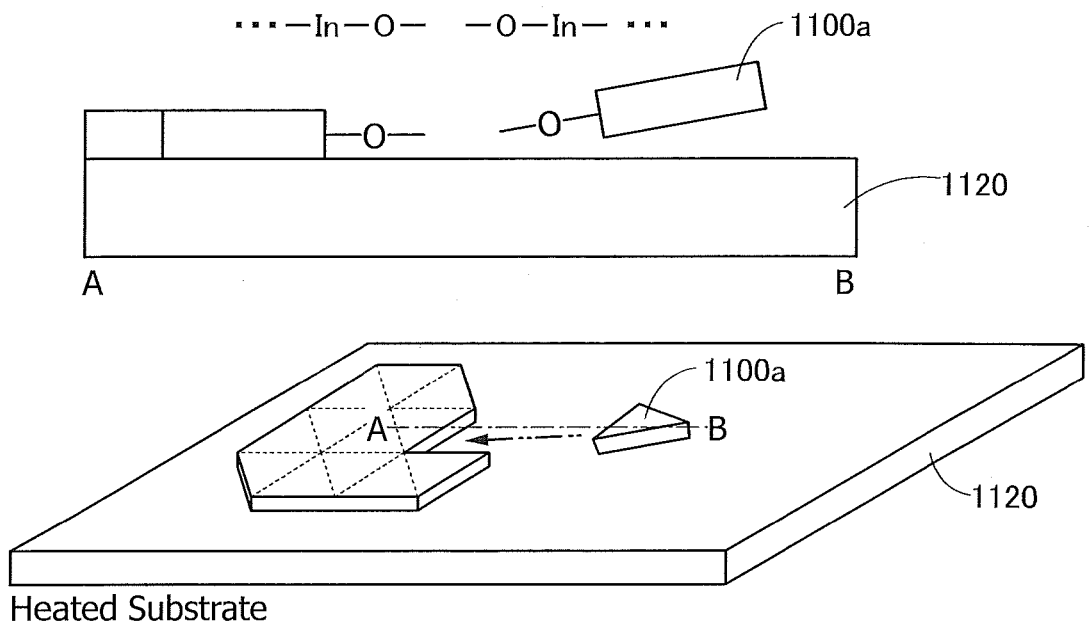
FIGS. 36A and 36B illustrate movement of a pellet on a formation surface.
Figure 36B:
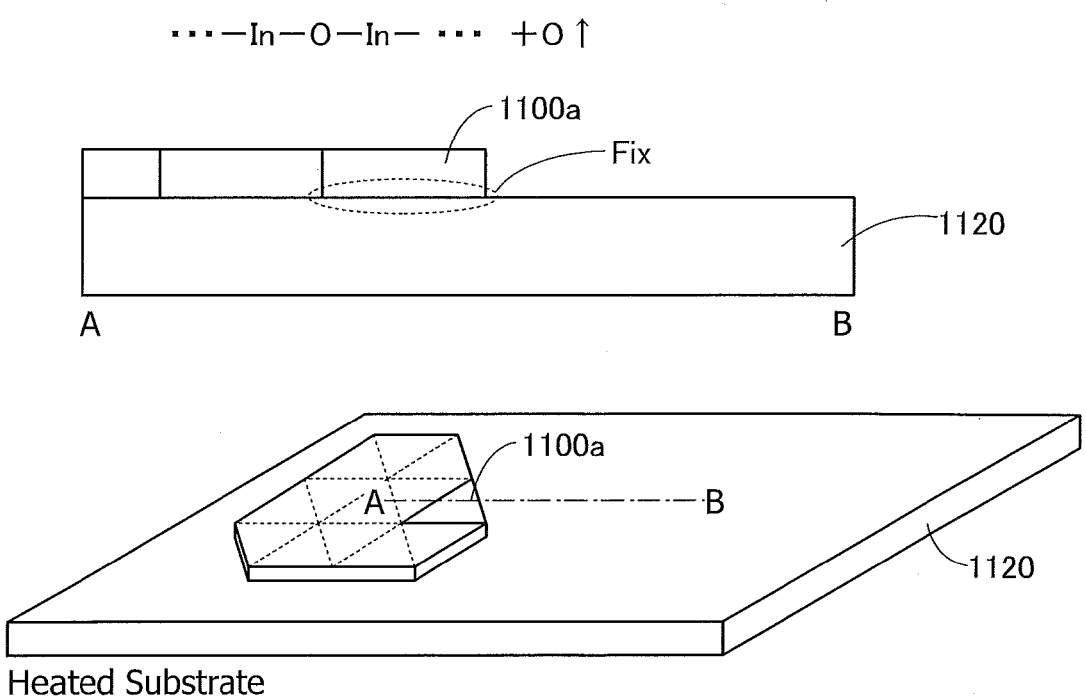

Furthermore, the substrate 1120 is heated, and resistance such as friction between the pellet 1100 and the substrate 1120 is low. As a result, as illustrated in FIG. 36A, the pellet 1100 glides above the surface of the substrate 1120. The glide of the pellet 1100 is caused in a state where the flat plane faces the substrate 1120. Then, as illustrated in FIG. 36B, when the pellet 1100 reaches the side surface of another pellet 1100 that has been already deposited, the side surfaces of the pellets 1100 are bonded. At this time, the oxygen atom on the side surface of the pellet 1100 is released. With the released oxygen atom, oxygen vacancies in a CAAC-OS is filled in some cases; thus, the CAAC-OS has a low density of defect states.

Further, the pellet 1100 is heated on the substrate 1120, whereby atoms are rearranged, and the structure distortion caused by the collision of the ion 1101 can be reduced. The pellet 1100 whose structure distortion is reduced is substantially single crystal. Even when the pellets 1100 are heated after being bonded, expansion and contraction of the pellet 1100 itself hardly occur, which is caused by turning the pellet 1100 into substantially single crystal. Thus, formation of defects such as a grain boundary due to expansion of a space between the pellets 1100 can be prevented, and accordingly, generation of crevasses can be prevented. Further, the space is filled with elastic metal atoms and the like, whereby the elastic metal atoms have a function, like a highway, of jointing side surfaces of the pellets 1100 which are not aligned with each other.

It is considered that as shown in such a model, the pellets 1100 are deposited over the substrate 1120. Thus, a CAAC-OS film can be deposited even when a surface over which a film is formed (film formation surface) does not have a crystal structure, which is different from film deposition by epitaxial growth. For example, even when a surface (film formation surface) of the substrate 1120 has an amorphous structure, a CAAC-OS film can be formed.

Figure 32B:
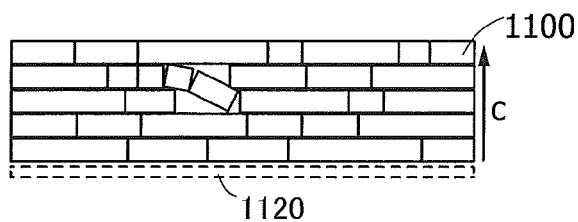
FIGS. 32B and 32C are cross-sectional views of pellets and a CAAC-OS.

Further, it is found that in formation of the CAAC-OS, the pellets 1100 are arranged in accordance with a surface shape of the substrate 1120 that is the film formation surface even when the film formation surface has unevenness besides a flat surface. For example, in the case where the surface of the substrate 1120 is flat at the atomic level, the pellets 1100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 32B).

Figure 32C:
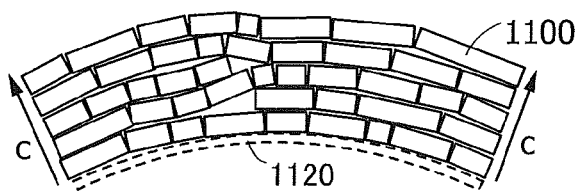

In the case where the top surface of the substrate 1120 has unevenness, a CAAC-OS where n layers (n is a natural number) in each of which the pellets 1100 are arranged along a convex surface are stacked is formed. Since the substrate 1120 has unevenness, a gap is easily generated between in the pellets 1100 in the CAAC-OS in some cases. Note that owing to intermolecular force, the pellets 1100 are arranged so that a gap between the pellets is as small as possible even on the unevenness surface. Therefore, even when the formation surface has unevenness, a CAAC-OS with high crystallinity can be formed (see FIG. 32C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 1120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 1100.

The zinc oxide particle reaches the substrate 1120 before the pellet 1100 does because the zinc oxide particle is smaller than the pellet 1100 in mass. On the surface of the substrate 1120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 1120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

An nc-OS can be understood with a deposition model illustrated in FIG. 33. Note that a difference between FIG. 33 and FIG. 32A lies only in the fact that whether the substrate 1120 is heated or not.

Thus, the substrate 1120 is not heated, and a resistance such as friction between the pellet 1100 and the substrate 1120 is high. As a result, the pellets 1100 cannot glide on the surface of the substrate 1120 and are stacked randomly, thereby forming an nc-OS.

<Cleavage Plane>

A cleavage plane that has been mentioned in the deposition model of the CAAC-OS will be described below.

Figure 37A:
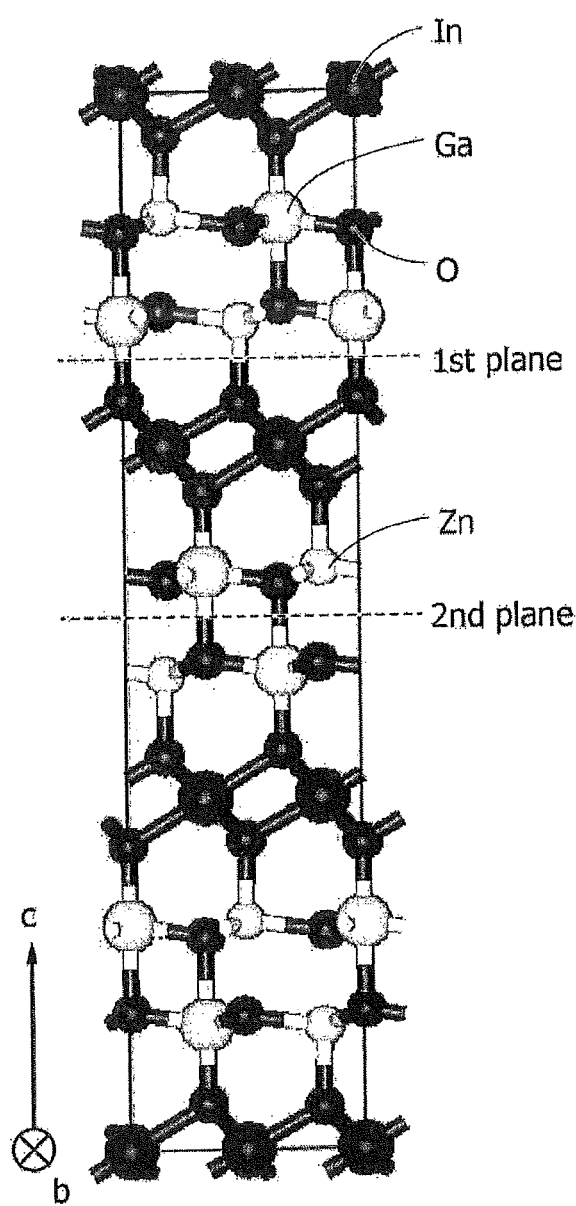
FIGS. 37A and 37B show an $InGaZnO_4$ crystal.
Figure 37B:
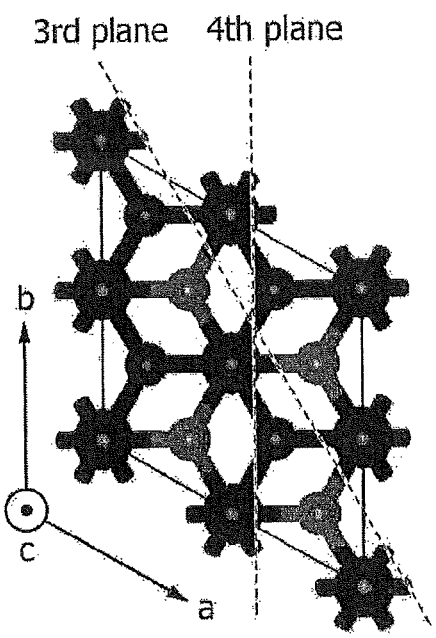

First, a cleavage plane of the target is described using FIGS. 37A and 37B. FIGS. 37A and 37B show a structure of an InGaZnO$_4$ crystal. Note that FIG. 37A shows the structure of the case where an InGaZnO$_4$ crystal is observed from a direction parallel to the b-axis when the c-axis is in an upward direction. Furthermore, FIG. 37B shows a structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal in FIGS. 37A and 37B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 37A). The second plane is a crystal plane between a Ga—Zn—O layer and a Ga—Zn—O layer and is parallel to the (001) plane (or the a-b plane) (see FIG. 37A). The third plane is a crystal plane parallel to the (110) plane (see FIG. 37B). The fourth plane is a crystal plane parallel to the (100) plane (or the b-c plane) (see FIG. 37B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

|  | Cleavage energy [J/m$^2$] |
| --- | --- |
| First plane | 2.60 |
| Second plane | 0.68 |
| Third plane | 2.18 |
| Fourth plane | 2.12 |

From the calculations, in the structure of the InGaZnO$_4$ crystal in FIGS. 37A and 37B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 37A can be separated at two planes equivalent to the second plane. Therefore, in the case where an ion or the like is made to collide with a target, a wafer-like unit (we call this a pellet) which is cleaved at a plane with the lowest cleavage energy is thought to be blasted off as the minimum unit. In that cases, a pellet of InGaZnO$_4$ is composed of three layers of a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 38A:
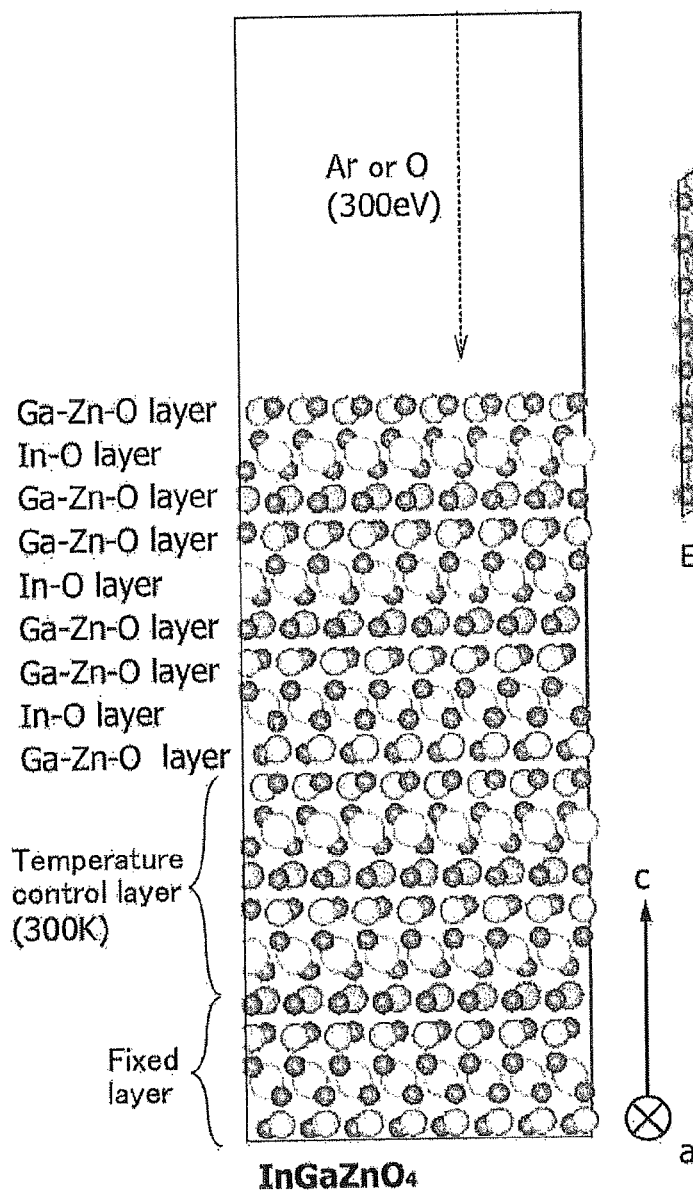
FIGS. 38A and 38B illustrate a structure of $InGaZnO_4$ and the like before collision of an atom.
Figure 38B:
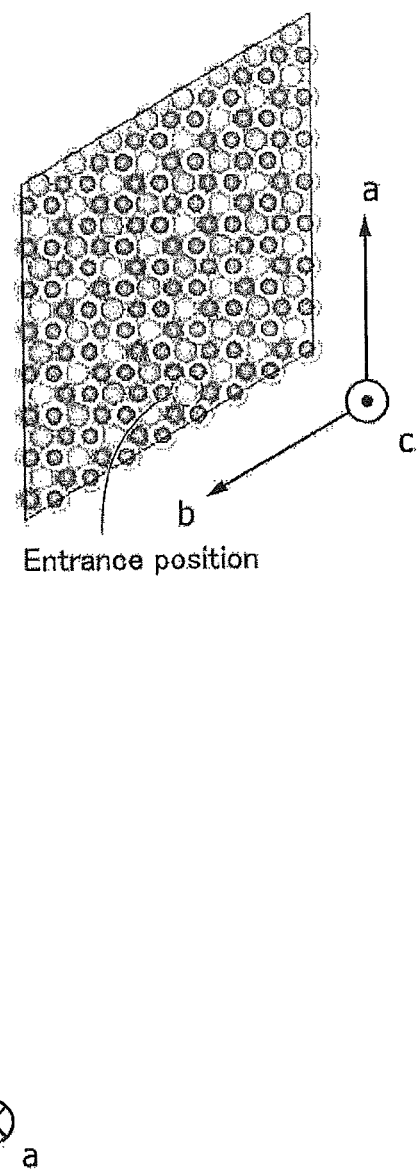

Next, through classical molecular dynamics calculation, on the assumption of an InGaZnO$_4$ crystal having a homologous structure as a target, a cleavage plane is examined in the case where the target is sputtered using argon (Ar) or oxygen (O). FIG. 38A shows a cross-sectional structure of an InGaZnO$_4$ crystal (2688 atoms) used for the calculation, and FIG. 38B shows a top structure thereof. Note that a fixed layer in FIG. 38A is a layer which prevents the positions of the atoms from moving. A temperature control layer in FIG. 38A is a layer whose temperature is constantly set to a fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 39A:
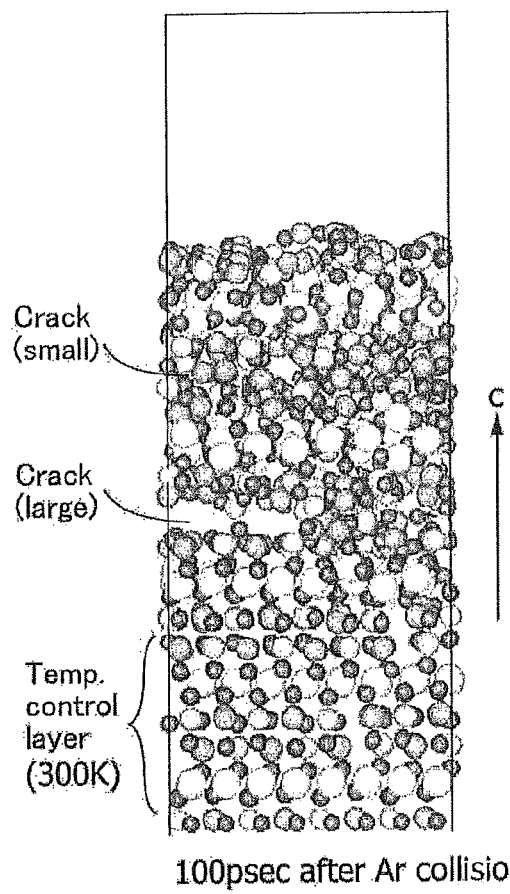
FIGS. 39A and 39B show a structure of $InGaZnO_4$ and the like after collision of an atom.
Figure 39B:
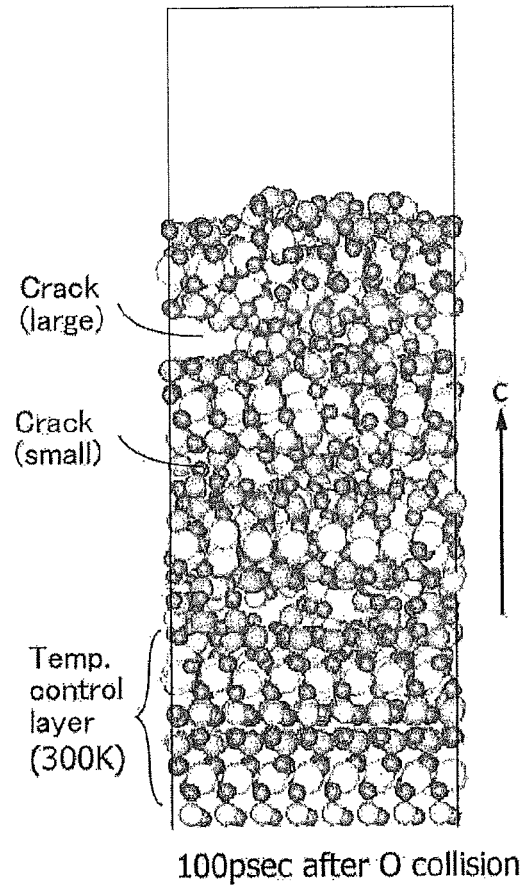

FIG. 39A shows an atomic arrangement when 99.9 picoseconds have passed after argon enters the cell including the InGaZnO$_4$ crystal shown in FIGS. 38A and 38B. FIG. 39B shows an atomic arrangement when 99.9 picoseconds have passed after oxygen enters the cell. Note that in FIGS. 39A and 39B, part of the fixed layer in FIG. 38A is omitted.

According to FIG. 39A, in a period from entry of argon into the cell to when 99.9 picoseconds have passed, a crack is formed from the cleavage plane corresponding to the second plane shown in FIG. 37A. Thus, in the case where argon collides with the InGaZnO$_4$ crystal and the uppermost surface is the second plane (the zero-th), a large crack is found to be formed in the second plane (the second).

On the other hand, according to FIG. 39B, in a period from entry of oxygen into the cell to when 99.9 picoseconds have passed, a crack is found to be formed from the cleavage plane corresponding to the second plane in FIG. 37A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 40A:
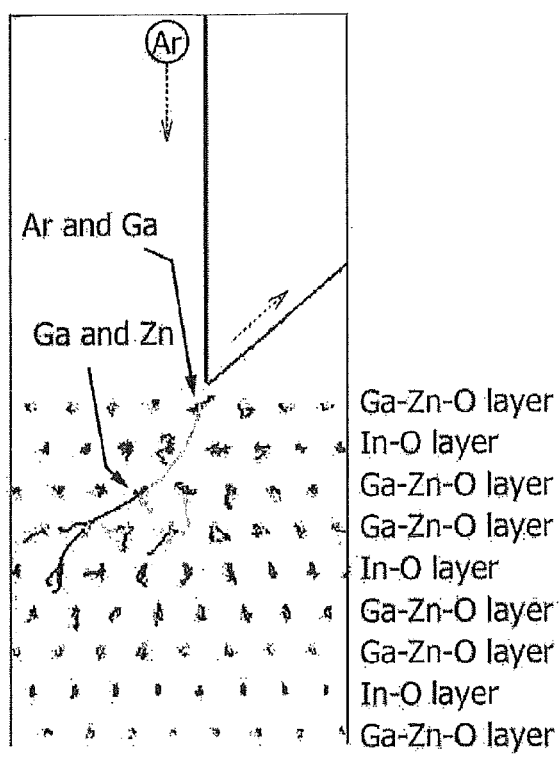
FIGS. 40A and 40B show trajectories of atoms after collision of atoms.

FIG. 40A shows trajectories of the atoms from 0 picosecond to 0.3 picoseconds after argon enters the cell including the InGaZnO$_4$ crystal shown in FIGS. 38A and 38B. Accordingly, FIG. 40A corresponds to a period from FIGS. 38A and 38B to FIG. 39A.

According to FIG. 40A, when argon collides with gallium (Ga) of the first layer (Ga—Zn—O layer) counted from the top, the gallium collides with zinc (Zn) of the third layer (Ga—Zn—O layer) counted from the top and then, the zinc reaches the vicinity of the sixth layer (Ga—Zn—O layer) counted from the top. Note that the argon which collides with the gallium is sputtered to the outside. Accordingly, in the case where argon collides with the target including the InGaZnO$_4$ crystal, a crack is thought to be formed in the second plane (the second) in FIG. 38A.

Figure 40B:
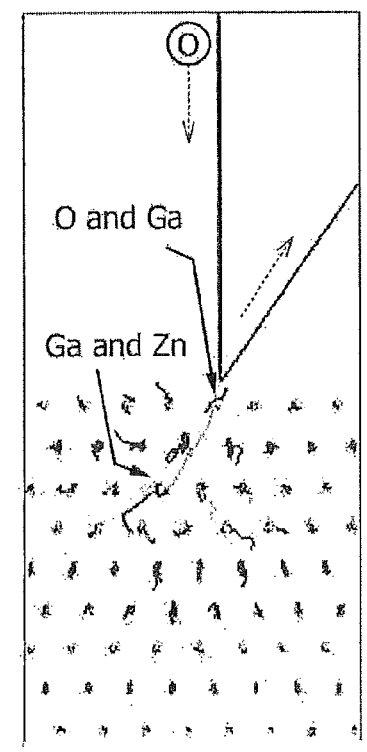

FIG. 40B shows trajectories of the atoms from 0 picosecond to 0.3 picoseconds after oxygen enters the cell including the InGaZnO$_4$ crystal shown in FIGS. 38A and 38B. Accordingly, FIG. 40B corresponds to a period from FIGS. 38A and 38B to FIG. 39A.

On the other hand, according to FIG. 40B, when oxygen collides with gallium (Ga) of the first layer (Ga—Zn—O layer) counted from the top, the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly, in the case where oxygen collides with the target including the InGaZnO$_4$ crystal, a crack is thought to be formed in the second plane (the first) in FIG. 38A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $V_A$ represents the speed of argon or oxygen before collision, $V'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]
$$E = \frac{1}{2}m_A v_A^2 + \frac{1}{2}M_{Ga}v_{Ga}^2 \quad (1)$$

[Formula 2]
$$m_A v_A + m_{Ga}v_{Ga} = m_A v'_A + m_{Ga}v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]
$$v'_A - v'_{Ga} = -(v_A - v_{Ga}) \quad (3)$$

From the formulae (1), (2), and (3), on the assumption that $v_{Ga}$ is 0, the speed of gallium $v'_{Ga}$ after collision of argon or oxygen can be represented by the following formula (4).

[Formula 4]
$$v'_{Ga} = \frac{\sqrt{m_A}}{m_A + m_{Ga}} \cdot 2\sqrt{2E} \quad (4)$$

In the formula (4), mass of argon or oxygen is substituted into $M_A$, whereby the speeds of gallium after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 32A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 41A:
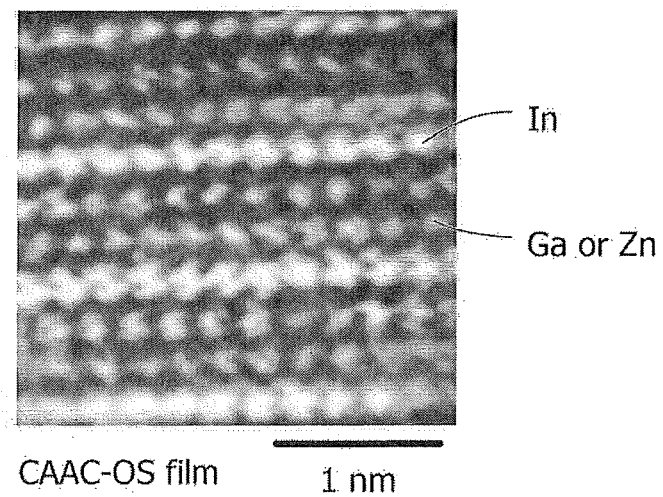
FIGS. 41A and 41B are cross-sectional HAADF-STEM images of a CAAC-OS and a target.
Figure 41B:
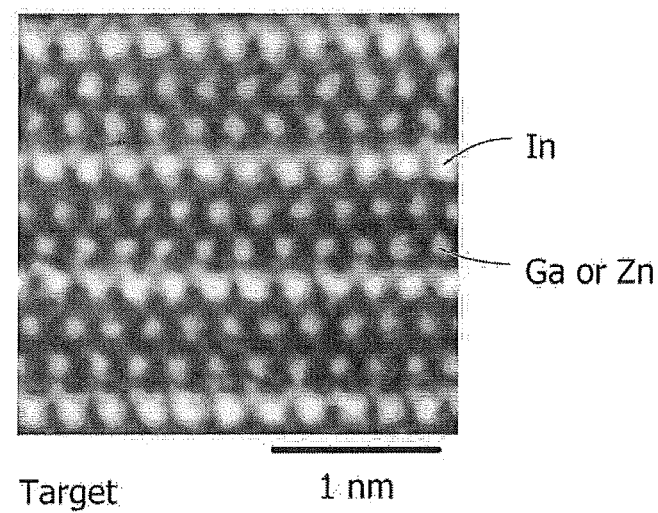

FIGS. 41A and 41B show atomic arrangements of cross sections of an In—Ga—Zn oxide (see FIG. 41A) that is a CAAC-OS deposited by a sputtering method and a target thereof (see FIG. 41B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 41A and FIG. 41B are compared, it is found that the CAAC-OS and the target each have a homologous structure and arrangements of atoms in the CAAC-OS correspond to those in the target. Thus, as illustrated in the deposition model in FIG. 32A, the crystal structure of the target is transferred, whereby a CAAC-OS is formed.

(Embodiment 6)

In this embodiment, an oxygen vacancy of an oxide semiconductor film is described in detail below.

<(1) Ease of Formation and Stability of V$_o$H>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy V$_o$ if the oxygen vacancy V$_o$ exists in IGZO. A state in which H is in an oxygen vacancy V$_o$ is referred to as V$_o$H.

Figure 42:
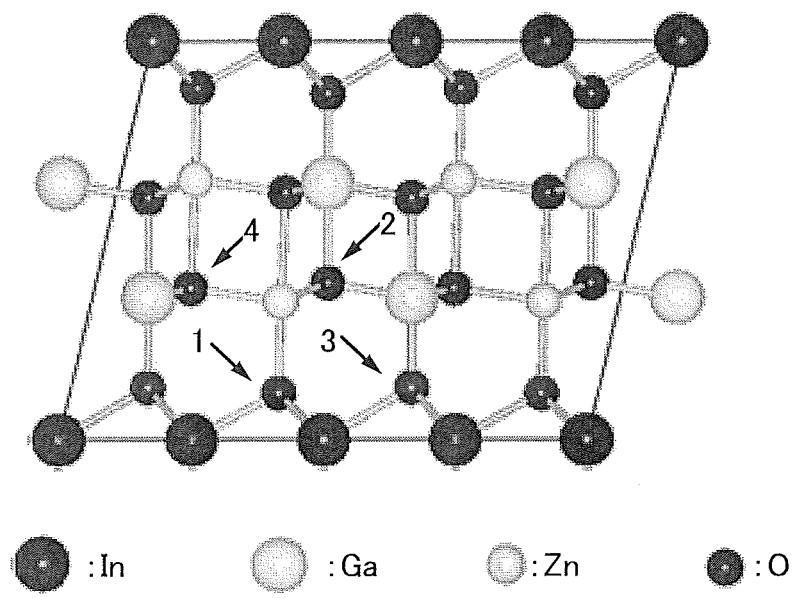
FIG. 42 shows a calculation model.

An InGaZnO$_4$ crystal model shown in FIG. 42 was used for calculation. The activation barrier (E$_a$) along the reaction path where H in V$_o$H is released from V$_o$ and bonded to oxygen was calculated by a nudged elastic band (NEB) method. The calculation conditions are shown in Table 2.

TABLE 2

| Software | VASP |
| --- | --- |
| Calculation method | NEB method |
| Functional | GGA-PBE |
| Pseudopotential | PAW |
| Cut-off energy | 500 eV |
| K points | 2 × 2 × 3 |

In the InGaZnO$_4$ crystal model, there are oxygen sites 1 to 4 as shown in FIG. 42 which differ from each other in metal elements bonded to oxygen and the number of bonded metal elements. Here, calculation was made on the oxygen sites 1 and 2 in which an oxygen vacancy $V_o$ is easily formed.

First, calculation was made on the oxygen site in which an oxygen vacancy $V_o$ is easily formed: an oxygen site 1 that was bonded to three In atoms and one Zn atom.

Figure 43A:
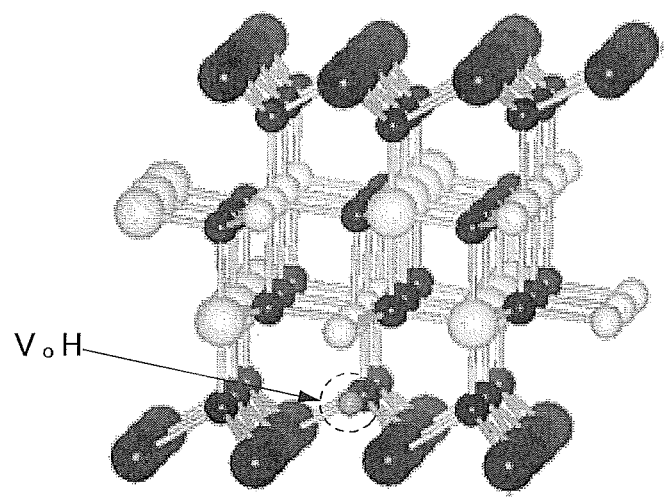
FIGS. 43A and 43B show an initial state and a final state, respectively.
Figure 43B:
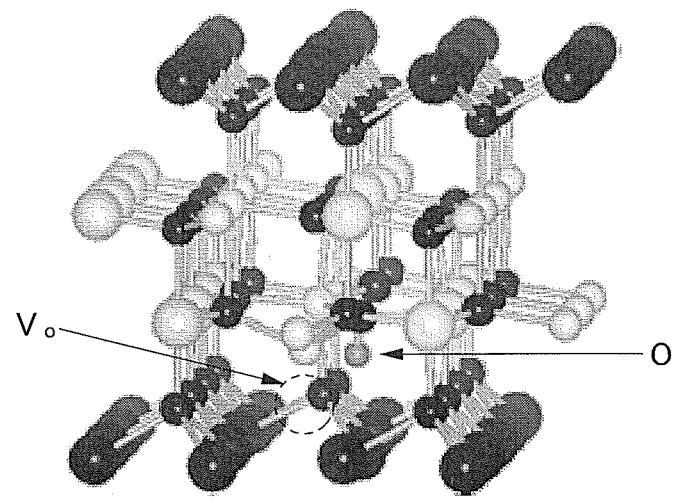
Figure 44:
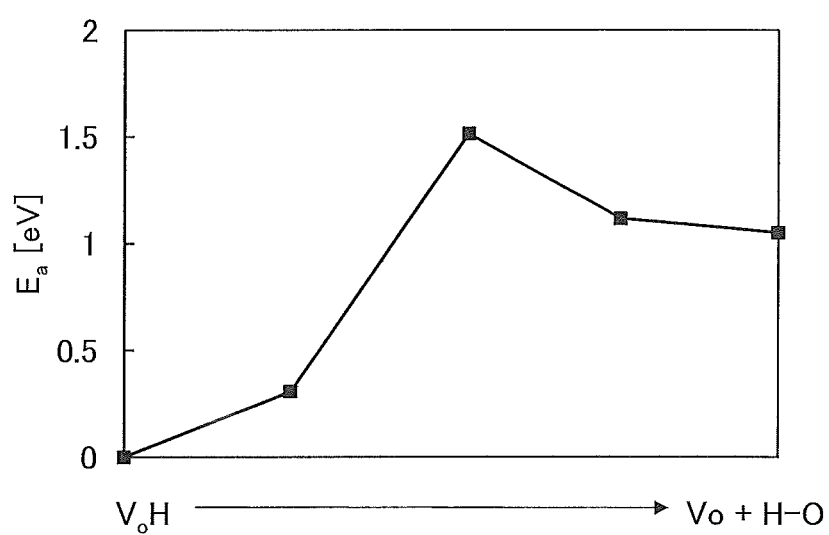
FIG. 44 shows an activation barrier.

FIG. 43A shows a model in the initial state and FIG. 43B shows a model in the final state. FIG. 44 shows the calculated activation barrier (E$_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.52 eV, while entry of H bonded to O into an oxygen vacancy $V_o$ needs an energy of approximately 0.46 eV.

Reaction frequency (Γ) was calculated with use of the activation barriers (E$_a$) obtained by the calculation and Formula 6. In Formula 5, k$_B$ represents the Boltzmann constant and T represents the absolute temperature.

$$\Gamma = v\exp\left(-\frac{E_a}{k_B T}\right) \quad \text{[Formula 5]}$$

The reaction frequency at 350° C. was calculated on the assumption that the frequency factor v=10$^{13}$ [1/sec]. The frequency of H transfer from the model shown in FIG. 43A to the model shown in FIG. 43B was 5.52×10$^0$ [1/sec], whereas the frequency of H transfer from the model shown in FIG. 43B to the model shown in FIG. 43A was 1.82×10$^9$ [1/sec]. This suggests that H diffusing in IGZO is likely to form $V_oH$ if an oxygen vacancy $V_o$ exists in the neighborhood, and H is unlikely to be released from the oxygen vacancy $V_o$ once $V_oH$ is formed.

Next, calculation was made on the oxygen site in which an oxygen vacancy $V_o$ is easily formed: an oxygen site 2 that was bonded to one Ga atom and two Zn atoms.

Figure 45A:
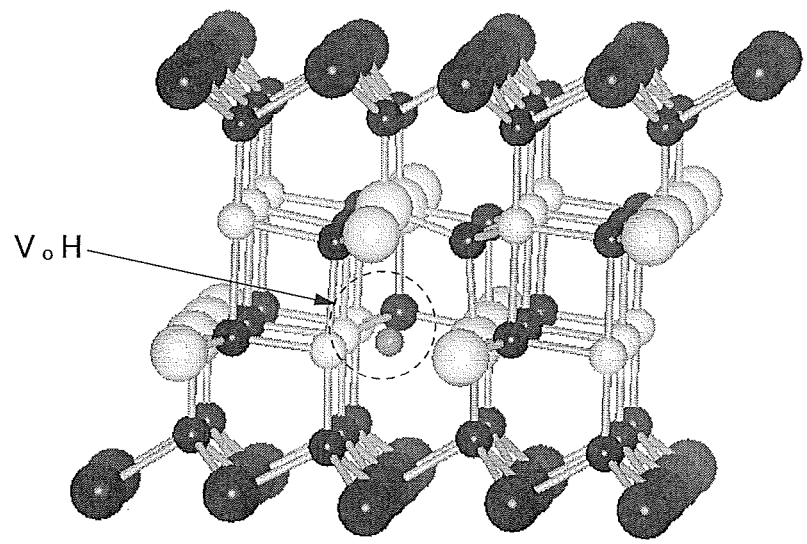
FIGS. 45A and 45B illustrate an initial state and a final state, respectively.
Figure 45B:
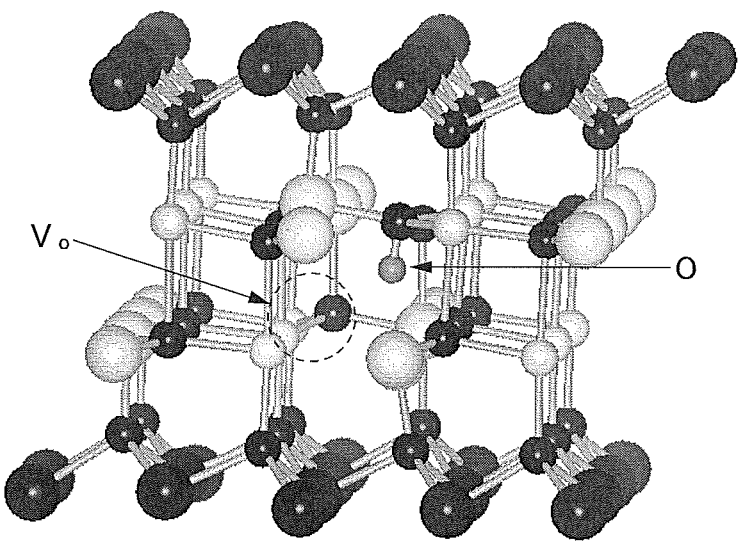
Figure 46:
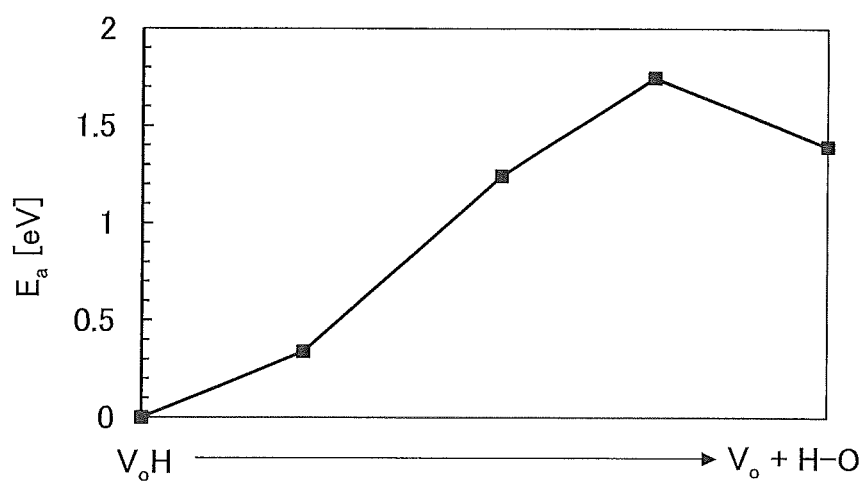
FIG. 46 shows an activation barrier.

FIG. 45A shows a model in the initial state and FIG. 45B shows a model in the final state. FIG. 46 shows the calculated activation barrier (E$_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.75 eV, while entry of H bonded to O in an oxygen vacancy $V_o$ needs an energy of approximately 0.35 eV.

Reaction frequency (Γ) was calculated with use of the activation barriers (E$_a$) obtained by the calculation and Formula 5.

The reaction frequency at 350° C. was calculated on the assumption that the frequency factor v=10$^{13}$ [1/sec]. The frequency of H transfer from the model shown in FIG. 45A to the model shown in FIG. 45B was 7.53×10$^{-2}$ [1/sec], whereas the frequency of H transfer from the model shown in FIG. 45B to the model shown in FIG. 45A was 1.44×10$^{10}$ [1/sec]. This suggests that H is unlikely to be released from the oxygen vacancy $V_o$ once $V_oH$ is formed.

From the above results, it was found that H in IGZO easily diffused in annealing and if an oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where an oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is the InGaZnO$_4$ crystal model (112 atoms). $V_oH$ models of the oxygen sites 1 and 2 shown in FIG. 42 were made to calculate the transition levels. The calculation conditions are shown in Table 3.

TABLE 3

| Software | VASP |
| --- | --- |
| Model | InGaZnO$_4$ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The fraction of the exact exchange was adjusted to have a band gap close to the experimental value. As a result, the band gap of the InGaZnO$_4$ crystal model without defects was 3.08 eV that is close to the experimental value, 3.15 eV.

The transition level (ε(q/q')) of a model having defect D can be calculated by the following Formula 6. Note that ΔE(D$^q$) represents the formation energy of defect D at charge q, which is calculated by Formula 7.

$$\varepsilon(q/q') = \frac{\Delta E(D^q) - \Delta E(D^{q'})}{q' - q} \quad \text{[Formula 6]}$$

$$\Delta E(D^q) = \quad \text{[Formula 7]}$$
$$E_{tot}(D^q) - E_{tot}(\text{bulk}) + \sum_i \Delta n_i \mu_i + q(\varepsilon_{VBM} + \Delta V_q + E_F)$$

In Formulae 6 and 7, E$_{tot}$(D$^q$) represents the total energy of the model having defect D at the charge q, E$_{tot}$(bulk) represents the total energy in a model without defects (complete crystal), Δn$_i$ represents a change in the number of atoms i contributing to defects, μ$_1$ represents the chemical potential of atom i, ε$_{VBM}$ represents the energy of the valence band maximum in the model without defects, ΔV$_q$ represents the correction term relating to the electrostatic potential, and E$_F$ represents the Fermi energy.

Figure 47:
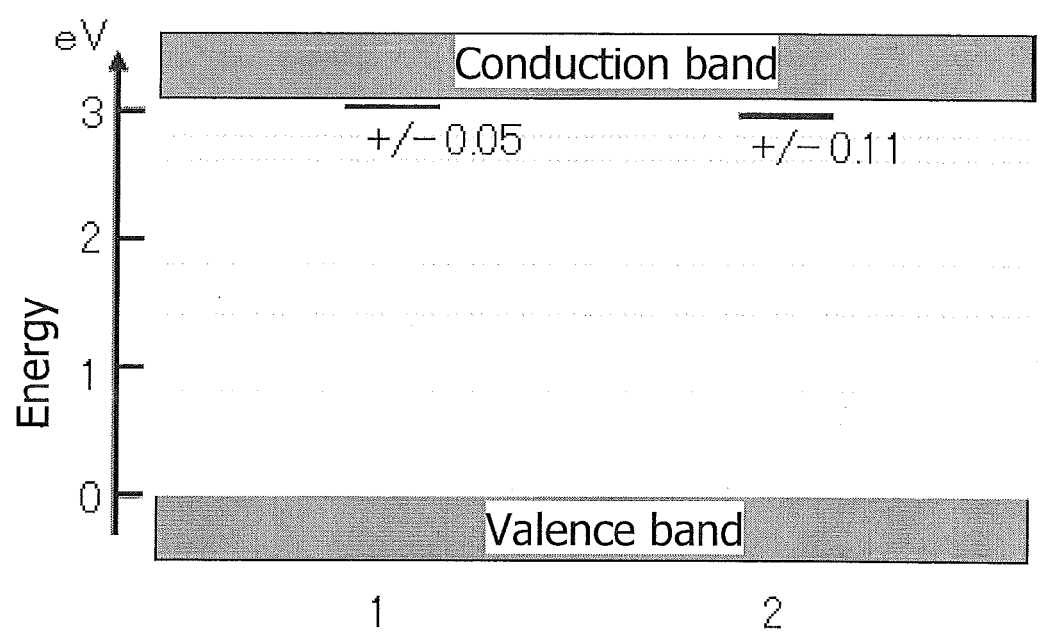
FIG. 47 shows the transition levels of $V_oH$.

FIG. 47 shows the transition levels of $V_oH$ obtained from the above formulae. The numbers in FIG. 47 represent the depth from the conduction band minimum. In FIG. 47, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ would be related to electron traps, that is, $V_oH$ was found to behave as a donor. It was also found that IGZO including $V_oH$ had conductivity.

The structure described in this embodiment can be used in appropriate combination with the structure described in any of the other embodiments.

REFERENCE NUMERALS

10U: sensor unit, 14: window portion, 16: base material, 17: protective base material, 17p: protective layer, 19: sensor circuit, 51a: formation substrate, 51b: formation substrate, 51c: formation substrate, 53a: separation layer, 53b: separation layer, 53c: separation layer, 55a: insulating film, 55b: insulating film, 55c: insulating film, 56: functional layer, 57: functional layer, 58: functional layer, 59a: bonding layer, 59b: bonding layer, 59c: bonding layer, 59d: bonding layer, 60a: flexible substrate, 60b: flexible substrate, 100: input device, 102: transistor, 103: transistor, 104: transistor, 105: capacitor, 106: transistor, 107: light-emitting element, 108: contact portion, 109: capacitor portion, 139: opening portion, 140a: opening portion, 140b: opening portion, 141: film, 142: oxygen, 143: impurity element, 145: mask, 201: formation substrate, 203: separation layer, 205: layer to be separated, 207: bonding layer, 221: formation substrate, 223: separation layer, 225: layer to be separated, 231: substrate, 233: bonding layer, 301: insulating film, 302: substrate, 303: conductive film, 303a: conductive film, 303b: conductive film, 304: conductive film, 304a: conductive film, 304b: conductive film, 305: insulating film, 306: conductive film, 306a: conductive film, 306b: conductive film, 307: oxide semiconductor layer, 307a: oxide semiconductor layer, 307b: oxide semiconductor layer, 308: oxide semiconductor layer, 308a: oxide semiconductor layer, 308b: oxide conductor layer, 308c: oxide semiconductor layer, 309: oxide semiconductor layer, 309a: oxide semiconductor layer, 309b: oxide semiconductor layer, 310: portable information terminal, 310a: conductive film, 310a1: conductive film, 310a2: conductive film, 310b: conductive film, 310b1: conductive film, 310b2: conductive film, 311: conductive film, 311a: conductive film, 311b: conductive film, 312: insulating film, 312a: insulating film, 312b: insulating film, 313: hinge, 314: insulating film, 315: housing, 316: display panel, 320: portable information terminal, 322: display portion, 325: non-display portion, 330: portable information terminal, 332a: channel region, 332b: low-resistance region, 332c: low-resistance region, 333: display portion, 335: housing, 336: housing, 337: information, 338: insulating film, 338a: insulating film, 338b: insulating film, 338x: insulating film, 339: operation button, 340: portable information terminal, 342: substrate, 344: bonding layer, 345: portable information terminal, 346: conductive film, 346a: conductive film, 346b: conductive film, 348: insulating film, 348a: insulating film, 348b: insulating film, 350: conductive film, 354: housing, 355: data, 356: data, 357: data, 358: display portion, 360: conductive film, 361: lower electrode, 362: opening portion, 363: optical adjustment layer, 365: EL layer, 367: upper electrode, 371: insulating film, 373: insulating film, 375: spacer, 392: flexible substrate, 392a: flexible substrate, 392b: flexible substrate, 392c: flexible substrate, 394: bonding layer, 394a: bonding layer, 394b: bonding layer, 394c: bonding layer, 396: bonding layer, 398: flexible substrate, 500: touch panel, 501: display portion, 502: pixel, 502B: sub-pixel, 502G: sub-pixel, 502R: sub-pixel, 503g: scan line driver circuit, 510: base material, 511: wiring, 519: terminal, 567p: anti-reflective layer, 808: FPC, 814: conductive film, 825: connector, 825a: connector, 857a: conductive film, 857b: conductive film, 1100: pellet, 1100a: pellet, 1100b: pellet, 1101: ion, 1120: substrate, 1130: target, 5100: pellet, 5120: substrate, 5161: region, 7100: portable information terminal, 7101: housing, 7102: display portion, 7103: band, 7104: buckle, 7105: operation button, 7106: input/output terminal, 7107: icon, 7200: lighting device, 7201: stage, 7202: light-emitting portion, 7203: operation switch, 7210: lighting device, 7212: light-emitting portion, 7220: lighting device, 7222: light-emitting portion, 7300: touch panel, 7301: housing, 7302: display portion, 7303: operation button, 7304: pull, 7305: control portion, 7400: mobile phone, 7401: housing, 7402: display portion, 7403: operation button, 7404: external connection port, 7405: speaker, 7406: microphone.

This application is based on Japanese Patent Application serial no. 2014-045110 filed with Japan Patent Office on Mar. 7, 2014, and Japanese Patent Application serial no. 2014-050732 filed with Japan Patent Office on Mar. 13, 2014, the entire contents of which are hereby incorporated by reference.

The invention claimed is:

1. A touch sensor comprising:
a circuit comprising:
a transistor, a channel formation region of the transistor comprising an oxide semiconductor layer; and
a capacitor comprising a pair of electrodes, one of the pair of electrodes comprising an oxide conductor layer,
wherein one of a source and a drain of the transistor is electrically connected to one of the pair of electrodes of the capacitor,
wherein the circuit is configured to output a signal based on a change in a capacitance of the capacitor,
wherein the oxide semiconductor layer is provided separately from the oxide conductor layer,
wherein an insulating film is provided over the oxide semiconductor layer and the oxide conductor layer, and
wherein the insulating film is not in contact with the oxide semiconductor layer and is in contact with the oxide conductor layer.

2. The touch sensor according to claim 1, wherein the oxide semiconductor layer and the oxide conductor layer exist in the same layer.

3. The touch sensor according to claim 1, wherein each of the oxide semiconductor layer and the oxide conductor layer comprises indium and gallium.

4. The touch sensor according to claim 1, wherein a resistivity of the oxide semiconductor layer is higher than a resistivity of the oxide conductor layer.

5. The touch sensor according to claim 1, wherein the touch sensor has flexibility.

6. The touch sensor according to claim 1,
wherein an conductive film functioning as the other of the pair of electrodes of the capacitor is provided over the insulating film, and
wherein an edge of the conductive film is located outside an edge of the oxide conductor layer.

7. The touch sensor according to claim 1,
wherein the transistor further comprises:
a gate insulating film over the oxide semiconductor layer; and
a gate electrode over the gate insulating film, wherein the oxide semiconductor layer further comprises a pair of impurity regions with the channel formation region provided therebetween, and wherein an nitride film is provided over and in contact with the pair of impurity regions.

8. The touch sensor according to claim 1, further comprising a driver circuit comprising a second transistor, the second transistor comprising:
a first gate electrode;
an oxide semiconductor layer over the first gate electrode; and
a second gate electrode over the oxide semiconductor layer,
wherein a first conductive film functioning as the second gate electrode and a second conductive film functioning as the other of the pair of electrodes of the capacitor are provided over and in contact with the same insulating film.

9. The touch sensor according to claim 1, wherein the insulating film comprises a silicon nitride film.

10. The touch sensor according to claim 1, wherein a hydrogen concentration of the insulating film is $1 \times 10^{22}$ atoms/cm$^3$ or higher.

11. A touch sensor comprising:
a circuit comprising:
  a first transistor, a second transistor, and a third transistor, a channel formation region of at least one of the first transistor, the second transistor, and the third transistor comprising an oxide semiconductor layer; and
  a capacitor comprising a pair of electrodes, one of the pair of electrodes comprising an oxide conductor layer,
wherein one of a source and a drain of the first transistor is electrically connected to a gate of the second transistor and one of the pair of electrodes of the capacitor,
wherein one of a source and a drain of the second transistor is electrically connected to one of a source and a drain of the third transistor,
wherein the circuit is configured to output a signal based on a change in a capacitance of the capacitor, and
wherein the oxide semiconductor layer is provided separately from the oxide conductor layer.

12. The touch sensor according to claim 11, wherein the oxide semiconductor layer and the oxide conductor layer exist in the same layer.

13. The touch sensor according to claim 11, wherein each of the oxide semiconductor layer and the oxide conductor layer comprises indium and gallium.

14. The touch sensor according to claim 11, wherein a resistivity of the oxide semiconductor layer is higher than a resistivity of the oxide conductor layer.

15. The touch sensor according to claim 11, wherein the touch sensor has flexibility.

16. The touch sensor according to claim 11,
wherein a gate of the first transistor is electrically connected to a first wiring,
wherein the other of the source and the drain of the first transistor is electrically connected to a second wiring,
wherein the other of the source and the drain of the second transistor is electrically connected to a third wiring,
wherein a gate of the third transistor is electrically connected to a fourth wiring, and
wherein the other of the source and the drain of the third transistor is electrically connected to a fifth wiring.

17. The touch sensor according to claim 11, wherein the other of the pair of electrodes of the capacitor is electrically connected to a sixth wiring.

18. A touch panel comprising:
a touch sensor comprising a circuit, the circuit comprising:
  a transistor, a channel formation region of the transistor comprising an oxide semiconductor layer; and
  a capacitor comprising a pair of electrodes, one of the pair of electrodes comprising an oxide conductor layer; and
a display element,
wherein one of a source and a drain of the transistor is electrically connected to one of the pair of electrodes of the capacitor,
wherein the circuit is configured to output a signal based on a change in a capacitance of the capacitor,
wherein the oxide semiconductor layer is provided separately from the oxide conductor layer, and
wherein the capacitor and the display element overlap with each other.

19. The touch panel according to claim 18, wherein the oxide semiconductor layer and the oxide conductor layer exist in the same layer.

20. The touch panel according to claim 18, wherein each of the oxide semiconductor layer and the oxide conductor layer comprises indium and gallium.

21. The touch panel according to claim 18, wherein a resistivity of the oxide semiconductor layer is higher than a resistivity of the oxide conductor layer.

22. The touch panel according to claim 18, wherein the touch panel has flexibility.

23. The touch panel according to claim 18, further comprising a light-blocking layer between the touch sensor and the display element,
wherein the transistor and the light-blocking layer overlap with each other.

24. The touch panel according to claim 18, further comprising a first light-blocking layer and a second light-blocking layer,
wherein the touch sensor is provided between the first light-blocking layer and the second light-blocking layer, and
wherein the transistor, the first light-blocking layer and the second light-blocking layer overlap with each other.

25. The touch panel according to claim 18,
wherein the display element comprises:
  a first electrode and a second electrode; and
  a layer including a light-emitting organic compound, between the first electrode and the second electrode,
wherein an insulating film is provided to cover an end portion of the first electrode, and
wherein the transistor and the insulating film overlap with each other.

26. A sensor comprising:
a circuit comprising:
  a transistor, a channel formation region of the transistor comprising a first layer which comprises an oxide semiconductor; and
  a capacitor comprising a pair of electrodes, one of the pair of electrodes comprising a second layer which comprises an oxide conductor,
wherein one of a source and a drain of the transistor is electrically connected to one of the pair of electrodes of the capacitor,
wherein the circuit is configured to output a signal based on a change in a capacitance of the capacitor, wherein an insulating film is provided over the first layer and the second layer, and wherein the insulating film is not in contact with the first layer and is in contact with the second layer.

27. The sensor according to claim 26, wherein the first layer and the second layer exist in the same layer.

28. The sensor according to claim 26, wherein each of the first layer and the second layer comprises indium and gallium.

29. The sensor according to claim 26, wherein a resistivity of the first layer is higher than a resistivity of the second layer.

30. The sensor according to claim 26, wherein the sensor has flexibility.

31. The sensor according to claim 26, wherein the first layer is provided separately from the second layer.

32. The sensor according to claim 26, wherein the first layer is formed using a same layer as the second layer.

33. The sensor according to claim 26, wherein the insulating film comprises a silicon nitride film.

34. The sensor according to claim 26, wherein a hydrogen concentration of the insulating film is $1\times10^{22}$ atoms/cm$^3$ or higher.

* * * * *

UNITED STATES PATENT AND TRADEMARK OFFICE
CERTIFICATE OF CORRECTION

PATENT NO. : 9,780,121 B2
APPLICATION NO. : 14/639336
DATED : October 3, 2017
INVENTOR(S) : Kazunori Watanabe et al.

It is certified that error appears in the above-identified patent and that said Letters Patent is hereby corrected as shown below:

In the Claims

Column 87, Line 10, Claim 8; Change "an oxide" to --a second oxide--.

Column 87, Line 12, Claim 8; Change "the oxide" to --the second--.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*